US011937002B2

(12) United States Patent
Yamashita et al.

(10) Patent No.: US 11,937,002 B2
(45) Date of Patent: *Mar. 19, 2024

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventors: Hirofumi Yamashita, Kanagawa (JP); Shohei Shimada, Kanagawa (JP); Yusuke Otake, Kanagawa (JP); Yusuke Tanaka, Kanagawa (JP); Toshifumi Wakano, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/053,733

(22) Filed: Nov. 8, 2022

(65) Prior Publication Data

US 2023/0067160 A1 Mar. 2, 2023

Related U.S. Application Data

(63) Continuation of application No. 17/250,308, filed as application No. PCT/JP2019/026996 on Jul. 8, 2019, now Pat. No. 11,523,078.

(30) Foreign Application Priority Data

Jul. 10, 2018 (JP) .................................. 2018-130545

(51) Int. Cl.
*H04N 25/704* (2023.01)
*H01L 27/146* (2006.01)
(Continued)

(52) U.S. Cl.
CPC ..... *H04N 25/704* (2023.01); *H01L 27/14609* (2013.01); *H04N 25/711* (2023.01); *H04N 25/772* (2023.01)

(58) Field of Classification Search
CPC .. H04N 25/704; H04N 25/711; H04N 25/772; H04N 23/12; H01L 27/14609;
(Continued)

(56) References Cited

U.S. PATENT DOCUMENTS 9,264,601 B2   2/2016  Ishida et al.
9,450,006 B2   9/2016  Okuzawa et al.
(Continued)

FOREIGN PATENT DOCUMENTS

CN    103685999 A    3/2014
CN    104064573 A    9/2014
(Continued)

OTHER PUBLICATIONS

International Search Report and Written Opinion of PCT Application No. PCT/JP2019/026996, dated Sep. 10, 2019, 12 pages of English Translation and 10 pages of ISRWO.
(Continued)

*Primary Examiner* — Albert H Cutler
(74) *Attorney, Agent, or Firm* — CHIP LAW GROUP

(57) ABSTRACT

Provided is a solid-state imaging device and an electronic apparatus capable of achieving both of a high dynamic range operation and an auto focus operation in a pixel configuration in which a plurality of unit pixels includes two or more subpixels. The solid-state imaging device includes a first pixel separation region that separates a plurality of unit pixels including two or more subpixels, a second pixel separation region that separates each of the plurality of unit pixels separated by the first pixel separation region and an overflow region that causes signal charges accumulated in
(Continued)

the subpixels to overflow to at least one of adjacent subpixels, in which the overflow region is formed between a first subpixel and a second subpixel.

16 Claims, 45 Drawing Sheets

(51) Int. Cl.
*H04N 25/711* (2023.01)
*H04N 25/772* (2023.01)

(58) Field of Classification Search
CPC ......... H01L 27/14603; H01L 27/14612; H01L 27/14627; H01L 27/14656; H01L 27/1463
See application file for complete search history.

(56) References Cited

U.S. PATENT DOCUMENTS

| | | | |
|---|---|---|---|
| 10,073,239 B1* | 9/2018 | Jung | G02B 5/201 |
| 10,136,084 B1* | 11/2018 | Solheim | H01L 27/14643 |
| 11,523,078 B2* | 12/2022 | Yamashita | H01L 27/14627 |
| 2009/0290059 A1 | 11/2009 | Suzuki | |
| 2014/0146197 A1* | 5/2014 | Okuzawa | H04N 25/704 348/222.1 |
| 2014/0183064 A1 | 7/2014 | Ge | |
| 2014/0264694 A1 | 9/2014 | Seko | |
| 2017/0047363 A1 | 2/2017 | Choi et al. | |
| 2017/0170222 A1* | 6/2017 | Toda | H01L 27/14605 |

FOREIGN PATENT DOCUMENTS

| | | |
|---|---|---|
| CN | 107801425 A | 3/2018 |
| JP | 2008-193527 A | 8/2008 |
| JP | 2008193527 A | 8/2008 |
| JP | 2013-041890 A | 2/2013 |
| JP | 2014-183064 A | 9/2014 |
| JP | 2014183064 A | 9/2014 |
| JP | 2015-207815 A | 11/2015 |
| JP | 2015207815 A | 11/2015 |
| JP | 2016015430 A | 1/2016 |
| JP | 2017-126680 A | 7/2017 |
| JP | 2017126680 A | 7/2017 |
| WO | 2008/096799 A1 | 8/2008 |
| WO | WO-2009096799 A2 | 8/2009 |
| WO | WO-2016002574 A1 | 1/2016 |

OTHER PUBLICATIONS

International Preliminary Report on Patentability of PCT Application No. PCT/JP2019/026996, dated Jan. 21, 2021, 13 pages of English Translation and 07 pages of IPRP.
Notice of Allowance for U.S. Appl. No. 17/250,308, dated Aug. 8, 2022, 8 pages.
Non-Final Office Action for U.S. Appl. No. 17/250,308, dated Apr. 25, 2022, 17 pages.
Office Action for CN Patent Application No. 201980044860.6, dated Nov. 10, 2023, 7 pages of English Translation and 7 pages of Office Action.

* cited by examiner

---- VOLTAGE A: -0.5 V AT TIME OF HDR OPERATION
—— VOLTAGE B: -1.2 V AT TIME OF AF OPERATION

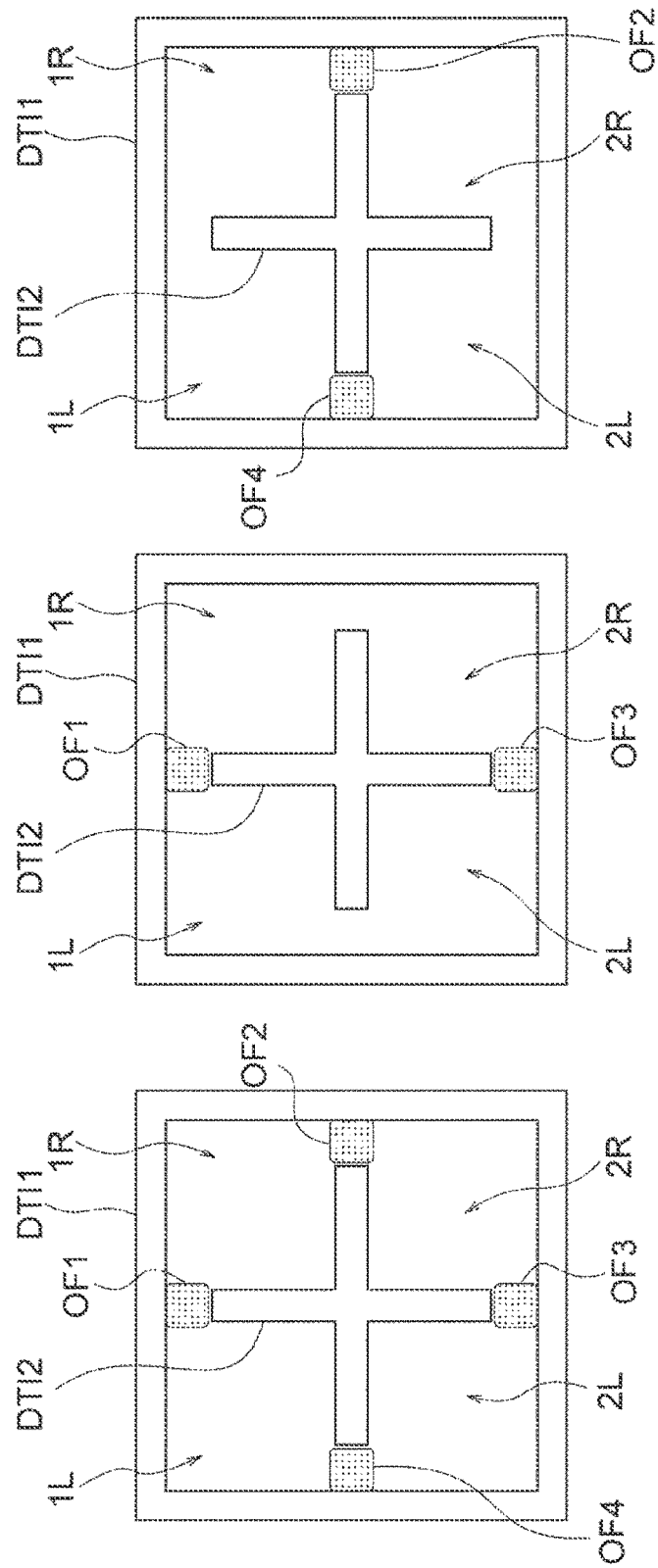

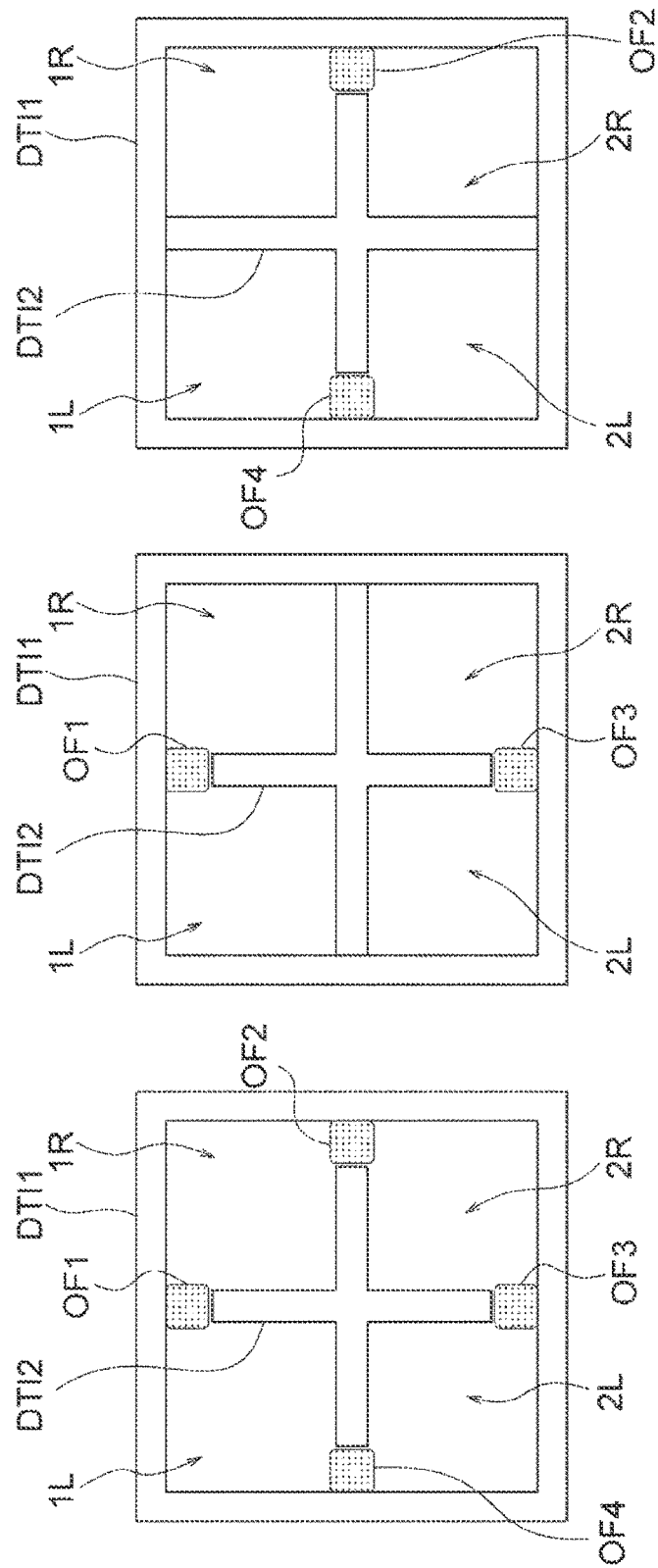

SEL
RST ⋯⋯ VOLTAGE 3: 2.8 V
TG * ⋯⋯ VOLTAGE A: -0.5 V AT TIME OF HDR OPERATION
— VOLTAGE B: -1.2 V AT TIME OF AF OPERATION

SOLID-STATE IMAGING DEVICE AND ELECTRONIC APPARATUS

CROSS REFERENCE TO RELATED APPLICATIONS

This application is a continuation application of U.S. patent application Ser. No. 17/250,308, filed on Dec. 31, 2020, is a U.S. National Phase of International Patent Application No. PCT/JP2019/026996 filed on Jul. 8, 2019, which claims priority benefit of Japanese Patent Application No. 2018-130545 filed in the Japan Patent Office on Jul. 10, 2018. Each of the above-referenced applications is hereby incorporated herein by reference in its entirety.

TECHNICAL FIELD

The present technology relates to a solid-state imaging device and an electronic apparatus.

BACKGROUND ART

In general, a solid-state imaging device such as a complementary metal oxide semiconductor (CMOS) image sensor, a charge coupled device (CCD) or the like has been widely used in a digital still camera, a digital video camera or the like.

The solid-state imaging device includes, for example, a photodiode, and accumulates charges by photoelectric conversion. Here, as a focusing method of the solid-state imaging device, a high dynamic range operation of generating a captured image in a wide exposure region by performing different exposure controls and an auto focus operation of dividing a photodiode and adding the same color between the divided photodiodes have been known.

In the auto focus operation, for example, in a case where the photodiode is divided into two, light is received in each of the two divided photodiodes, and signal electrons of which the number exceeds an accumulation capacity are received in one divided photodiode, signal electrons of the same color overflow to the other divided photodiode.

Regarding such a technology, for example, Patent Document 1 discloses an imaging element including a plurality of photoelectric conversion units, a separation region separating the plurality of photoelectric conversion units, and a setting means for selectively setting a potential of the separation region (see Patent Document 1).

CITATION LIST

Patent Document

Patent Document 1: Japanese Patent Application Laid-Open No. 2013-041890

SUMMARY OF THE INVENTION

Problems to be Solved by the Invention

In the technology disclosed in Patent Document 1, an element for controlling a separation potential of the divided photodiode is added. However, in the CMOS image sensor, it is difficult to secure a region in which an element that becomes the setting means is to be arranged because miniaturization by subpixels is progressing.

In a pixel configuration in which subpixels into which one unit pixel is divided are arranged, it is possible to perform different exposure time controls between the subpixels and synthesize signals with different exposure times with each other in the subpixels to widen a dynamic range. However, it has not been possible to achieve both of the high dynamic range operation and the auto focus operation of adding charges between subpixels of the same color.

Therefore, the present technology has been made in view of such a situation, and an object of the present technology is to provide a solid-state imaging device and an electronic apparatus capable of achieving both of a high dynamic range operation and an auto focus operation in a pixel configuration in which a plurality of unit pixels includes two or more subpixels.

Solutions to Problems

The present inventors have completed the present technology by succeeding in achieving both of a high dynamic range operation and an auto focus operation in a pixel configuration in which a plurality of unit pixels includes two or more subpixels, as a result of intensive research to solve the object described above.

That is, in the present technology, first, there is provided a solid-state imaging device including:
a first pixel separation region that separates a plurality of unit pixels including two or more subpixels;
a second pixel separation region that separates each of the plurality of unit pixels separated by the first pixel separation region; and
an overflow region that causes signal charges accumulated in the subpixels to overflow to at least one of adjacent subpixels,
in which the overflow region
is formed between a first subpixel and a second subpixel.

In the solid-state imaging device according to the present technology, a first P-type region may be formed in a depth direction inside the first pixel separation region, a second P-type region may be formed in the depth direction around the second pixel separation region, and the first pixel separation region, the overflow region, and the second pixel separation region may be formed to be included in a cross section in which a region of the unit pixel that is not separated by the second pixel separation region is cut along an incident direction of light, and
the overflow region may have at least one of a third P-type region whose impurity concentration is lower than an average impurity concentration of the first P-type region or a fourth P-type region whose impurity concentration is lower than an average impurity concentration of the second P-type region.

In the solid-state imaging device according to the present technology, a first P-type region may be formed in a depth direction inside the first pixel separation region, a second P-type region may be formed in the depth direction around the second pixel separation region, an N-type region may be formed between the first P-type region and the second P-type region, and the first pixel separation region, the overflow region, and the second pixel separation region may be formed to be included in a cross section in which a region of the unit pixel that is not separated by the second pixel separation region is cut along an incident direction of light, and
the overflow region may have at least one of a third P-type region whose impurity concentration is lower than an average impurity concentration of the first P-type region, a fourth P-type region whose impurity concentration is lower than an average impurity concentration of the second P-type region, or a fifth N-type region formed between the third P-type region and the fourth P-type region.

In the solid-state imaging device according to the present technology, a first P-type region may be formed in a depth direction inside the first pixel separation region, and the overflow region may be formed to be included between one inner side of the first pixel separation region and another inner side of the first pixel separation region facing the one inner side in a cross section in which a region of the unit pixel that is not separated by the second pixel separation region is cut along an incident direction of light, and a depth of the overflow region
may be formed between a region in which a transistor controlling the overflow is arranged and a region in which an impurity concentration is the highest in an N-type region in which the signal charges are accumulated.

The second pixel separation region included in the solid-state imaging device according to the present technology may separate each of the plurality of unit pixels into the subpixels of 2×2.

The second pixel separation region included in the solid-state imaging device according to the present technology may have a cross shape.

The overflow region provided in the solid-state imaging device according to the present technology may be formed in a region in which the first pixel separation region and the second pixel separation region having the cross shape are close to each other.

In the solid-state imaging device according to the present technology, a close distance between the first pixel separation region and the second pixel separation region having the cross shape may be the same as or be different.

At least a part of the second pixel separation region having the cross shape, which is included in the solid-state imaging device according to the present technology, may be connected to the first pixel separation region.

The solid-state imaging device according to the present technology may further include a transfer gate that performs a voltage control for causing the signal charges to overflow. Moreover, the solid-state imaging device according to the present technology may further include a power supply that supplies voltages of three or more values to the transfer gate.

Furthermore, the solid-state imaging device according to the present technology may further include a boosting circuit that boosts and steps down a voltage supplied to the transfer gate.

The second pixel separation region included in the solid-state imaging device according to the present technology may penetrate from a light receiving surface that receives light to a silicon substrate on which a photoelectric conversion element in which the signal charges are accumulated is formed.

Furthermore, in the present technology, there is provided a solid-state imaging device including:
a first pixel separation region that separates a plurality of unit pixels including two or more subpixels;
a second pixel separation region that separates each of the plurality of unit pixels separated by the first pixel separation region;
a first light condensing portion that covers entirety of the unit pixel; and a plurality of second light condensing portions that covers each of the subpixels.

In the solid-state imaging device according to the present technology, the first light condensing portion and the second light condensing portion may be lenses.

In the solid-state imaging device according to the present technology, the first light condensing portion may be a lens, and
the second light condensing portion may include a light shielding portion that is provided above the first pixel separation region and the second pixel separation region and a light transmitting layer that is above the subpixel, is provided in a region surrounded by the light shielding portion, and includes a material having a higher refractive index than the light shielding portion.

In the solid-state imaging device according to the present technology, the second light condensing portion may include an intermediate layer that is provided between the first light condensing portion and the light transmitting layer and includes a material having a higher refractive index than the first light condensing portion and a lower refractive index than the light transmitting layer.

In the solid-state imaging device according to the present technology, the light shielding portion provided above the first pixel separation region may include a material including at least one of a material having a lower refractive index than the light transmitting layer or a metal, and
the light shielding portion provided above the second pixel separation region may include a material having a lower refractive index than the light transmitting layer.

The solid-state imaging device according to the present technology may include a color filter that is provided between the subpixel and the second light condensing portion.

Furthermore, in the present technology, there is provided an electronic apparatus mounted with a solid-state imaging device,
in which the solid-state imaging device includes:
a first pixel separation region that separates a plurality of unit pixels including two or more subpixels;
a second pixel separation region that separates each of the plurality of unit pixels separated by the first pixel separation region; and
an overflow region that causes signal charges accumulated in the subpixels to overflow to at least one of adjacent subpixels, and
the overflow region
is formed between a first subpixel and a second subpixel.

Effects of the Invention

According to the present technology, in a pixel configuration in which the plurality of unit pixels includes two or more subpixels, both of a high dynamic range operation and an auto focus operation can be achieved. Note that an effect described here is not necessarily limited, and may be any effect described in the present technology.

BRIEF DESCRIPTION OF DRAWINGS

FIGS. 16A, 16B, and 16C are plan views illustrating a place where an overflow region is formed.

FIGS. 17A, 17B, and 17C are plan views illustrating a place where an overflow region is formed.

MODE FOR CARRYING OUT THE INVENTION

Figure 1:
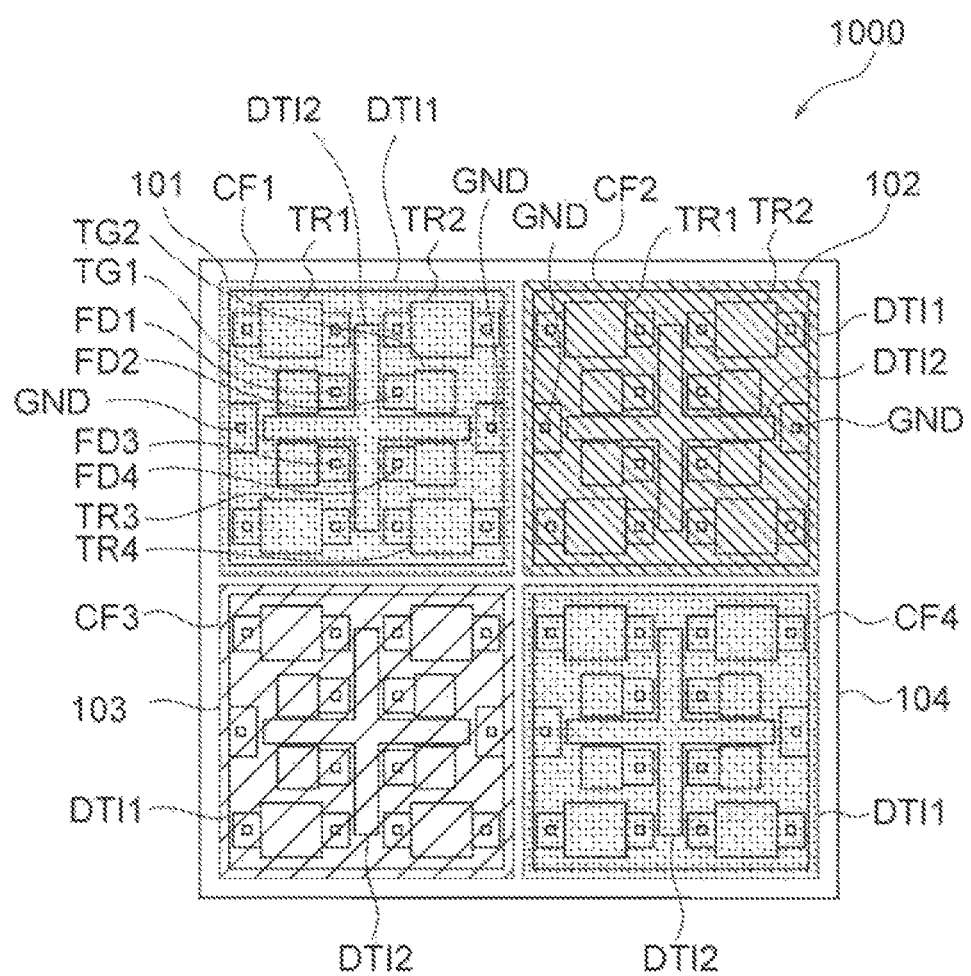
FIG. 1 is a plan view illustrating a layout of a solid-state imaging device according to a first embodiment to which the present technology is applied.

Hereinafter, preferred embodiments for carrying out the present technology will be described. Embodiments to be described below represent examples of representative embodiments of the present technology, and the scope of the present technology is not narrowly interpreted by embodiments to be described below.

Note that a description will be given in the following order.

1. Outline of Present Technology
2. First Embodiment (Example 1 of Solid-State Imaging Device)
3. Second Embodiment (Example 2 of Solid-State Imaging Device)
4. Third Embodiment (Example 3 of Solid-State Imaging Device)
5. Fourth Embodiment (Example 4 of Solid-State Imaging Device)
6. Fifth Embodiment (Example 5 of Solid-State Imaging Device)
7. Sixth Embodiment (Example 6 of Solid-State Imaging Device)
8. Seventh Embodiment (Example 7 of Solid-State Imaging Device)
9. Eighth Embodiment (Example 8 of Solid-State Imaging Device)
10. Ninth Embodiment (Example 9 of Solid-State Imaging Device)
11. Tenth Embodiment (Example 10 of Solid-State Imaging Device)
12. Eleventh Embodiment (Example 11 of Solid-State Imaging Device)
13. Twelfth Embodiment (Example of Electronic Apparatus)
14. Use Example of Solid-State Imaging Device to Which Present Technology Is Applied 1. Outline of Present Technology The present technology relates to a solid-state imaging device such as a complementary metal oxide semiconductor (CMOS) image sensor, a charge coupled device (CCD) or the like, and relates to a solid-state imaging device and an electronic apparatus capable of achieving both of a high dynamic range operation and an auto focus operation in a pixel configuration in which a plurality of unit pixels includes two or more subpixels. According to the present technology, in the pixel configuration in which the plurality of unit pixels includes the two or more subpixels, both of the high dynamic range operation and the auto focus operation can be achieved, and image quality can thus be improved.

For example, in a conventional dual pixel-type auto focus pixel configuration, a photodiode is divided into two. Each (referred to as a divided photodiode) of the divided photodiodes receives light that has passed half through a coupling optical system. In the auto focus pixel configuration, two images are generated from the respective divided photodiodes, a distance is measured by detecting a deviation between the two images, and an image is focused by signal processing in the subsequent stage.

In this case, in a case where an amount of light received in the divided photodiode is large, such that signal electrons of which the number exceeds an accumulation capacity of the divided photodiode are received, if excess electrons overflow into a floating diffusion (FD) and are discarded, non-linearity may occur in the image. Therefore, it has been studied to set a separation potential between the divided photodiodes so that the signal electrons do not overflow from the divided photodiode that has received a large amount of light into the floating diffusion and overflow between the divided photodiodes.

Here, in a pixel configuration in which subpixels divided in one pixel are arranged, it is possible to perform different exposure time controls between the subpixels and synthesize signals with different exposure times between the subpixels to widen a dynamic range. However, it has not been possible to achieve both of the high dynamic range operation and the auto focus operation of adding charges between subpixels of the same color.

For example, in the pixel configuration in which the subpixels divided in one pixel are arranged, if the separation potential at which the signal electrons overflow between the subpixels when an amount of light is large is set and the high dynamic range operation of performing the different exposure time controls between the subpixels is executed, there is a possibility that the number of signal electrons accumulated in the subpixels will decrease significantly and a signal to noise (SN) ratio will decrease on a reproduced image. Furthermore, it is possible to avoid the problem described above by arranging an element such as a metal oxide silicon (MOS) gate or the like in the separation region between the subpixels and applying different voltages to the gate at the time of the auto focus operation and at the time of the high dynamic range operation to modulate the separation potential, but a fine pixel image sensor does not have a space in which the element for controlling the separation potential is to be additionally arranged.

Therefore, the present technology has been made in view of such a situation, and an object of the present technology is to provide a solid-state imaging device and an electronic apparatus capable of achieving both of a high dynamic range operation and an auto focus operation in a pixel configuration in which a plurality of unit pixels includes two or more subpixels, without requiring an additional element.

2. First Embodiment (Example 1 of Solid-State Imaging Device)

A solid-state imaging device according to a first embodiment of the present technology is a solid-state imaging device including a first pixel separation region that separates a plurality of unit pixels including two or more subpixels, a second pixel separation region that separates each of the plurality of unit pixels separated by the first pixel separation region, and an overflow region that causes signal charges accumulated in the subpixels to overflow to at least one of adjacent subpixels, in which the overflow region is formed between a first subpixel and a second subpixel.

According to the solid-state imaging device according to the first embodiment of the present technology, it is possible to achieve both of a dynamic operation and an auto focus operation in a pixel configuration in which the plurality of unit pixels includes the two or more subpixels.

Figure 2:
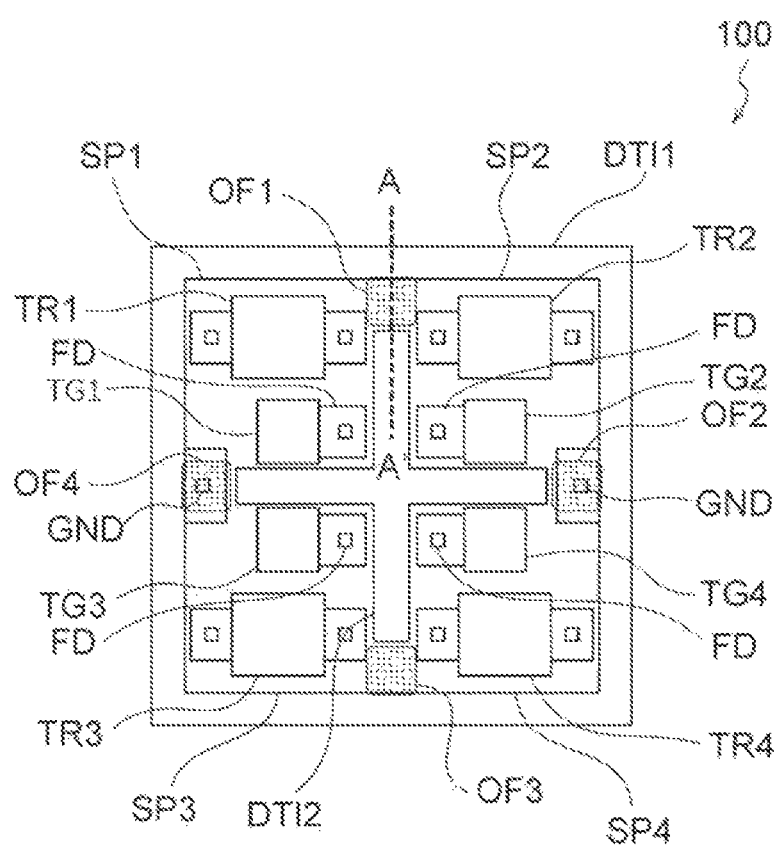
FIG. 2 is a plan view illustrating a layout of a solid-state imaging device according to the first embodiment to which the present technology is applied.

FIG. 1 illustrates a layout of a solid-state imaging device 1000, which is an example of the solid-state imaging device according to the first embodiment of the present technology. FIG. 1 is a plan view of the solid-state imaging device 1000 including four pixels. FIG. 2 illustrates a layout of a solid-state imaging device 100, which is an example of the solid-state imaging device according to the first embodiment of the present technology. FIG. 2 is a plan view of the solid-state imaging device 100 configuring one pixel. Unless otherwise specified, "up" will mean an upward direction in each drawing, and "down" will mean a downward direction in each drawing.

The solid-state imaging device 1000 includes four solid-state imaging devices 100 (solid-state imaging device 101 to solid-state imaging device 104 in FIG. 1) of 2×2. The solid-state imaging device 101 is provided with a color filter CF1. The solid-state imaging device 102 is provided with a color filter CF2. The solid-state imaging device 103 is provided with a color filter CF3. The solid-state imaging device 104 is provided with a color filter CF4. FIG. 2 illustrates a plan view of a layout of the solid-state imaging device 101 as a plan view of a layout of the solid-state imaging device 100.

The solid-state imaging device 100 includes a first pixel separation region DTI1 that separates a plurality of unit pixels including two or more subpixels, a second pixel separation region DTI2 that separates each of the plurality of unit pixels separated by the first pixel separation region DTI1, and overflow regions OFs (overflow region OF1 to overflow region OF4) that cause signal charges accumulated in the subpixels to overflow to at least one of adjacent subpixels.

The overflow region OF1 is formed between a first subpixel SP1 and a second subpixel SP2. The overflow region OF2 is formed between the second subpixel SP2 and a third subpixel SP3. The overflow region OF3 is formed between the third subpixel SP3 and a fourth subpixel SP4. The overflow region OF4 is formed between the first subpixel SP1 and the fourth subpixel SP4.

The first pixel separation region DTI1 separates the plurality of unit pixels including the two or more subpixels.

The second pixel separation region DTI2 separates each of the plurality of unit pixels separated by the first pixel separation region DTI1. Furthermore, the second pixel separation region DTI2 separates each of the plurality of unit pixels into subpixels of 2×2. In this case, for example, the second pixel separation region DTI2 may have a cross shape.

Furthermore, a separation layer that separates a subpixel photodiode by penetrating from a light receiving-side silicon surface receiving light to a substrate-side surface exists between the four subpixels SPs (first subpixel SP1 to fourth subpixel SP4). That is, the subpixel SP is formed in a region from the light receiving-side silicon surface to the substrate-side surface (not illustrated).

The overflow regions OFs (overflow region OF1 to overflow region OF4) are regions for causing signal charges accumulated in the subpixels SPs (first subpixel SP1 to fourth subpixel SP4) to overflow to at least one of adjacent subpixels SPs (first subpixel SP1 to fourth subpixel SP4).

In the solid-state imaging device 100 according to the first embodiment of the present technology, for example, one unit pixel (that is, one pixel) includes four subpixels SPs (first subpixel SP1 to fourth subpixel SP4). Note that the subpixels SPs are fine pixels forming the unit pixel, and the number of subpixels SPs is not limited to four. For example, one unit pixel may include two subpixels or may include eight subpixels.

As illustrated in FIG. 2, the solid-state imaging device 100 includes the four subpixels SPs (first subpixel SP1 to fourth subpixel SP4), and has four overflow regions OFs (overflow region OF1 to overflow region OF4).

The subpixels SPs (first subpixel SP1 to fourth subpixel SP4) have photodiodes (photoelectric conversion elements) that photoelectrically convert the received light into photocharges having an amount of charge corresponding to an amount of the light and accumulate the photocharges.

A transistor TR1 has a transistor configuring a signal reading circuit, such as a reset transistor, an amplification transistor, a selection transistor, and the like. The reset transistor is a transistor (RST Tr.) for setting a power supply voltage at which a potential of a floating diffusion FD becomes a reference potential before reading signal charges from the photodiode to the floating diffusion FD. The amplification transistor is a transistor (AMP Tr.) for reading a voltage signal of the floating diffusion (FD) into a signal line provided for every column of a pixel array. The selection transistor is a transistor (SELTr.) for selectively reading a signal from the pixel array for each row.

A transfer gate TG1 is a transistor for reading the signal charges accumulated in the photodiode to the floating diffusion FD.

The overflow region OF1 is a region formed between the first subpixel SP1 and the second subpixel SP2. The overflow region OF1 is a region for causing signal charges accumulated in the first subpixel SP1 or the second subpixel SP2 to overflow to an adjacent subpixel, that is, the second subpixel SP2 or the first subpixel SP1.

A transistor TR2 has a transistor configuring a signal reading circuit, such as a reset transistor, an amplification transistor, a selection transistor, and the like. The reset transistor is a transistor (RST Tr.) for setting a power supply voltage at which a potential of a floating diffusion FD becomes a reference potential before reading signal charges from the photodiode to the floating diffusion FD. The amplification transistor is a transistor (AMP Tr.) for reading a voltage signal of the floating diffusion (FD) into a signal line provided for every column of a pixel array. The selection transistor is a transistor (SELTr.) for selectively reading a signal from the pixel array for each row.

A transfer gate TG2 is a transistor for reading the signal charges accumulated in the photodiode to the floating diffusion FD.

The overflow region OF2 is a region formed between the second subpixel SP2 and the fourth subpixel SP4. The overflow region OF2 is a region for causing signal charges accumulated in the second subpixel SP2 or the fourth subpixel SP4 to overflow to an adjacent subpixel, that is, the fourth subpixel SP4 or the second subpixel SP2.

A transistor TR3 has a transistor configuring a signal reading circuit, such as a reset transistor, an amplification transistor, a selection transistor, and the like. The reset transistor is a transistor (RST Tr.) for setting a power supply voltage at which a potential of a floating diffusion FD becomes a reference potential before reading signal charges from the photodiode to the floating diffusion FD. The amplification transistor is a transistor (AMP Tr.) for reading a voltage signal of the floating diffusion (FD) into a signal line provided for every column of a pixel array. The selection transistor is a transistor (SELTr.) for selectively reading a signal from the pixel array for each row.

A transfer gate TG3 is a transistor for reading the signal charges accumulated in the photodiode to the floating diffusion FD.

The overflow region OF3 is a region formed between the third subpixel SP3 and the fourth subpixel SP4. The overflow region OF3 is a region for causing signal charges accumulated in the third subpixel SP3 or the fourth subpixel SP4 to overflow to an adjacent subpixel, that is, the fourth subpixel SP4 or the third subpixel SP3.

A transistor TR4 has a transistor configuring a signal reading circuit, such as a reset transistor, an amplification transistor, a selection transistor, and the like. The reset transistor is a transistor (RST Tr.) for setting a power supply voltage at which a potential of a floating diffusion FD becomes a reference potential before reading signal charges from the photodiode to the floating diffusion FD. The amplification transistor is a transistor (AMP Tr.) for reading a voltage signal of the floating diffusion (FD) into a signal line provided for every column of a pixel array. The selection transistor is a transistor (SELTr.) for selectively reading a signal from the pixel array for each row.

A transfer gate TG4 is a transistor for reading the signal charges accumulated in the photodiode to the floating diffusion FD.

The overflow region OF4 is a region formed between the third subpixel SP3 and the first subpixel SP1. The overflow region OF4 is a region for causing signal charges accumulated in the third subpixel SP3 or the first subpixel SP1 to overflow to an adjacent subpixel, that is, the first subpixel SP1 or the third subpixel SP3.

All the subpixels SPs (first subpixel SP1 to fourth subpixel SP4) are formed in a similar configuration.

The solid-state imaging device according to the first embodiment is a solid-state imaging device in which a first P-type region is formed in a depth direction inside the first pixel separation region, a second P-type region is formed in the depth direction around the second pixel separation region, and the first pixel separation region, the overflow region, and the second pixel separation region are formed to be included in a cross section in which a unit pixel is cut along an incident direction of light, and the overflow region has at least one of a third P-type region whose impurity concentration is lower than an average impurity concentration of the first P-type region or a fourth P-type region whose impurity concentration is lower than an average impurity concentration of the second P-type region.

Figure 3:
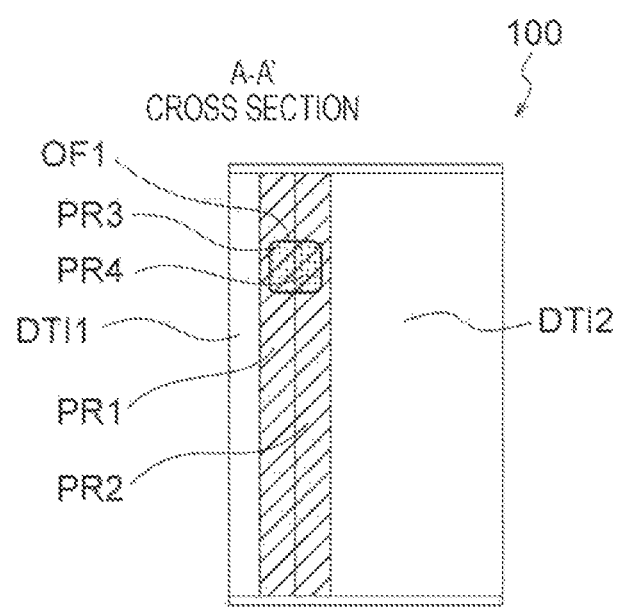
FIG. 3 is a cross-sectional view illustrating a configuration example of an A-A' cross section of the solid-state imaging device according to the first embodiment to which the present technology is applied.

FIG. 3 illustrates a configuration of a cross section of the solid-state imaging element 100 according to the first embodiment to which the present technology is applied. FIG. 3 is a cross-sectional view illustrating a configuration example of an A-A' cross section of the solid-state imaging device 100 illustrated in FIG. 2. Note that unless otherwise specified, "up" means an upward direction in FIG. 3, and "down" means a downward direction in FIG. 3.

In the solid-state imaging device 100, a first P-type region PR1 is formed in a depth direction inside a first pixel separation region DTI1, and a second P-type region PR2 is formed in the depth direction around a second pixel separation region DTI2. In the solid-state imaging device 100, the first pixel separation region DTI1, the overflow region OF1, and the second pixel separation region DTI2 are formed to be included in a cross section in which a region of the unit pixel that is not separated by the second pixel separation region DII2 is cut along an incident direction of light. Then, the overflow region OF1 has at least one of a third P-type region PR3 whose impurity concentration is lower than an average impurity concentration of the first P-type region PR1 or a fourth P-type region PR4 whose impurity concentration is lower than an average impurity concentration of the second P-type region PR2.

The first P-type region PR1 and the second P-type region PR2 correspond to the separation layer that separates the photodiode. The overflow region OF1 is formed in a region of the separation layer that does not separate the photodiode, and signal electrons (charges) when an amount of light is large can overflow between the subpixels that are not separated.

Furthermore, the second pixel separation region DTI2 penetrates from a light receiving surface that receives light to a silicon substrate on which the photoelectric conversion element (photodiode) in which the signal charges are accumulated is formed. In this case, by adopting a configuration in which the second pixel separation region DTI2 penetrates to the silicon substrate, it is possible to reduce crosstalk between the subpixels due to diffusion of photoelectrons on a silicon surface side, leakage of incident light, and the like.

Figure 4A:
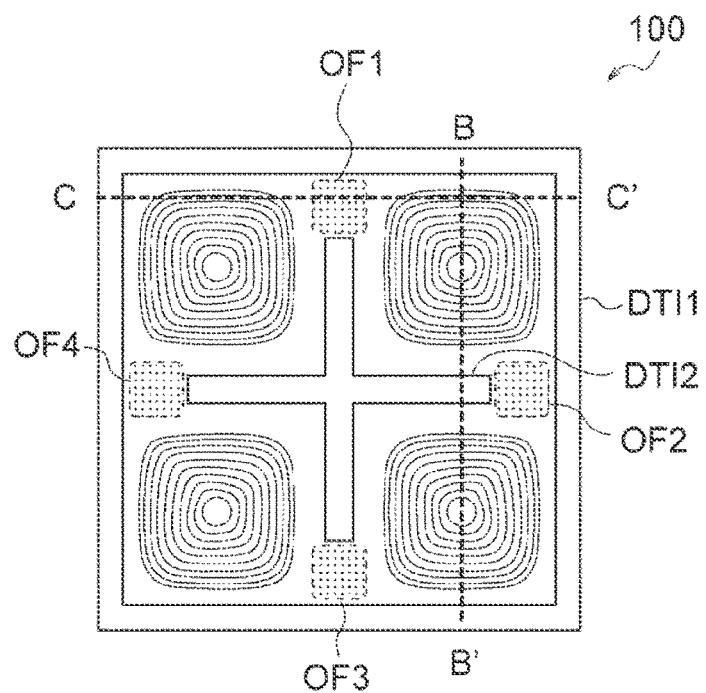
FIGS. 4A, 4B, and 4C are explanatory diagrams illustrating a potential distribution and an overflow state of the solid-state imaging device according to the first embodiment to which the present technology is applied.
Figure 4B:
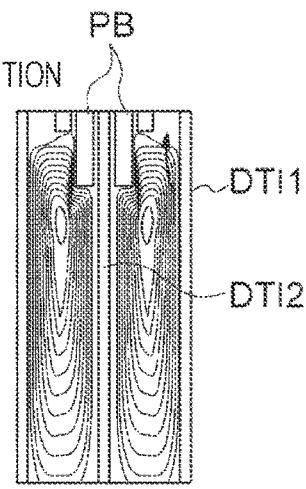
Figure 4C:
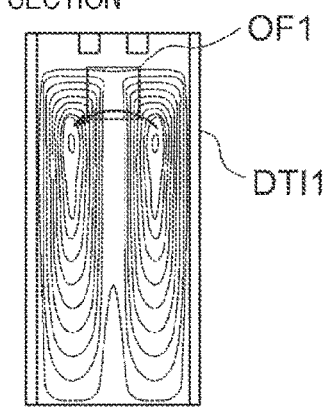

FIGS. 4A, 4B, and 4C illustrate a potential distribution and an overflow state of the solid-state imaging element 100 according to the first embodiment to which the present technology is applied. FIGS. 4A, 4B, and 4C are explanatory diagrams illustrating a potential distribution and an overflow state of the solid-state imaging element 100. Note that unless otherwise specified, "up" means an upward direction in FIGS. 4A, 4B, and 4C, and "down" means a downward direction in FIGS. 4A, 4B, and 4C.

In FIGS. 4A, 4B, and 4C, FIG. 4A illustrates a pixel potential distribution of the solid-state imaging device 100, FIG. 4B illustrates a B-B' cross section of the solid-state imaging device 100, and FIG. 4C illustrates a C-C' cross section of the solid-state imaging device 100.

Furthermore, FIG. 4B illustrates a potential distribution of the separation layer including the second pixel separation region DTI2, and FIG. 4C illustrates a potential distribution of a region that is not separated by the second pixel separation region DTI2.

In a case of FIG. 4B, if −0.5 [v] is applied to the transfer gate TG, ion implantation is performed, such that a channel potential of the transfer gate TG becomes higher than a separation potential between the subpixels. On the other hand, in a case of FIG. 4C, if −1.5 [v] is applied to the transfer gate TG, a channel potential of the transfer gate TG becomes lower than a separation potential between the subpixels.

As described above, in FIG. 4B, a potential barrier PB is provided by the ion implantation, and signal charges can thus be discharged from the transfer gate TG to the floating diffusion FD. On the other hand, in FIG. 4C, there is no potential barrier PB, and the signal charges overflow via the overflow region OF1.

Figure 5A:
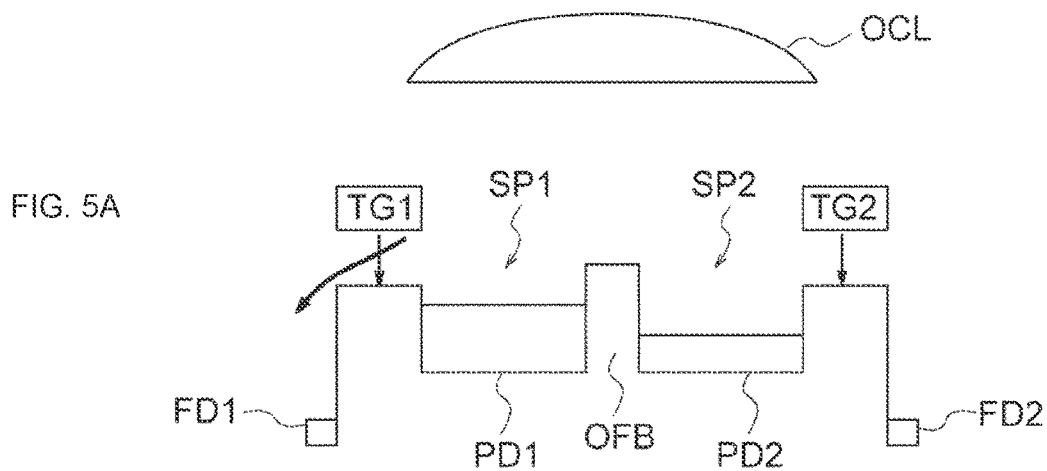
FIGS. 5A and 5B are explanatory diagrams illustrating an operation concept of an overflow region of the solid-state imaging device according to the first embodiment to which the present technology is applied.
Figure 5B:
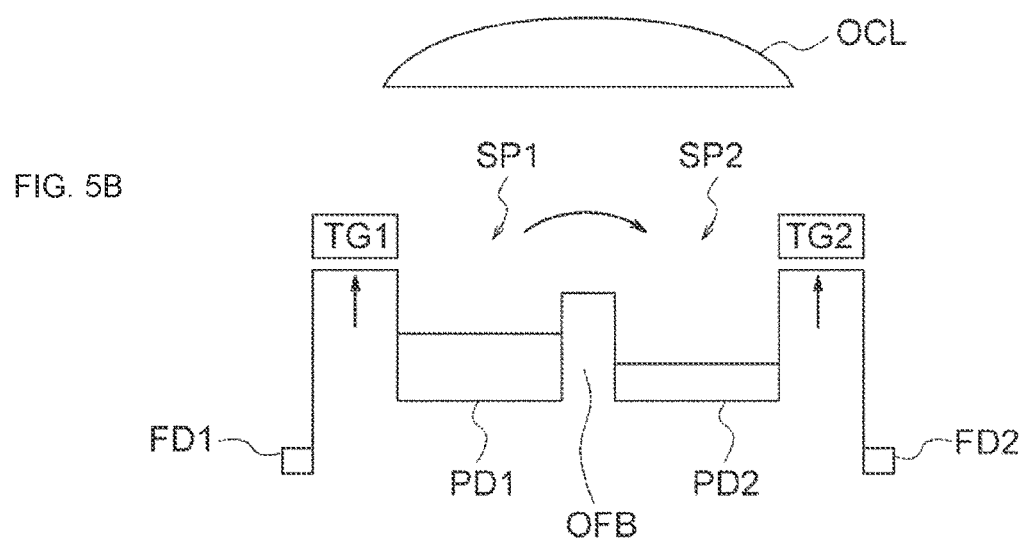

FIGS. 5A and 5B illustrate a concept of a high dynamic range operation and a concept of an overflow operation of the solid-state imaging element 100 according to the first embodiment to which the present technology is applied. FIGS. 5A and 5B are explanatory diagrams illustrating a concept of a high dynamic range operation and a concept of overflow. Note that unless otherwise specified, "up" means an upward direction in FIGS. 5A and 5B, and "down" means a downward direction in FIGS. 5A and 5B.

In FIGS. 5A and 5B, FIG. 5A illustrates the concept of the high dynamic range operation of the solid-state imaging device 100, and FIG. 5B illustrates the concept of the overflow operation of the solid-state imaging device 100.

As illustrated in FIG. 5A, the first subpixel SP1 has a photodiode PD1, a transfer gate TG1, and a floating diffusion FD1. The second subpixel SP2 has a photodiode PD2, a transfer gate TG2, and a floating diffusion FD2. Furthermore, the first subpixel SP1 and the second subpixel SP2 are partitioned by an overflow barrier OFB. Furthermore, an on-chip lens OCL is provided above the first subpixel SP1 and the second subpixel SP2.

At the time of a dynamic operation, −0.5 [V], which is an intermediate potential, is applied to the transfer gate TG1 and the transfer gate TG2. Furthermore, since ions are implanted, potentials of the transfer gate TG1 and the transfer gate TG2 become lower than a separation potential of the overflow barrier OFB. In this case, signal charges are accumulated in the photodiode PD1 of the first subpixel SP1, and signal charges are also accumulated in the photodiode PD2 of the second subpixel SP2. At the time of receiving a large amount of light, for example, if the signal charges accumulated in the photodiode PD1 exceed an allowable capacity, the signal charges are discharged from the transfer gate TG1 to the floating diffusion FD1.

On the other hand, as illustrated in FIG. 5B, −1.5 [v] is applied to the transfer gate TG1 and the transfer gate TG2 at the time of the overflow operation. In this case, the potentials of the transfer gate TG1 and the transfer gate TG2 become higher than the separation potential of the overflow barrier OFB. Then, the signal charges are accumulated in the photodiode PD1 of the first subpixel SP1, and the signal charges are also accumulated in the photodiode PD2 of the second subpixel SP2. At the time of receiving a large amount of light, for example, if the signal charges accumulated in the photodiode PD1 exceed an allowable capacity, the signal charges overflow to the photodiode PD2 of the second subpixel SP2 beyond the overflow barrier OFB.

As described above, the solid-state imaging element 100 according to the first embodiment to which the present technology is applied includes the overflow regions OFs (overflow region OF1 to overflow region OF4) for causing the signal charges accumulated in the subpixels SPs (first subpixel SP1 to fourth subpixel SP4) to overflow to at least one of the adjacent subpixels. Furthermore, the overflow regions OFs (overflow region OF1 to overflow region OF4) are formed between, for example, the first subpixel SP1 and the second subpixel SP2.

According to the solid-state imaging device 100 according to the first embodiment of the present technology, it is possible to achieve both of the dynamic operation and the auto focus operation in the pixel configuration in which the plurality of unit pixels includes the two or more subpixels SPs (first subpixel SP1 to fourth subpixel SP4).

Furthermore, in the solid-state imaging device 100 according to the first embodiment of the present technology, the first P-type region PR1 is formed in the depth direction inside the first pixel separation region DTI1, and the second P-type region PR2 is formed in the depth direction around the second pixel separation region DTI2. In the solid-state imaging device 100, the first pixel separation region DTI1, the overflow region OF1, and the second pixel separation region DTI2 are formed to be included in a cross section in which a region of the unit pixel that is not separated by the second pixel separation region DII2 is cut along an incident direction of light. Then, the overflow region OF1 has at least one of a third P-type region PR3 whose impurity concentration is lower than an average impurity concentration of the first P-type region PR1 or a fourth P-type region PR4 whose impurity concentration is lower than an average impurity concentration of the second P-type region PR2.

According to the solid-state imaging device 100 according to the first embodiment of the present technology, the overflow region OF1 has at least one of the third P-type region PR3 whose impurity concentration is lower than the average impurity concentration of the first P-type region PR1 or the fourth P-type region PR4 whose impurity concentration is lower than the average impurity concentration of the second P-type region PR2, and can thus cause the signal charges to overflow.

3. Second Embodiment (Example 2 of Solid-State Imaging Device)

A solid-state imaging device according to a second embodiment of the present technology is a solid-state imaging device in which a first P-type region is formed in a depth direction inside a first pixel separation region, a second P-type region is formed in the depth direction around a second pixel separation region, an N-type region is formed between the first P-type region and the second P-type region, and the first pixel separation region, an overflow region, and the second pixel separation region are formed to be included in a cross section in which a region of a unit pixel that is not separated by the second pixel separation region is cut along an incident direction of light, and the overflow region has at least one of a third P-type region whose impurity concentration is lower than an average impurity concentration of the first P-type region, a fourth P-type region whose impurity concentration is lower than an average impurity concentration of the second P-type region, or a fifth N-type region formed between the third P-type region and the fourth P-type region.

According to the solid-state imaging device according to the second embodiment of the present technology, the overflow region is formed in at least one of the third P-type region whose impurity concentration is lower than the average impurity concentration of the first P-type region, the fourth P-type region whose impurity concentration is lower than the average impurity concentration of the second P-type region, or the fifth N-type region formed between the third P-type region and the fourth P-type region. Therefore, both of a dynamic operation and an auto focus operation can be achieved.

Figure 6:
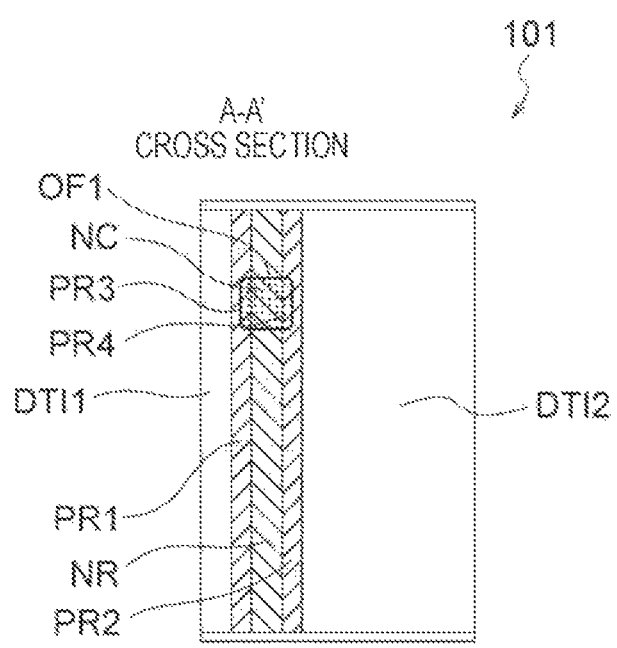
FIG. 6 is a cross-sectional view illustrating a configuration example of an A-A' cross section of a solid-state imaging device according to a second embodiment to which the present technology is applied.

FIG. 6 illustrates a configuration of a cross section of the solid-state imaging element 101 according to the second embodiment to which the present technology is applied. FIG. 6 is a cross-sectional view illustrating another configuration example of an A-A' cross section illustrated in FIG. 2 in the solid-state imaging device 101. Note that unless otherwise specified, "up" means an upward direction in FIG. 6, and "down" means a downward direction in FIG. 6.

In the solid-state imaging device 101, a first P-type region PR1 is formed in a depth direction inside a first pixel separation region DTI1, a second P-type region PR2 is formed in the depth direction around a second pixel separation region DTI2, and the N-type region NR is formed between the first P-type region PR1 and the second P-type region PR2. Furthermore, in the solid-state imaging device 101, the first pixel separation region DTI1, the overflow region OF1, and the second pixel separation region DTI2 are formed to be included in the cross section in which the region of the unit pixel that is not separated by the second pixel separation region DTI2 is cut along an incident direction of light. In the solid-state imaging device 101, the overflow region OF1 has at least one of a third P-type region PR3 whose impurity concentration is lower than an average impurity concentration of the first P-type region PR1, a fourth P-type region PR4 whose impurity concentration is lower than an average impurity concentration of the second P-type region PR2, or a fifth N-type region NC formed between the third P-type region PR3 and the fourth P-type region PR4.

The first P-type region PR1, the second P-type region PR2, and the N-type region NR correspond to the separation layer that separates the photodiode. The overflow region OF1 in this case is formed in a region of the separation layer that does not separate the photodiode, and signal electrons (charges) when an amount of light is large can overflow between the subpixels that are not separated.

In particular, a junction capacitance between a p-type layer and an n-type layer can be formed by the third P-type region PR3, the fourth P-type region PR4, and the fifth N-type region NC, and can thus be a part of an accumulation capacity of the photodiode.

As described above, the solid-state imaging element 101 according to the second embodiment to which the present technology is applied includes the overflow regions OFs (overflow region OF1 to overflow region OF4) for causing signal charges to overflow. Furthermore, the overflow regions OFs (overflow region OF1 to overflow region OF4) are formed between the first subpixel SP1 and the second subpixel SP2.

According to the solid-state imaging device 101 according to the second embodiment of the present technology, it is possible to achieve both of the dynamic operation and the auto focus operation in the pixel configuration in which the plurality of unit pixels includes the two or more subpixels SPs (first subpixel SP1 to fourth subpixel SP4).

4. Third Embodiment (Example 3 of Solid-State Imaging Device)

A solid-state imaging device according to a third embodiment of the present technology is a solid-state imaging device in which a first P-type region is formed in a depth direction inside a first pixel separation region, and an overflow region is formed to be included between one inner side of the first pixel separation region and another inner side of the first pixel separation region facing the one inner side in a cross section in which a region of a unit pixel that is not separated by a second pixel separation region is cut along an incident direction of light, and a depth of the overflow region is formed between a region in which a transistor controlling an overflow is arranged and a region in which an impurity concentration is the highest in an N-type region in which signal charges are accumulated.

According to the solid-state imaging device according to the third embodiment of the present technology, the overflow region can be formed between one inner side of the first pixel separation region and another inner side of the first pixel separation region facing the one inner side, and both of a dynamic operation and an auto focus operation can thus be achieved.

Figure 7:
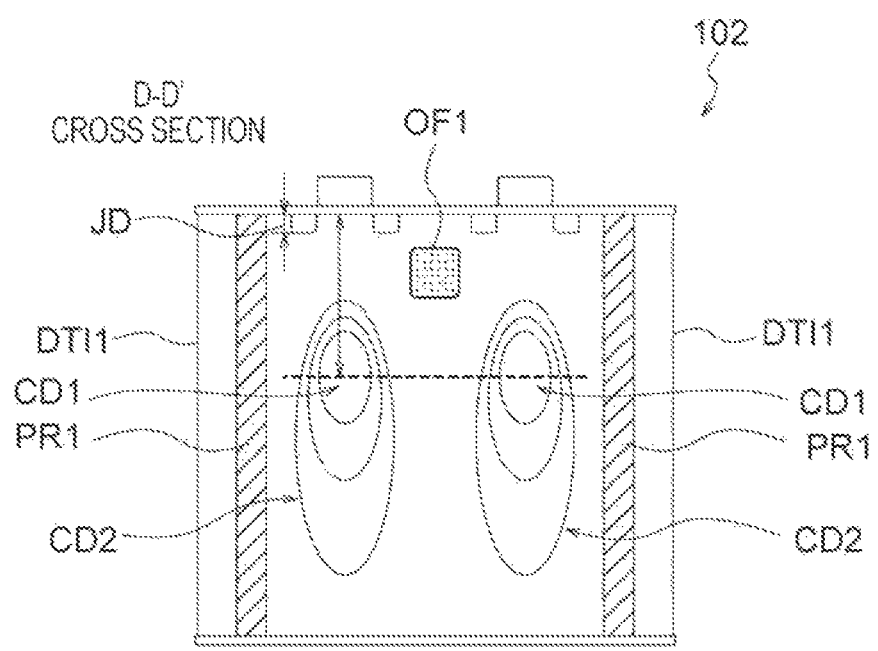
FIG. 7 is a cross-sectional view illustrating a configuration example of a D-D' cross section of a solid-state imaging device according to a third embodiment to which the present technology is applied.

FIG. 7 illustrates a configuration of a cross section of the solid-state imaging element 102 according to the third embodiment to which the present technology is applied. FIG. 7 is a cross-sectional view illustrating a configuration example of the solid-state imaging element 102 according to the third embodiment to which the present technology is applied. Furthermore, FIG. 7 is a cross-sectional view illustrating a configuration example of a D-D' cross section of the solid-state imaging element 102 according to the third embodiment illustrated in FIG. 8. Note that unless otherwise specified, "up" means an upward direction in FIG. 7, and "down" means a downward direction in FIG. 7.

Figure 8:
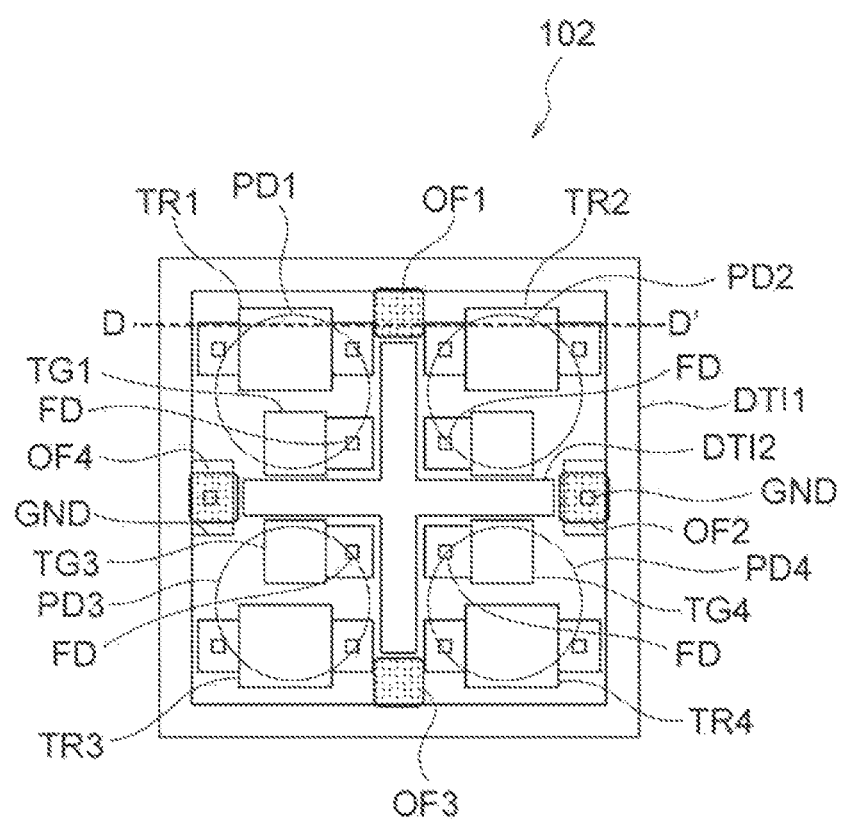
FIG. 8 is a plan view illustrating a layout of the solid-state imaging device according to the third embodiment to which the present technology is applied.

Note that FIG. 8 is for illustrating positions of the cross section illustrated in FIG. 7, and a basic configuration is similar to that in FIG. 2. Furthermore, regions of a photodiode PD1, a photodiode PD2, a photodiode PD3, and a photodiode PD4 will indicate regions in which the respective photodiodes are formed. Furthermore, the same members will be denoted by the same reference numerals, and a description thereof will be appropriately omitted.

As illustrated in FIG. 7, in the solid-state imaging device 102, a first P-type region is formed in a depth direction inside a first pixel separation region DTI1, and an overflow region OF1 is formed to be included between one inner side of the first pixel separation region DTI1 and another inner side of the first pixel separation region DTI1 facing the one inner side in a cross section in which a region of a unit pixel that is not separated by a second pixel separation region DTI2 is cut along an incident direction of light. Then, a depth of the overflow region OF1 is formed between a region JD in which a transistor controlling subpixels is arranged and a region CD1 where an impurity concentration is the highest in an N-type region CD2 in which signal charges are accumulated.

A junction depth JD indicates a depth of a source/drain region of a metal oxide semiconductor (MOS) transistor. A portion CD1 whose impurity concentration is high indicates a portion whose impurity concentration is the highest in the N-type region forming the photodiode PD1 and the photodiode PD2.

As described above, the solid-state imaging element 102 according to the third embodiment to which the present technology is applied includes the overflow regions OFs (overflow region OF1 to overflow region OF4) for causing signal charges to overflow. Furthermore, the overflow regions OFs (overflow region OF1 to overflow region OF4) are formed between the first subpixel SP1 and the second subpixel SP2.

According to the solid-state imaging device 102 according to the third embodiment of the present technology, it is possible to achieve both of the dynamic operation and the auto focus operation in the pixel configuration in which the plurality of unit pixels includes the two or more subpixels SPs (first subpixel SP1 to fourth subpixel SP4).

5. Fourth Embodiment (Example 4 of Solid-State Imaging Element)

A solid-state imaging device according to a fourth embodiment of the present technology is a solid-state imaging device further including a transfer gate that performs a voltage control for causing signal charges to overflow.

The solid-state imaging device according to the fourth embodiment of the present technology can cause the signal charges to overflow by including the transfer gate.

Figure 9:
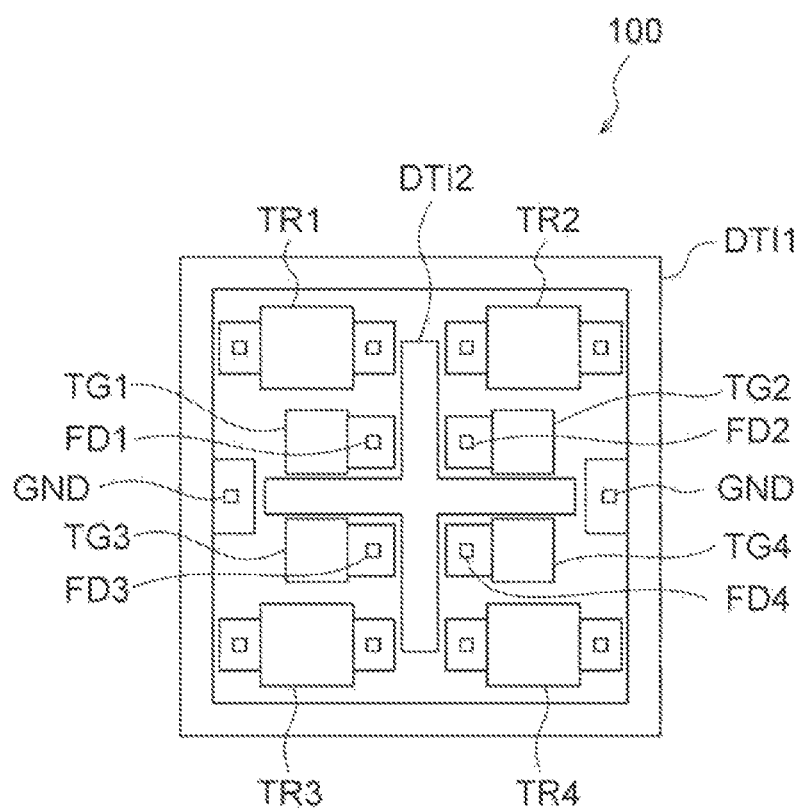
FIG. 9 is a plan view illustrating a layout of the solid-state imaging device according to the third embodiment to which the present technology is applied.

FIG. 9 illustrates a layout of a solid-state imaging device 100, which is an example of the solid-state imaging device according to the fourth embodiment of the present technology. FIG. 9 is a plan view of the solid-state imaging device 100.

As illustrated in FIG. 9, a transistor TR1 has a transistor configuring a signal reading circuit, such as a reset transistor, an amplification transistor, a selection transistor, and the like. The reset transistor is a transistor (RST Tr.) for setting a power supply voltage at which a potential of a floating diffusion FD1 becomes a reference potential before reading signal charges from the photodiode to the floating diffusion FD. The amplification transistor is a transistor (AMP Tr.) for reading a voltage signal of the floating diffusion (FD) into a signal line provided for every column of a pixel array. The selection transistor is a transistor (SEL Tr.) for selectively reading a signal from the pixel array for each row.

A transfer gate TG1 is a transistor for reading the signal charges accumulated in the photodiode to the floating diffusion FD1.

A transistor TR2 has a transistor configuring a signal reading circuit, such as a reset transistor, an amplification transistor, a selection transistor, and the like. The reset transistor is a transistor (RST Tr.) for setting a power supply voltage at which a potential of a floating diffusion FD becomes a reference potential before reading signal charges from the photodiode to the floating diffusion FD2. The amplification transistor is a transistor (AMP Tr.) for reading a voltage signal of the floating diffusion (FD) into a signal line provided for every column of a pixel array. The selection transistor is a transistor (SEL Tr.) for selectively reading a signal from the pixel array for each row. A transfer gate TG2 is a transistor for reading the signal charges accumulated in the photodiode to the floating diffusion FD2.

A transistor TR3 has a transistor configuring a signal reading circuit, such as a reset transistor, an amplification transistor, a selection transistor, and the like. The reset transistor is a transistor (RST Tr.) for setting a power supply voltage at which a potential of a floating diffusion FD3 becomes a reference potential before reading signal charges from the photodiode to the floating diffusion FD3. The amplification transistor is a transistor (AMP Tr.) for reading a voltage signal of the floating diffusion (FD) into a signal line provided for every column of a pixel array. The selection transistor is a transistor (SEL Tr.) for selectively reading a signal from the pixel array for each row.

A transfer gate TG3 is a transistor for reading the signal charges accumulated in the photodiode to the floating diffusion FD3.

A transistor TR4 has a transistor configuring a signal reading circuit, such as a reset transistor, an amplification transistor, a selection transistor, and the like. The reset transistor is a transistor (RST Tr.) for setting a power supply voltage at which a potential of a floating diffusion FD4 becomes a reference potential before reading signal charges from the photodiode to the floating diffusion FD4. The amplification transistor is a transistor (AMP Tr.) for reading a voltage signal of the floating diffusion (FD) into a signal line provided for every column of a pixel array. The selection transistor is a transistor (SEL Tr.) for selectively reading a signal from the pixel array for each row.

A transfer gate TG4 is a transistor for reading the signal charges accumulated in the photodiode to the floating diffusion FD4.

Figure 10A:
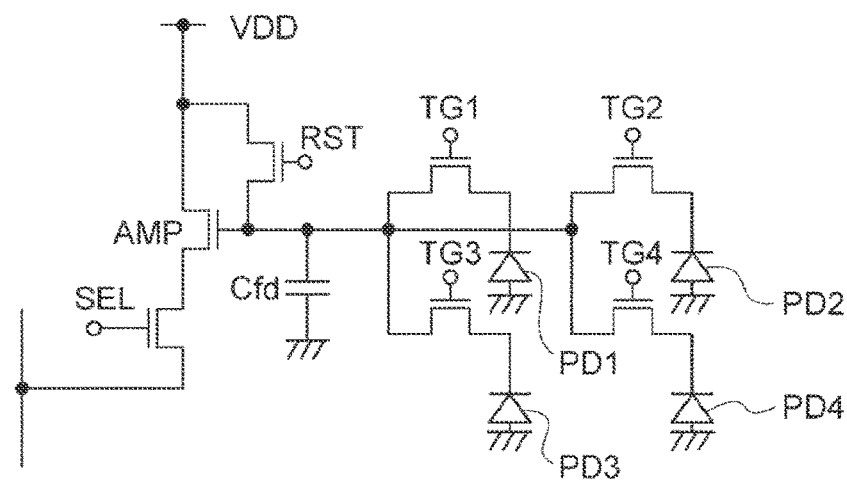
FIGS. 10A and 10B are pixel circuit diagrams reading a pixel signal of the solid-state imaging device according to the third embodiment to which the present technology is applied.
Figure 10B:
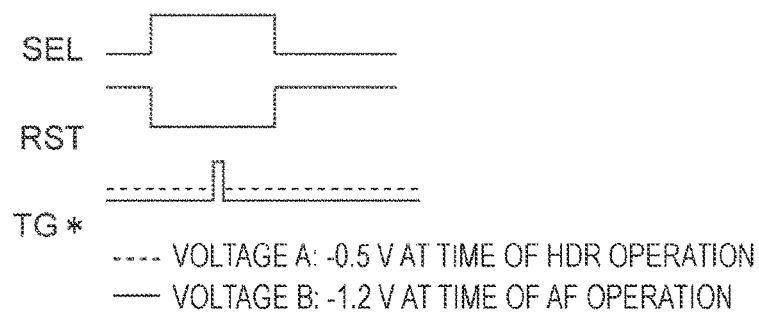

FIGS. 10A and 10B illustrate a pixel circuit reading a pixel signal of the solid-state imaging device according to the fourth embodiment of the present technology. FIGS. 10A and 10B are circuit diagrams illustrating a pixel circuit reading a pixel signal of the solid-state imaging device according to the fourth embodiment. In FIGS. 10A and 10B, FIG. 10A illustrates a pixel circuit diagram, and FIG. 10B illustrates a timing chart.

In an example of FIG. 10A, the pixel circuit includes a photodiode PD1, a photodiode PD2, a photodiode PD3, and a photodiode PD4. In this case, a unit pixel includes four pixels (four subpixels). The photodiode PD1, the photodiode PD2, the photodiode PD3 and the photodiode PD4 may have the same characteristics as each other, but may have different characteristics from each other. For example, some or all of these photodiode PD1, photodiode PD2, photodiode PD3, and photodiode PD4 may photoelectrically convert incident light in a wavelength band different from those of the other photodiodes.

In FIG. 10A, the unit pixel includes a transfer gate TG1, a transfer gate TG2, a transfer gate TG3, and a transfer gate TG4.

The pixel circuit illustrated in FIG. 10A controls reading of photocharges from the photodiode PD1, the photodiode PD2, the photodiode PD3, and the photodiode PD4 on the basis of the transfer gate TG1, the transfer gate TG2, the transfer gate TG3, and the transfer gate TG4. A capacitance Cfd is a capacitance of a floating diffusion.

Configurations of the floating diffusion (FD), the reset transistor, the amplification transistor, the selection transistor, and the like, are shared within a unit pixel. Then, pixel signals of each pixel (photodiode PD1, photodiode PD2, photodiode PD3, and photodiode PD4) are transmitted via the same vertical signal line as each other.

In FIG. 10B, during a period in which the selection transistor is "H" and the reset transistor is "L", if a voltage of −1.2 [V] is applied to the transfer gate TG, processing of an overflow is performed. Then, if a voltage of −0.5 [V] is applied to the transfer gate TG, a high dynamic range operation is performed.

Figure 11A:
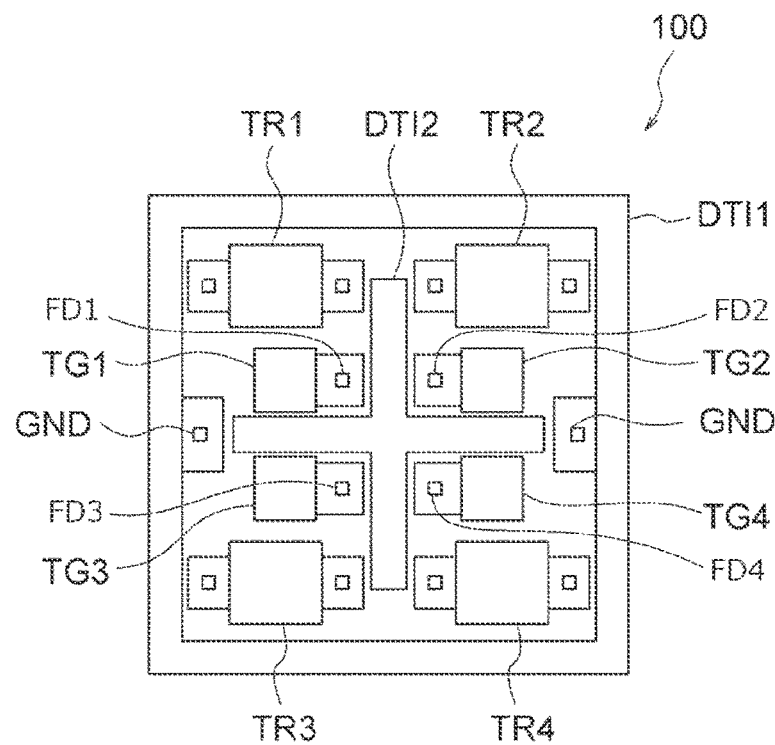
FIGS. 11A and 11B are plan views illustrating a layout of a solid-state imaging device according to a fourth embodiment to which the present technology is applied.
Figure 11B:
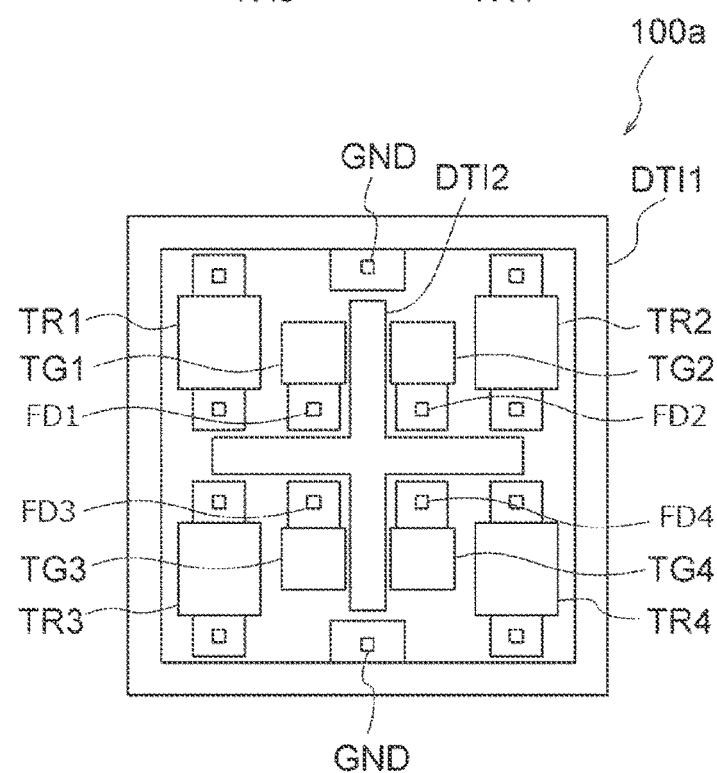

FIGS. 11A and 11B illustrate a layout of a solid-state imaging device 100 according to the fourth embodiment of the present technology. FIGS. 11A and 11B are plan views of the solid-state imaging device 100.

In FIGS. 11A and 11B, FIG. 11A illustrates the same layout as that of FIG. 9, and FIG. 11B illustrates a layout in which an arrangement position of a GND is changed.

FIG. 11A has the same configuration as that of FIG. 9, and a description thereof will thus be omitted. Furthermore, the only difference between FIGS. 11A and 11B are change in an arrangement of the GND. Here, a description of FIG. 11B will also be omitted.

Figure 12A:
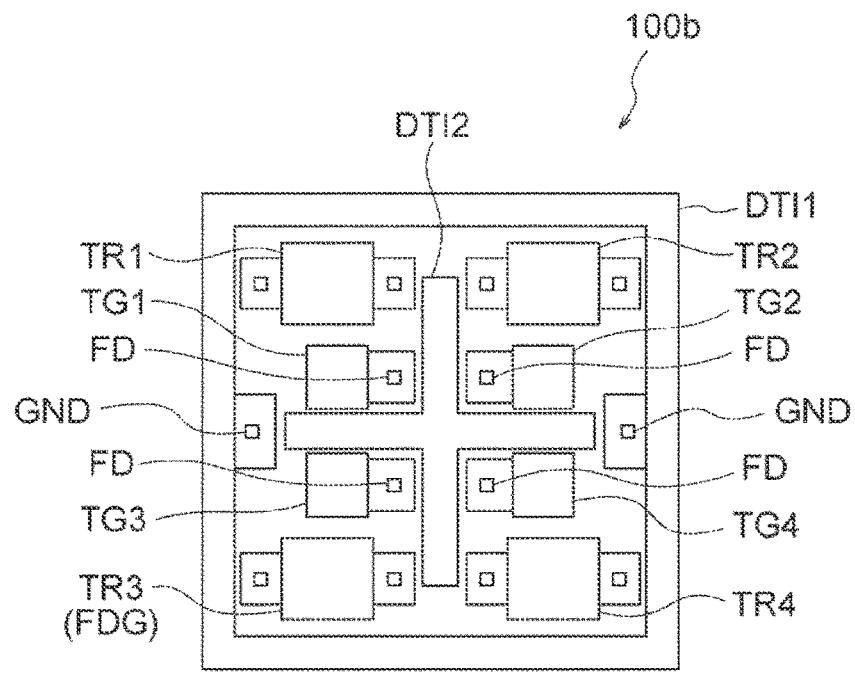
FIGS. 12A and 12B are plan views illustrating a layout of a solid-state imaging device according to the fourth embodiment to which the present technology is applied.
Figure 12B:
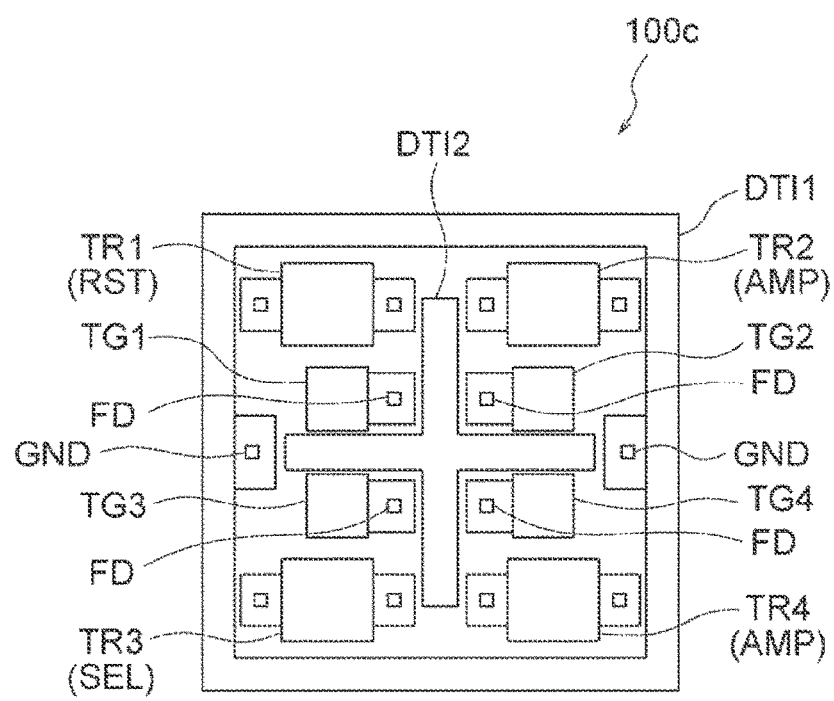

FIGS. 12A and 12B are plan views illustrating a layout of a solid-state imaging device according to the fourth embodiment of the present technology. In FIGS. 12A and 12B, FIG. 12A illustrates a layout in which a floating diffusion gate (FDG) is further provided, and FIG. 12B illustrates a layout in which a SEL transistor, an RST transistor, and an AMP transistor are assigned to transistors TR1 to TR4.

As illustrated in FIG. 12A, in a solid-state imaging device 100b, the floating diffusion gate transistor (FDG) is provided in order to be able to accumulate all the signal charges generated by a photodiode PD1, a photodiode PD2, a photodiode PD3 and a photodiode PD4 in a floating diffusion FD at the time of capturing an image of a high-luminance subject. The floating diffusion gate transistor (FDG) is a transistor (FDG Tr.) for adding a capacitance Cfd to the floating diffusion FD at the time of capturing the image of the high-luminance subject. In FIG. 12B, a capacitance Cfd2 is increased in parallel. In this case, the capacitance Cfd2 is connected in parallel by a connection wiring.

Figure 13A:
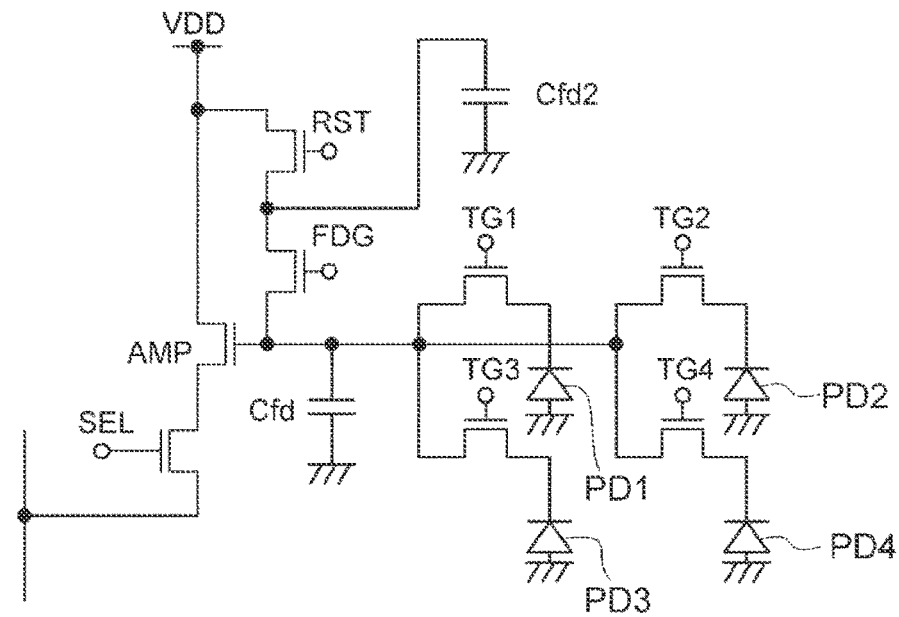
FIGS. 13A and 13B are pixel circuit diagrams reading a pixel signal of the solid-state imaging device according to the fourth embodiment to which the present technology is applied.
Figure 13B:
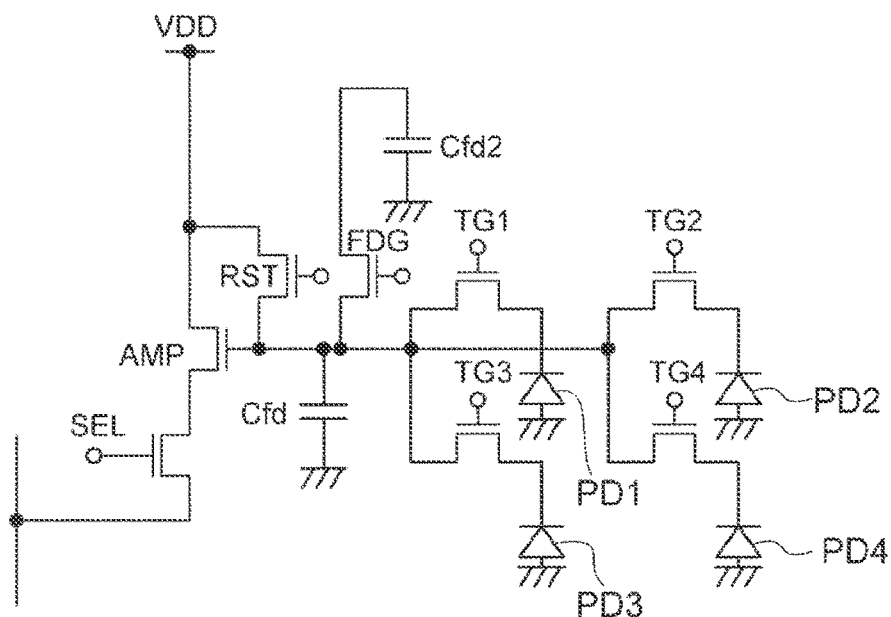

FIGS. 13A and 13B illustrate a pixel circuit reading a pixel signal of the solid-state imaging device according to the fourth embodiment of the present technology. FIGS. 13A and 13B illustrate a pixel circuit diagrams reading a pixel signal of the solid-state imaging device according to the third embodiment. The circuit diagram of FIGS. 13A and 13B corresponds to the layout of FIGS. 12A and 12B. In FIG. 13A, a floating diffusion gate FDG is provided and a capacitance Cfd2 is arranged in series with a capacitance Cfd, and in FIG. 13B, a floating diffusion gate FDG is provided and a capacitance Cfd2 is arranged in parallel with a capacitance Cfd. The other configurations are the same as those in FIG. 10A, and a description thereof will thus be omitted.

6. Fifth Embodiment (Example 5 of Solid-State Imaging Device)

A solid-state imaging device according to a fifth embodiment of the present technology is a solid-state imaging device in which the second pixel separation region has a cross shape in the solid-state imaging device according to the first embodiment of the present technology.

Furthermore, the solid-state imaging device according to the fifth embodiment of the present technology may be a solid-state imaging device in which the overflow region is formed in a region in which the first pixel separation region and the second pixel separation region having the cross shape are close to each other in the solid-state imaging device according to the first embodiment of the present technology.

Furthermore, the solid-state imaging device according to the fifth embodiment of the present technology may be a solid-state imaging device in which a close distance between the first pixel separation region and the second pixel separation region having the cross shape is the same or is different in the solid-state imaging device according to the first embodiment of the present technology.

In this case, the solid-state imaging device may be a solid-state imaging device in which at least a part of the second pixel separation region having the cross shape is connected to the first pixel separation region.

Figure 14C:
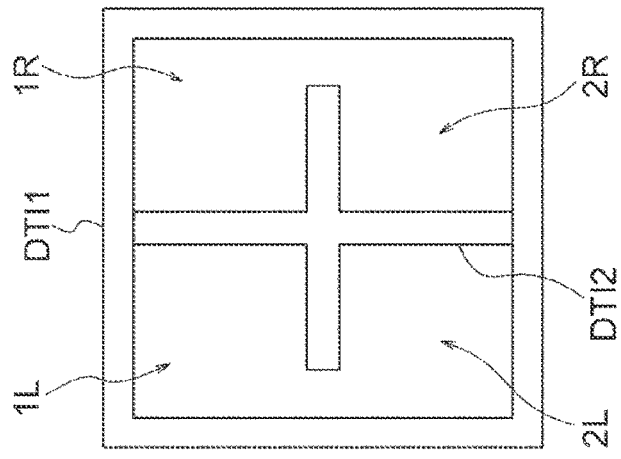
FIGS. 14A, 14B, and 14C are plan views illustrating an example of an arrangement of a first pixel separation region and a second pixel separation region in a solid-state imaging device according to a fifth embodiment to which the present technology is applied.
Figure 14B:
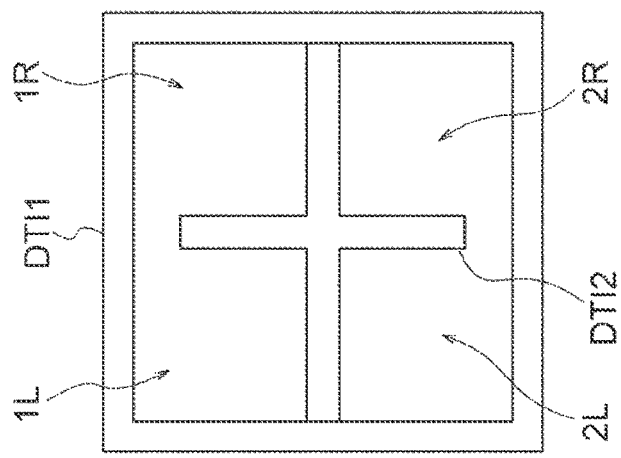
Figure 14A:
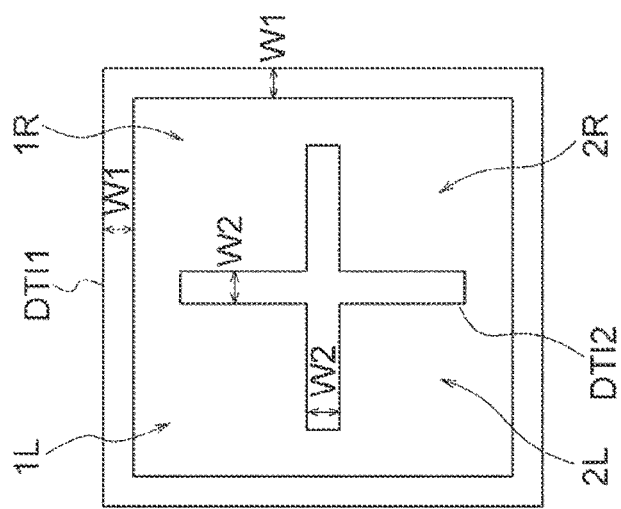

The solid-state imaging device according to the fifth embodiment of the present technology will be described with reference to FIGS. 14A, 14B, and 14C. FIGS. 14A, 14B, and 14C are plan views illustrating an example of an arrangement of a first pixel separation region DTI1 and a second pixel separation region DTI2 in the solid-state imaging device 100. Unless otherwise specified, "up" will mean an upward direction in FIGS. 14A, 14B, and 14C, and "right" will mean a rightward direction in FIGS. 14A, 14B, and 14C.

In FIGS. 14A, 14B, and 14C, FIG. 14A illustrates a solid-state imaging device in which the second pixel separation region DTI2 has a cross shape. In the solid-state imaging device illustrated in FIG. 14A, a width of the first pixel separation region DTI1 is a width W1. On the other hand, a width of the second pixel separation region DTI2 is a width W2. The second pixel separation region DTI2 is provided at the center of the first pixel separation region DTI1, such that the second pixel separation region DTI2 is separated into a subpixel 1L, a subpixel 1R, a subpixel 2L, and a subpixel 2R.

The width W1 of the first pixel separation region DTI1 and the width W2 of the second pixel separation region DTI2 may be the same as each other or may be different from each other. Note that it is preferable that the width W1 of the first pixel separation region DTI1 and the width W2 of the second pixel separation region DTI2 are the same as each other. It is assumed that characteristics of photoelectric conversion at the time of performing the photoelectric conversion are stable if the width W1 of the first pixel separation region DTI1 and the width W2 of the second pixel separation region DTI2 are the same as each other. Furthermore, at least a part of the second pixel separation region DTI2 may be connected to the first pixel separation region DTI1.

FIG. 14B illustrates a solid-state imaging device in which at least a part of the second pixel separation region DTI2 is connected to the first pixel separation region DTI1. In FIG. 14B, the second pixel separation region DTI2 having a cross shape is connected to left and right side walls of the first pixel separation region DTI1. In this case, an overflow is performed by a region (gap) in which the first pixel separation region DTI1 and the second pixel separation region DTI2 are not separated from each other. Specifically, the overflow is performed in regions (gaps) that are not separated, in the subpixel 1L and the subpixel 1R, and the subpixel 2L and the subpixel 2R.

Furthermore, at the time of an auto focus operation, it can be performed by phase difference signals obtained by the subpixel 1L and the subpixel 1R, and the subpixel 2L and the subpixel 2R. Furthermore, an image signal may be configured by the sum of signals of the subpixel 1L, the subpixel 1R, the subpixel 2L, and the subpixel 2R, and furthermore, the sum of the subpixel 1L and the subpixel 1R and the sum of the subpixel 2L and the subpixel 2R can be used as separate image signals.

FIG. 14C illustrates a solid-state imaging device in which at least a part of the second pixel separation region DTI2 is connected to the first pixel separation region DTI1. In FIG. 14C, the second pixel separation region DTI2 having a cross shape is connected to upper and lower side walls of the first pixel separation region DTI1. In this case, an overflow is performed by a region (gap) in which the first pixel separation region DTI1 and the second pixel separation region DTI2 are not separated from each other. Specifically, the overflow is performed in regions (gaps) that are not separated, in the subpixel 1L and the subpixel 2L, and the subpixel 1R and the subpixel 2R.

Furthermore, at the time of an auto focus operation, it can be performed by phase difference signals obtained by the subpixel 1L and the subpixel 2L, and the subpixel 1R and the subpixel 2R. Furthermore, an image signal may be configured by the sum of signals of the subpixel 1L, the subpixel 2L, the subpixel 1R, and the subpixel 2R, and furthermore, the sum of the subpixel 1L and the subpixel 2L and the sum of the subpixel 2L and the subpixel 2R can be used as separate image signals.

Figure 15B:
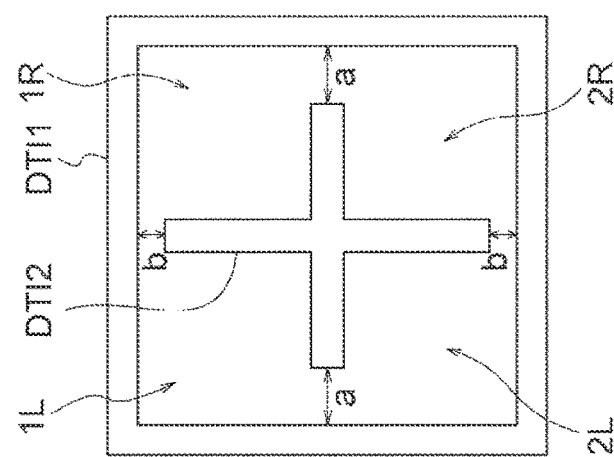
FIGS. 15A and 15B are plan views illustrating a modification of an arrangement of a first pixel separation region and a second pixel separation region in the solid-state imaging device according to the fifth embodiment to which the present technology is applied.
Figure 15A:
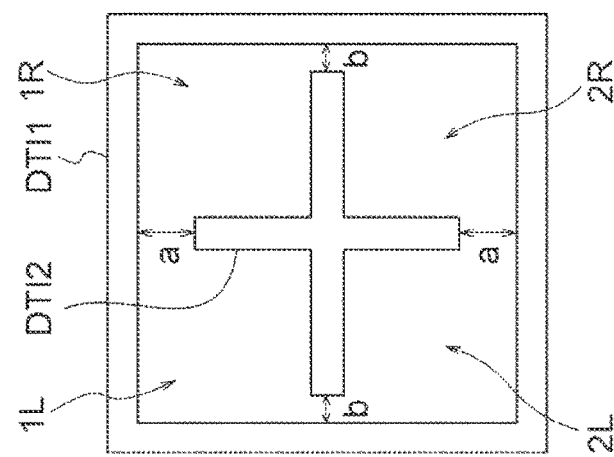

FIGS. 15A and 15B illustrate a modification of an arrangement of the second pixel separation region DTI2. FIGS. 15A and 15B illustrate a plan views in a case where intervals between the first pixel separation region DTI1 and the second pixel separation region DTI2 are different from each other. Unless otherwise specified, "up" will mean an upward direction in FIGS. 15A and 15B, and "right" will mean a rightward direction in FIGS. 15A and 15B.

In a solid-state imaging device illustrated in FIG. 15A, in the second pixel separation region DTI2 and the first pixel separation region DTI1, a gap a that is not divided in a horizontal direction is wider than a gap b that is not divided in a vertical direction. Specifically, the gap a formed between the subpixel 1L and the subpixel 1R is wider than the gap b formed between the subpixel 1L and the subpixel 2L.

On the other hand, in a solid-state imaging device illustrated in FIG. 15B, in the second pixel separation region DTI2 and the first pixel separation region DTI1, a gap a that is not divided in a vertical direction is wider than a gap b that is not divided in a horizontal direction. Specifically, the gap a formed between the subpixel 1L and the subpixel 2L is wider than the gap b formed between the subpixel 1L and the subpixel 1R.

Next, the overflow region OF will be described with reference to FIGS. 16A, 16B, and 16C. FIGS. 16A, 16B, and 16C are plan views illustrating a place where the overflow region OF is formed. The overflow regions OFs may be provided in all gaps (for example, four places) formed between the first pixel separation region DTI1 and the second pixel separation region DTI2.

FIG. 16A illustrates an example in which overflow regions OFs (an overflow region OF1, an overflow region OF2, an overflow region OF3, and an overflow region OF4) are formed in all gaps formed between the first pixel separation region DTI1 and the second pixel separation region DTI2.

Furthermore, FIG. 16B illustrates an example in which overflow regions OFs (an overflow region OF1 and an overflow region OF3) are formed in gaps in the horizontal direction among gaps formed between the first pixel separation region DTI1 and the second pixel separation region DTI2. Specifically, the overflow region OF1 is formed in a gap between the subpixel 1L and the subpixel 1R, and the overflow region OF3 is formed in a gap between the subpixel 2L and the subpixel 2R.

Furthermore, FIG. 16C illustrates an example in which overflow regions OFs (an overflow region OF2 and an overflow region OF4) are formed in gaps in the vertical direction among gaps formed between the first pixel separation region DTI1 and the second pixel separation region DTI2. Specifically, the overflow region OF4 is formed in a gap between the subpixel 1L and the subpixel 2L, and the overflow region OF2 is formed in a gap between the subpixel 1R and the subpixel 2R.

Next, a concentration of the overflow region OF will be described with reference to FIGS. 17A, 17B, and 17C. FIGS. 17A, 17B, and 17C are plan views illustrating a place where the overflow region OF is formed.

FIG. 17A illustrates an example in which overflow regions OFs (an overflow region OF1, an overflow region OF2, an overflow region OF3, and an overflow region OF4) are formed in all gaps formed between the first pixel separation region DTI1 and the second pixel separation region DTI2.

FIG. 17A illustrates a case where the overflow region OF1 and the overflow region OF3 have a lower impurity concentration in a P-type region than the overflow region OF2 and the overflow region OF4, a case where the overflow region OF1 and overflow region OF3 are N-type regions, or a case where the overflow region OF1 and the overflow region OF3 have a higher impurity concentration in an N-type region than the overflow region OF2 and the overflow region OF4.

In FIG. 17B, an overflow region OF1 and an overflow region OF3 are formed in gaps between the first pixel separation region DTI1 and the second pixel separation region DTI2. In this case, a difference may be provided in an impurity concentration in a P-type region between the overflow region OF1 and the overflow region OF3.

In FIG. 17C, an overflow region OF2 and an overflow region OF4 are formed in gaps between the first pixel separation region DTI1 and the second pixel separation region DTI2. In this case, a difference may be provided in an impurity concentration in a P-type region between the overflow region OF2 and the overflow region OF4.

Next, a case where unit pixels of the first pixel separation region DTI1 and the second pixel separation region DTI2 are arranged in an array will be described.

Figure 18:
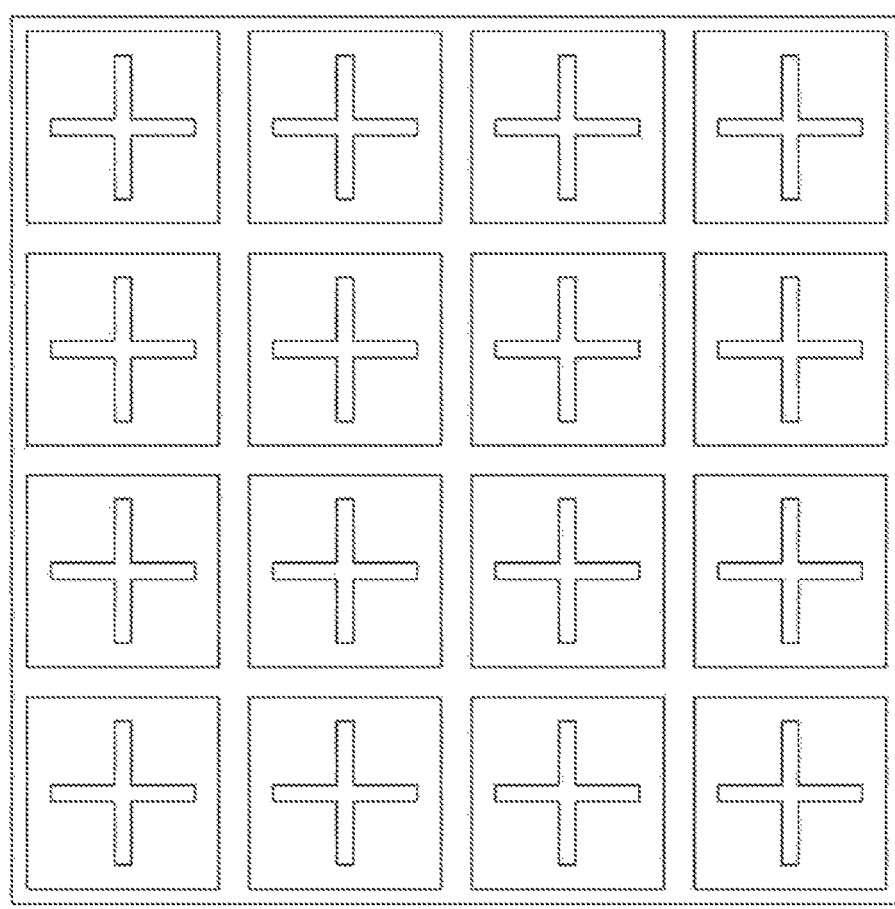
FIG. 18 is a plan view in which arrangement examples of the first pixel separation region and the second pixel separation region illustrated in FIG. 14A are arranged in an array.
Figure 19:
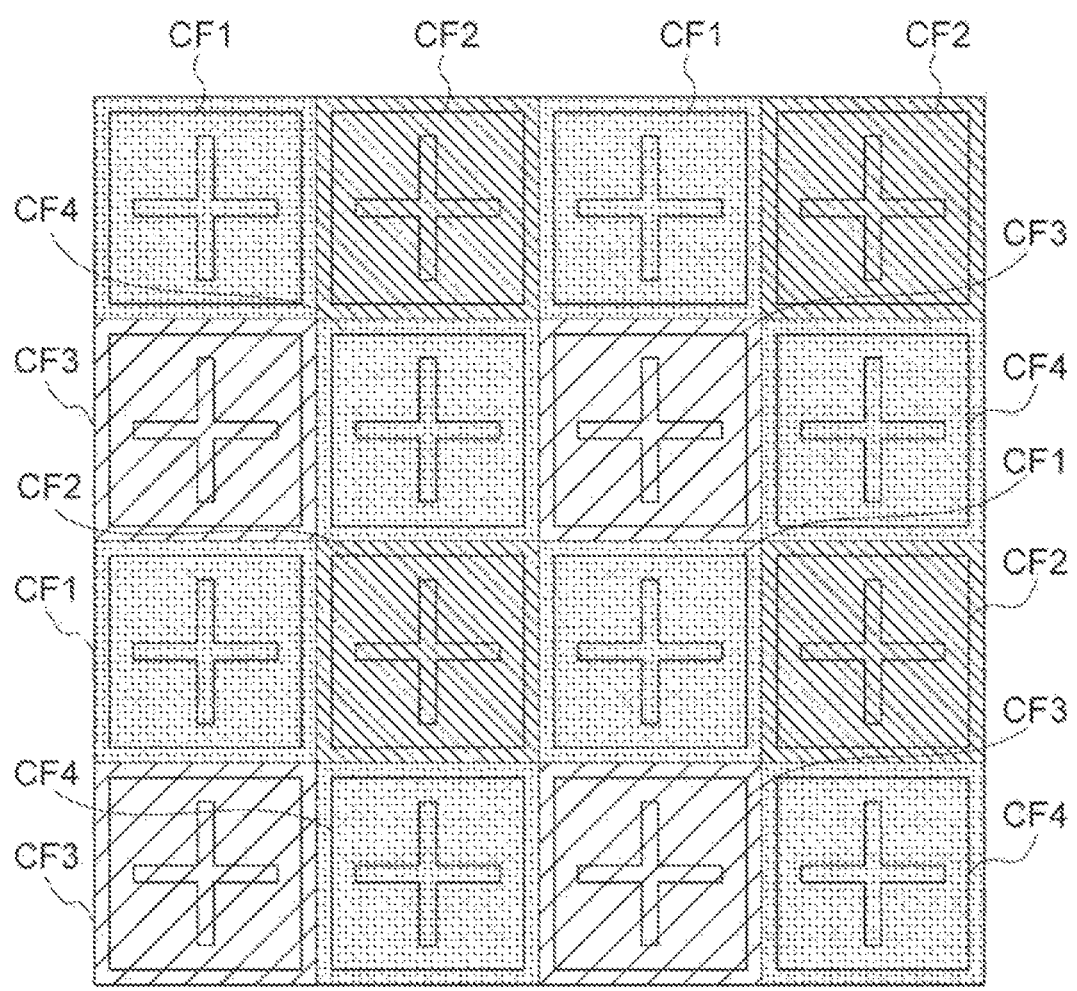
FIG. 19 illustrates an example in which color filters are arrayed with respect to an array-like arrangement of unit pixels illustrated in FIG. 18.

FIG. 18 is a plan view in which arrangement examples of the first pixel separation region DTI1 and the second pixel separation region DTI2 illustrated in FIG. 14A are arranged in an array. FIG. 19 illustrates an example in which color filters are arrayed with respect to an array-like arrangement of unit pixels illustrated in FIG. 18.

Any one of a color filter CF1, a color filter CF2, a color filter CF3, or a color filter CF4 is mounted on each of sixteen solid-state imaging devices. The color filter CF1 is a green color filter, the color filter CF2 is a red color filter, the color filter CF3 is a blue color filter, and the color filter CF4 is a green color filter.

Figure 20:
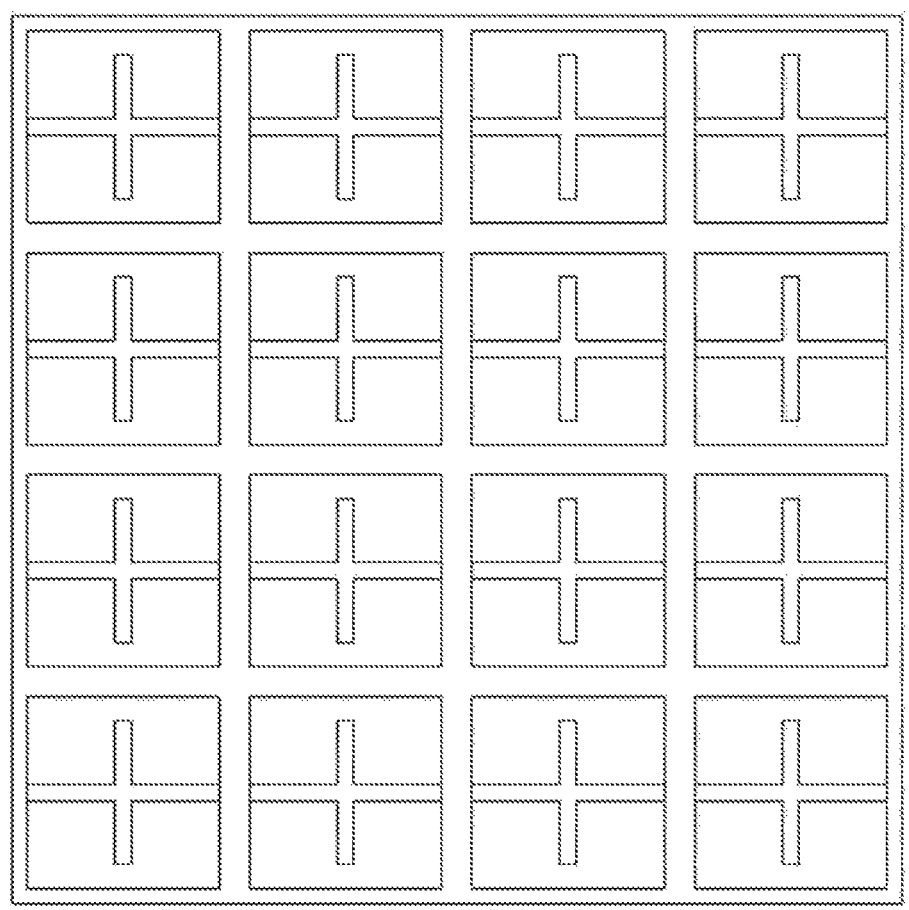
FIG. 20 is a plan view in which arrangement examples of the first pixel separation region DTI1 and the second pixel separation region DTI2 illustrated in FIG. 14B are arranged in an array.
Figure 21:
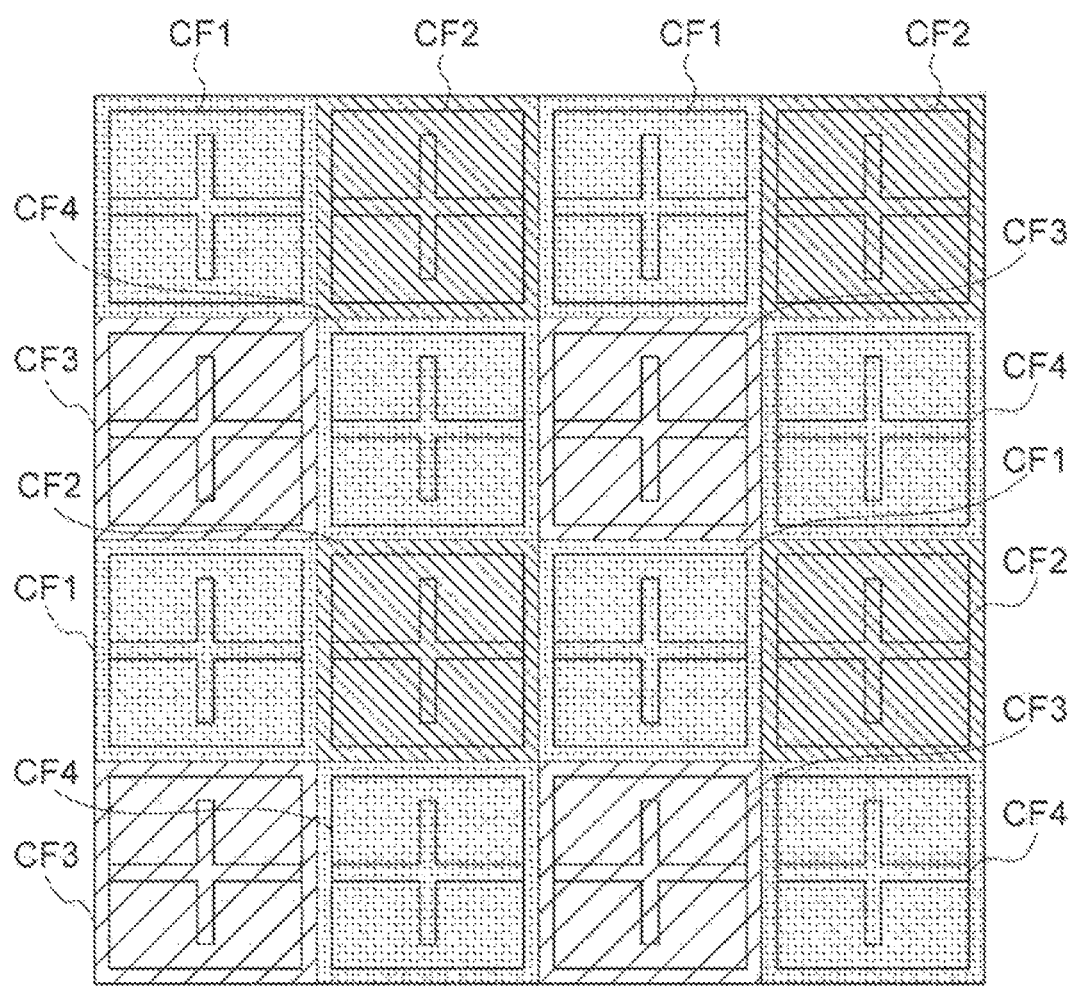
FIG. 21 is a plan view illustrating an example in which color filters are arrayed with respect to an array-like arrangement of unit pixels illustrated in FIG. 20.

FIG. 20 is a plan view in which arrangement examples of the first pixel separation region DTI1 and the second pixel separation region DTI2 illustrated in FIG. 14B are arranged in an array. FIG. 21 is a plan view illustrating an example in which color filters are arrayed with respect to an array-like arrangement of unit pixels illustrated in FIG. 20.

Any one of a color filter CF1, a color filter CF2, a color filter CF3, or a color filter CF4 is mounted on each of sixteen solid-state imaging devices. The color filter CF1 is a green color filter, the color filter CF2 is a red color filter, the color filter CF3 is a blue color filter, and the color filter CF4 is a green color filter.

Figure 22:
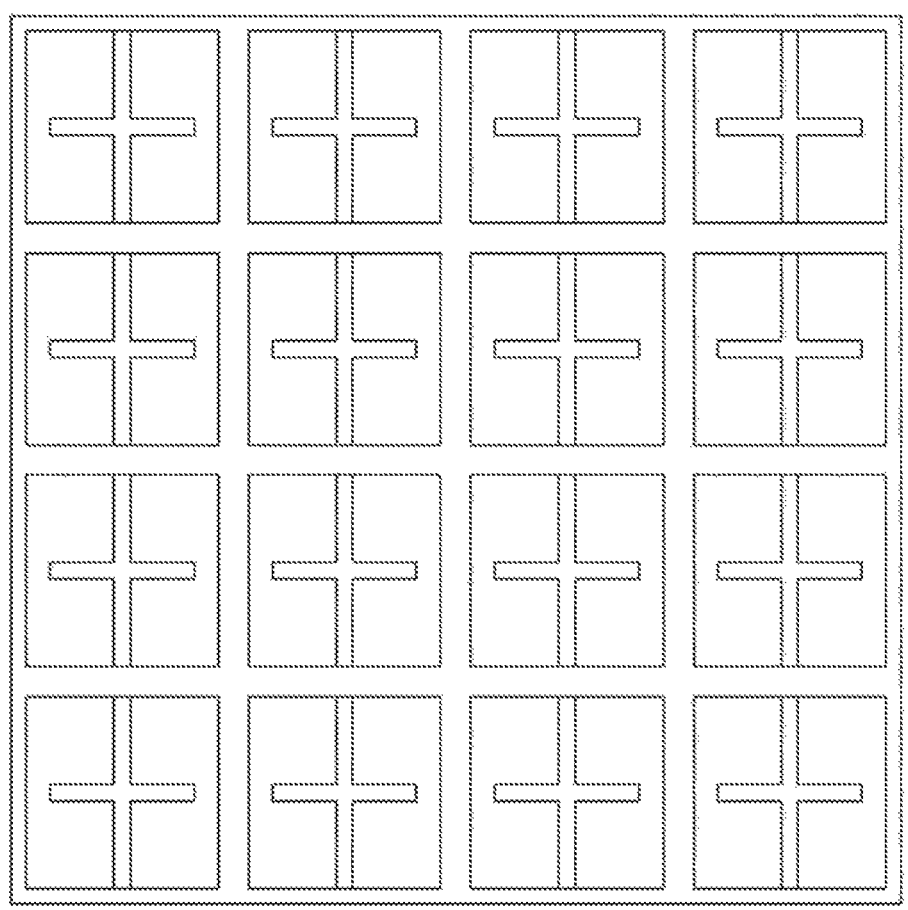
FIG. 22 is a plan view in which arrangement examples of the first pixel separation region and the second pixel separation region illustrated in FIG. 14C are arranged in an array.
Figure 23:
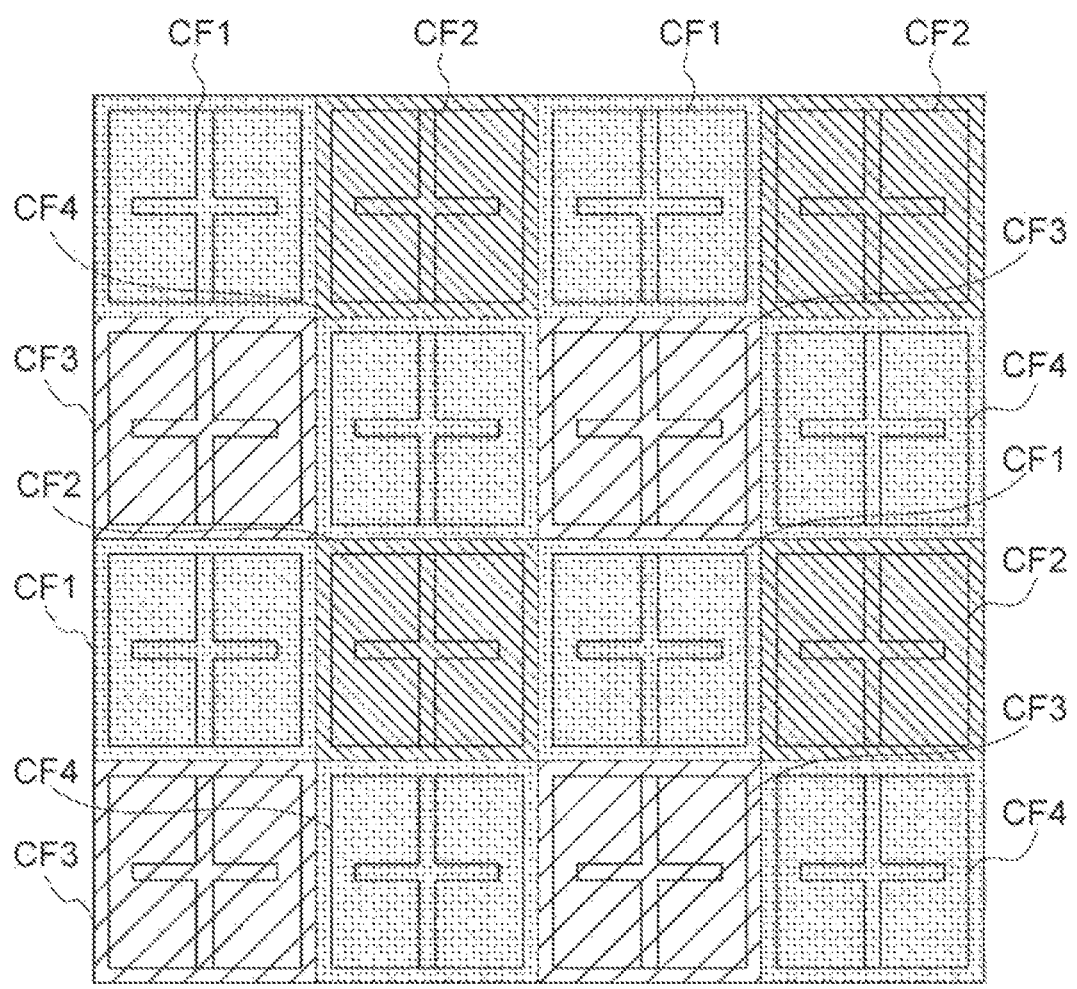
FIG. 23 illustrates an example in which color filters are arrayed with respect to an array-like arrangement of unit pixels illustrated in FIG. 22.

FIG. 22 is a plan view in which arrangement examples of the first pixel separation region DTI1 and the second pixel separation region DTI2 illustrated in FIG. 14C are arranged in an array. FIG. 23 illustrates an example in which color filters are arrayed with respect to an array-like arrangement of unit pixels illustrated in FIG. 22.

Any one of a color filter CF1, a color filter CF2, a color filter CF3, or a color filter CF4 is mounted on each of sixteen solid-state imaging devices. The color filter CF1 is a green color filter, the color filter CF2 is a red color filter, the color filter CF3 is a blue color filter, and the color filter CF4 is a green color filter.

Figure 24:
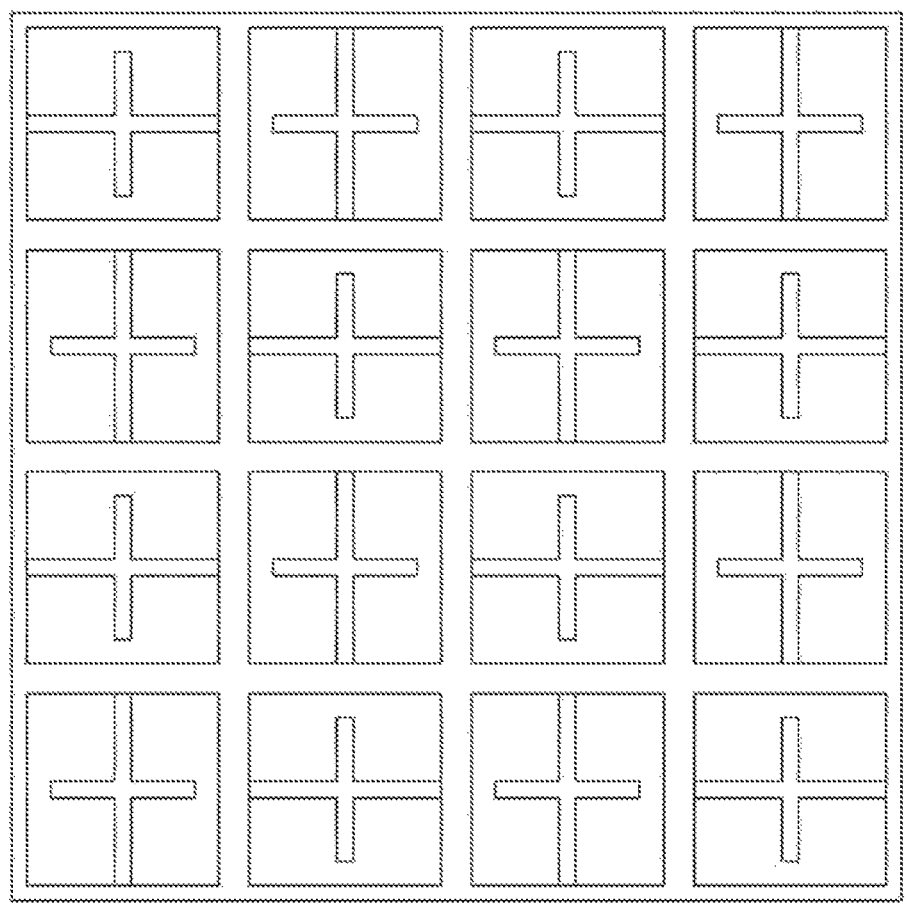
FIG. 24 illustrates a plan view in which the arrangement examples illustrated in FIG. 14B and the arrangement examples illustrated in FIG. 14C are alternately arranged in an array.
Figure 25:
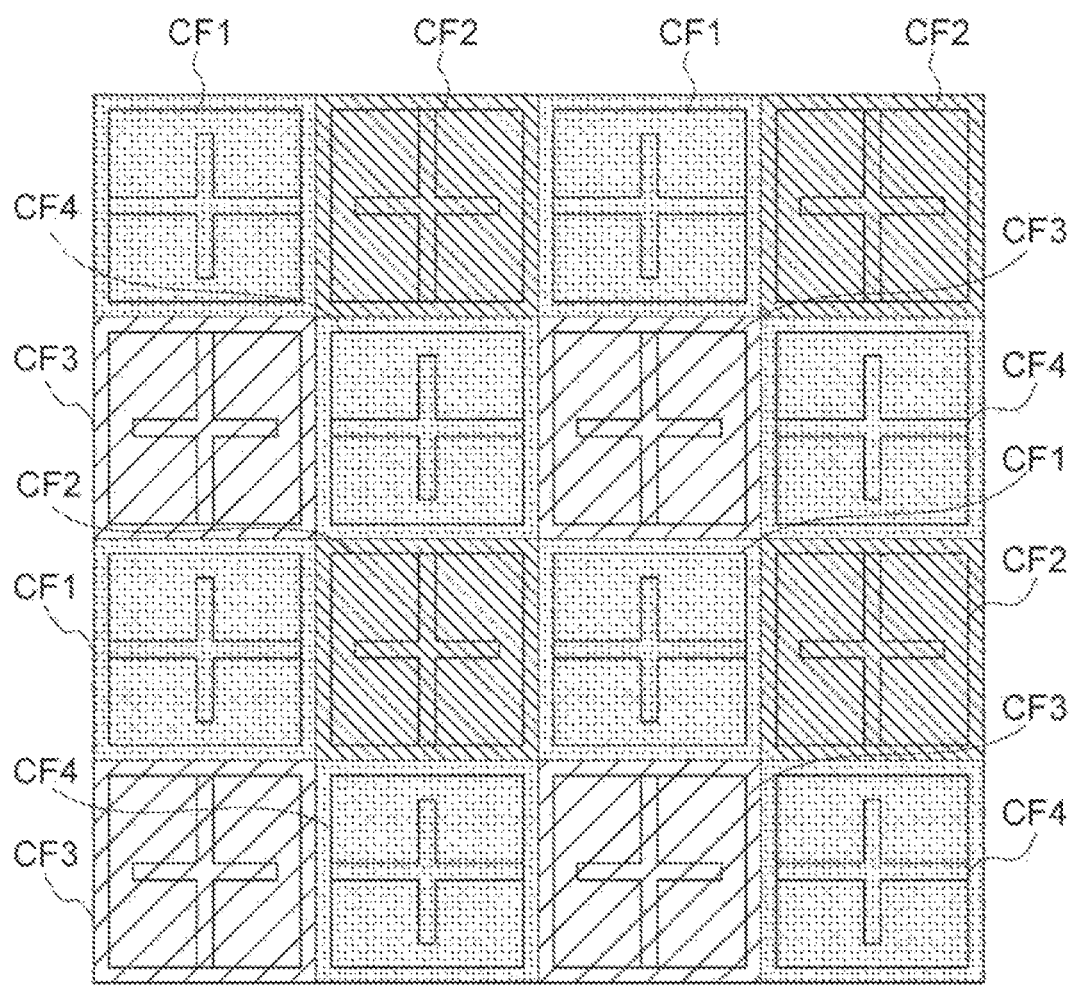
FIG. 25 is a plan view illustrating an example in which color filters are arrayed with respect to an array-like arrangement of unit pixels illustrated in FIG. 24.

FIG. 24 illustrates a plan view in which the arrangement examples illustrated in FIG. 14B and the arrangement examples illustrated in FIG. 14C are alternately arranged in an array. FIG. 25 is a plan view illustrating an example in which color filters are arrayed with respect to an array-like arrangement of unit pixels illustrated in FIG. 24.

Any one of a color filter CF1, a color filter CF2, a color filter CF3, or a color filter CF4 is mounted on each of sixteen solid-state imaging devices. The color filter CF1 is a green color filter, the color filter CF2 is a red color filter, the color filter CF3 is a blue color filter, and the color filter CF4 is a green color filter.

Figure 26:
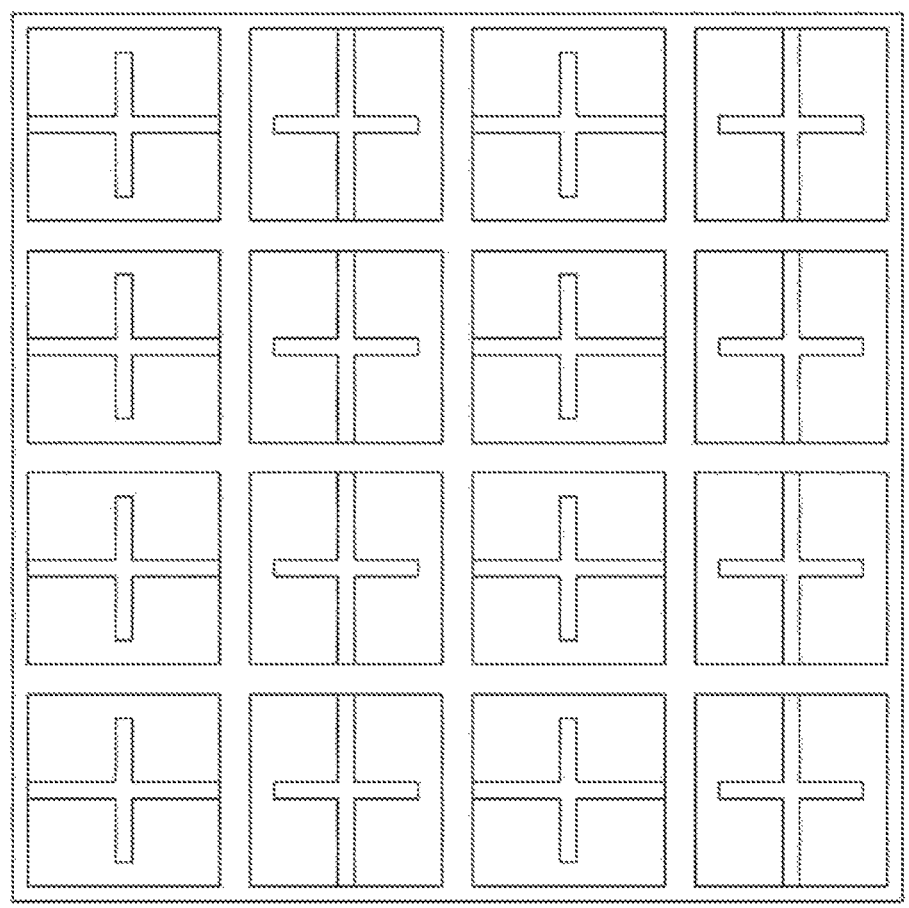
FIG. 26 illustrates a plan view in which the arrangement examples illustrated in FIG. 14B and the arrangement examples illustrated in FIG. 14C are alternately arranged in an array and are arranged so that the same shapes are aligned in a longitudinal direction.
Figure 27:
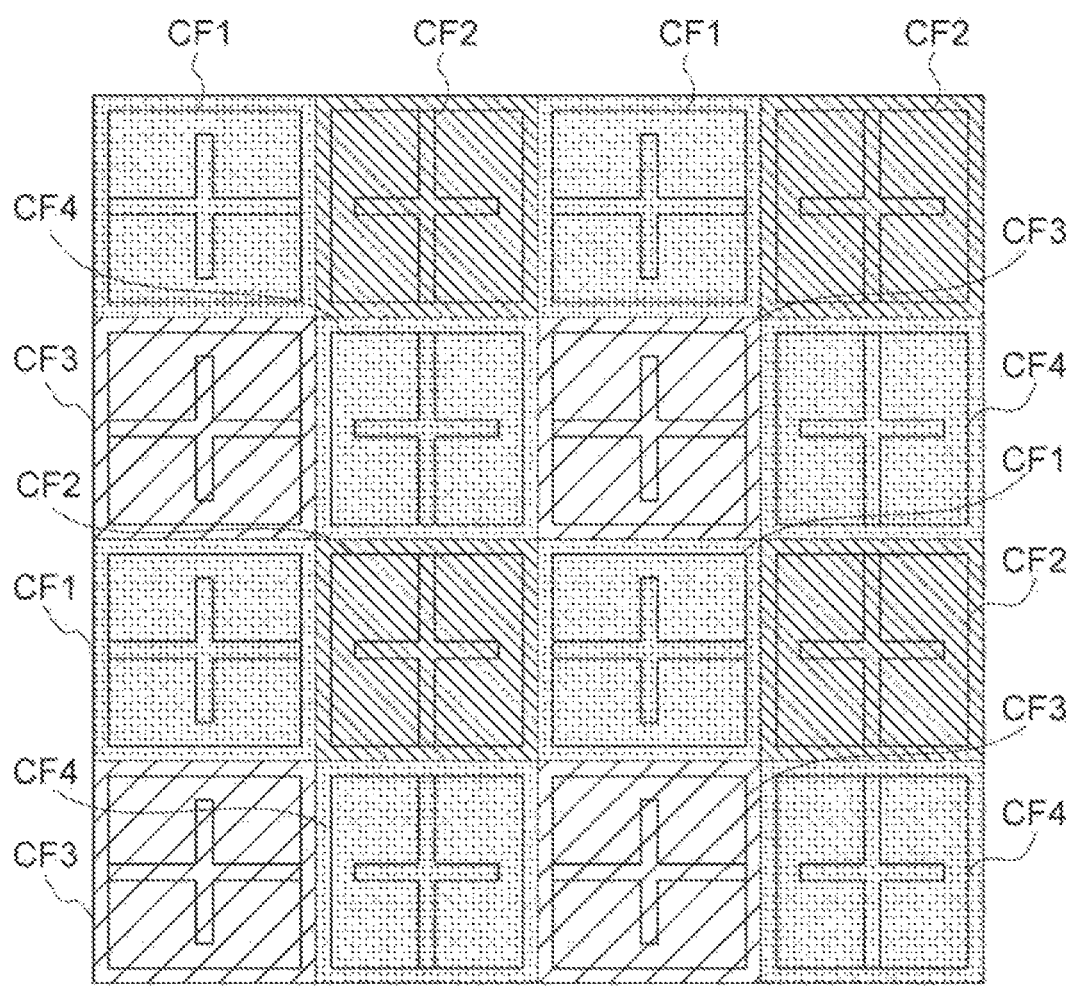
FIG. 27 is a plan view illustrating an example in which color filters are arrayed with respect to an array-like arrangement of unit pixels illustrated in FIG. 26.

FIG. 26 illustrates a plan view in which the arrangement examples illustrated in FIG. 14B and the arrangement examples illustrated in FIG. 14C are alternately arranged in an array and are arranged so that the same shapes are aligned in a longitudinal direction. FIG. 27 is a plan view illustrating an example in which color filters are arrayed with respect to an array-like arrangement of unit pixels illustrated in FIG. 26.

Any one of a color filter CF1, a color filter CF2, a color filter CF3, or a color filter CF4 is mounted on each of sixteen solid-state imaging devices. The color filter CF1 is a green color filter, the color filter CF2 is a red color filter, the color filter CF3 is a blue color filter, and the color filter CF4 is a green color filter.

Figure 28:
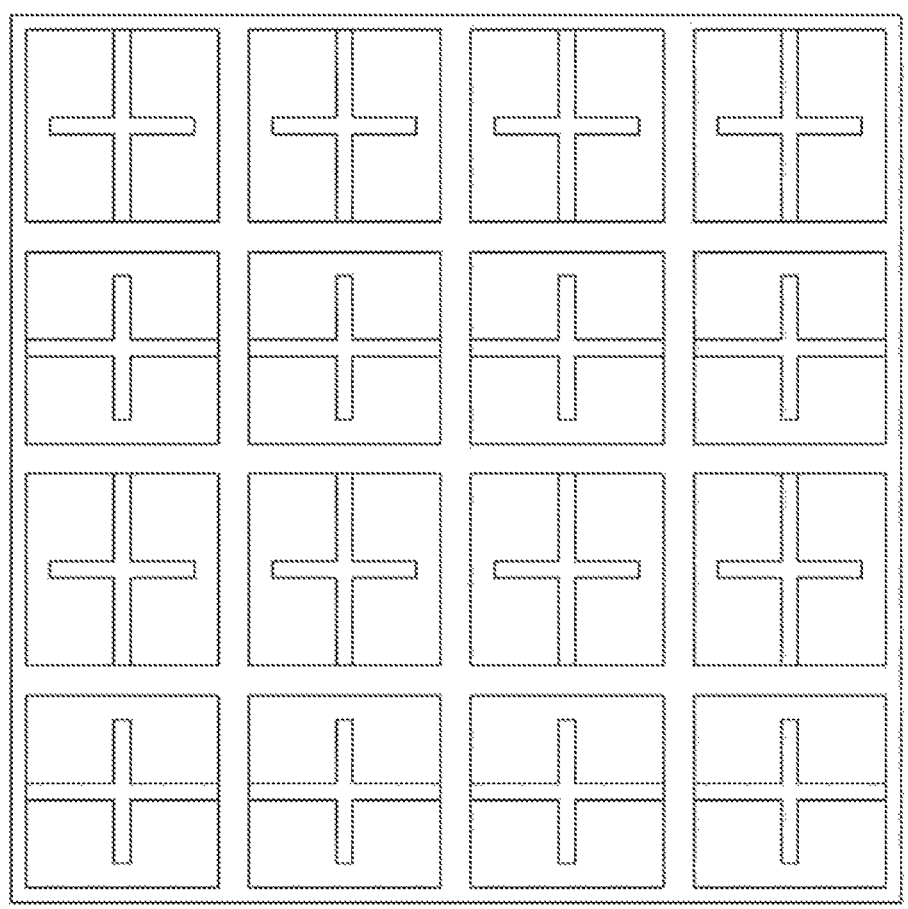
FIG. 28 illustrates a plan view in which the arrangement examples illustrated in FIG. 14B are arranged in a line in a transverse direction, and the arrangement examples illustrated in FIG. 14C are arranged in a line in the transverse direction, and the arrangement examples illustrated in FIG. 14B and the arrangement examples illustrated in FIG. 14C are alternately arranged in an array.
Figure 29:
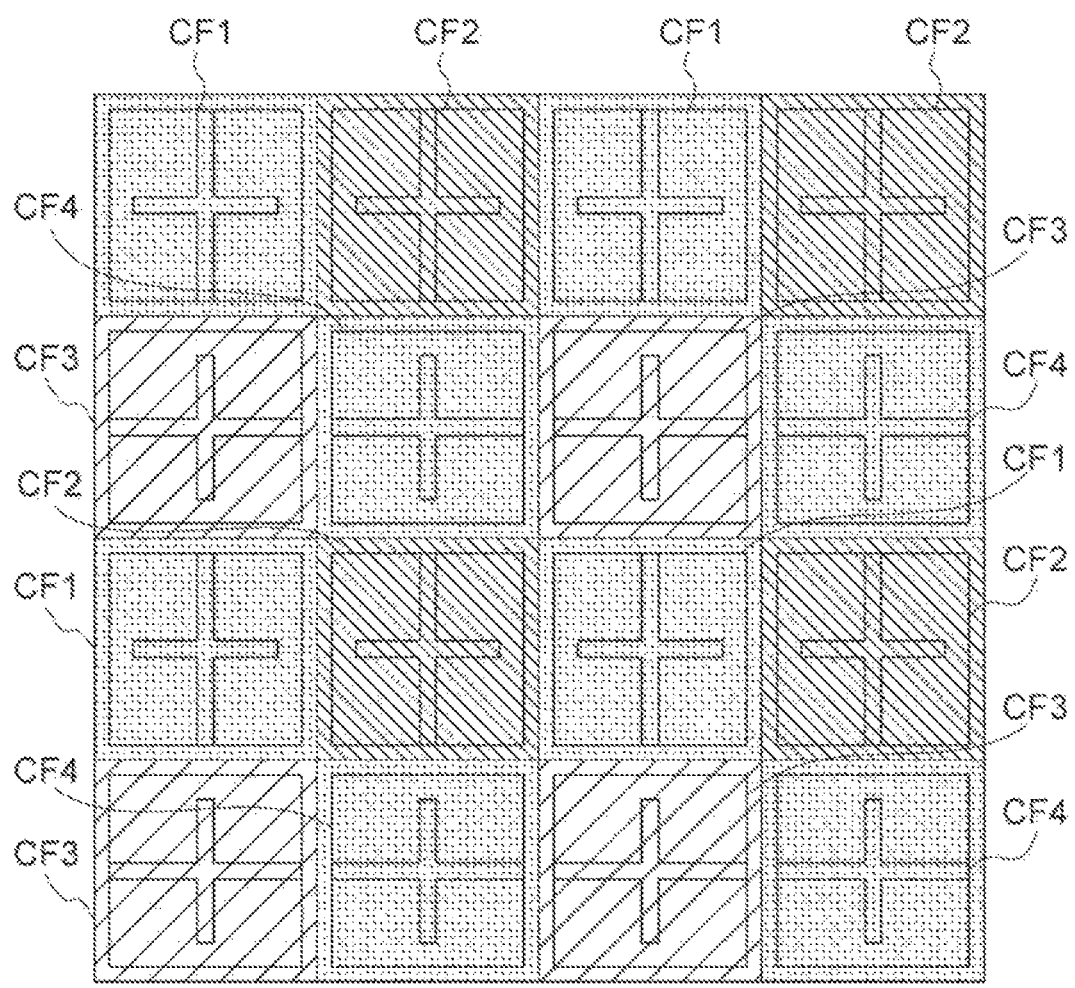
FIG. 29 is a plan view illustrating an example in which color filters are arrayed with respect to an array-like arrangement of unit pixels illustrated in FIG. 28.

FIG. 28 illustrates a plan view in which the arrangement examples illustrated in FIG. 14B are arranged in a line in a transverse direction, and the arrangement examples illustrated in FIG. 14C are arranged in a line in the transverse direction, and the arrangement examples illustrated in FIG. 14B and the arrangement examples illustrated in FIG. 14C are alternately arranged in an array. FIG. 29 is a plan view illustrating an example in which color filters are arrayed with respect to an array-like arrangement of unit pixels illustrated in FIG. 28.

Any one of a color filter CF1, a color filter CF2, a color filter CF3, or a color filter CF4 is mounted on each of sixteen solid-state imaging devices. The color filter CF1 is a green color filter, the color filter CF2 is a red color filter, the color filter CF3 is a blue color filter, and the color filter CF4 is a green color filter.

7. Sixth Embodiment (Example 6 of Solid-State Imaging Device)

A solid-state imaging device according to a sixth embodiment of the present technology is a solid-state imaging device further including a power supply that supplies voltages of three or more values to the transfer gate TG in the solid-state imaging device according to the fourth embodiment according to the present technology.

Furthermore, the solid-state imaging device according to the sixth embodiment of the present technology is a solid-state imaging device further including a boosting circuit that boosts and steps down a voltage supplied to the transfer gate TG in the solid-state imaging device according to the fourth embodiment according to the present technology.

Figure 30:
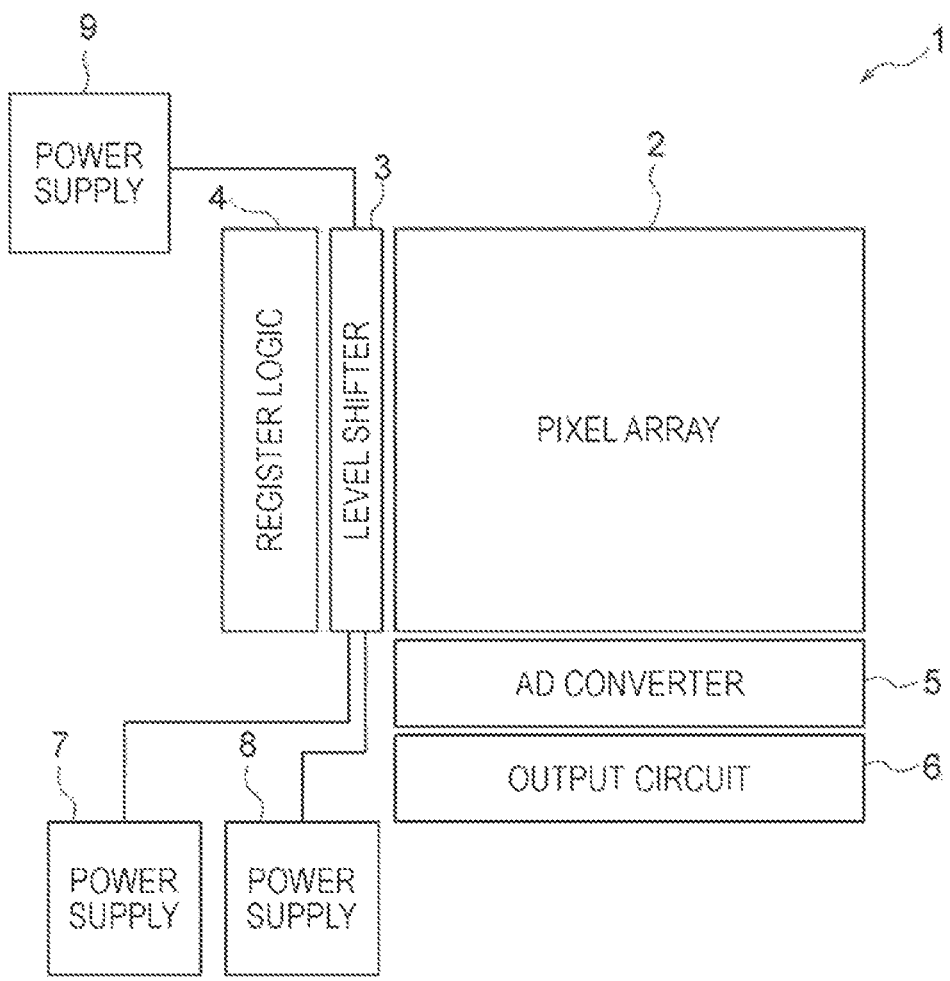
FIG. 30 is a block diagram illustrating a configuration example of a solid-state imaging device according to a sixth embodiment to which the present technology is applied.

FIG. 30 illustrates a configuration in which the solid-state imaging device according to the sixth embodiment of the present technology further includes a power supply that supplies voltages of three or more values to the transfer gate TG. FIG. 30 is a block diagram illustrating a configuration example of a solid-state imaging device 1 according to the sixth embodiment.

As illustrated in FIG. 30, the solid-state imaging device 1 is configured as, for example, a CMOS image sensor. The solid-state imaging device 1 includes a pixel region (pixel array) 2 in which a plurality of pixels 1a is regularly arrayed in a two-dimensional array on a semiconductor substrate (for example, a Si substrate) (not illustrated), and a peripheral circuit unit.

A pixel 1a has a photoelectric conversion unit (for example, a photodiode) and a plurality of pixel transistors (MOS transistors). The plurality of pixel transistors includes three transistors, for example, a transfer transistor, a reset transistor, and an amplification transistor. Furthermore, the plurality of pixel transistors can include four transistors by adding a selection transistor. Note that an equivalent circuit of a unit pixel is similar to the well-known technology, and a detailed description thereof will thus be omitted.

Furthermore, the pixel 1a can be configured as one unit pixel or can have a shared pixel structure. This shared pixel structure is a structure in which a plurality of photodiodes shares transistors other than a floating diffusion and a plurality of transfer transistors with each other. That is, in a shared pixel, photodiodes and transfer transistors that configure a plurality of unit pixels are configured to share one other pixel transistor with each other.

The peripheral circuit unit includes a level shifter 3, a register logic 4, an analog to digital (AD) converter 5, an output circuit 6, a power supply 7, a power supply 8, and a power supply 9.

The level shifter 3 is connected to the power supply 7, the power supply 8, and the power supply 9, and determines a voltage applied to the plurality of pixels 1a arrayed in the pixel array 2. A voltage applied to the transfer gate TG by the level shifter 3 is "High potential" when reading a signal, is "Low potential 1" when accumulating a signal at the time of an auto focus operation, and is "Low potential 2" that does not generate an overflow at the time of a high dynamic range operation. The level shifter 3 includes a level shift circuit that changes a voltage from "High potential" to "Low potential 1", a level shift circuit that changes a voltage from "Low potential 1" to "Low potential 2", and a level shift circuit that changes a voltage from "High potential" to "Low potential 2", in order to apply three types of voltages, that is, "High potential", "Low potential 1", and "Low potential 2". Furthermore, two types of power supplies are connected to each of these three level shift circuits configuring the level shifter 3.

The register logic 4 is configured by, for example, a shift register. The register logic 4 selects a pixel drive wiring and supplies a pulse for driving the pixel to the selected pixel drive wiring to drive the pixel in row units. That is, the register logic 4 selectively scans each pixel 1a of the pixel array 2 sequentially in row units in a vertical direction. Then, the register logic 4 supplies a pixel signal based on signal charges generated according to an amount of received light in the photoelectric conversion unit of each pixel 1a to the analog to digital (AD) converter 5.

The AD converter 5 is arranged for every column of pixels 1a, for example. The AD converter 5 performs signal processing such as noise removal or the like on signals output from pixels 1a of one row for every pixel column. Specifically, the AD converter 5 performs signal processing such as correlated double sampling (CDS), signal amplification, analog/digital (AD) conversion, and the like, for removing fixed pattern noise unique to the pixel 1a.

The output circuit 6 performs signal processing on signals sequentially supplied from the AD converter 5 through a horizontal signal line, and outputs the processed signals. For example, the output circuit 6 may perform only buffering or may perform black level adjustment, column variation correction, various digital signal processing, and the like.

The power supply 7, the power supply 8, and the power supply 9 supply the level shifter 3 with any one of the three types of voltages, that is, "High potential", "Low potential 1", and "Low potential 2", that does not overlap.

Figure 31A:
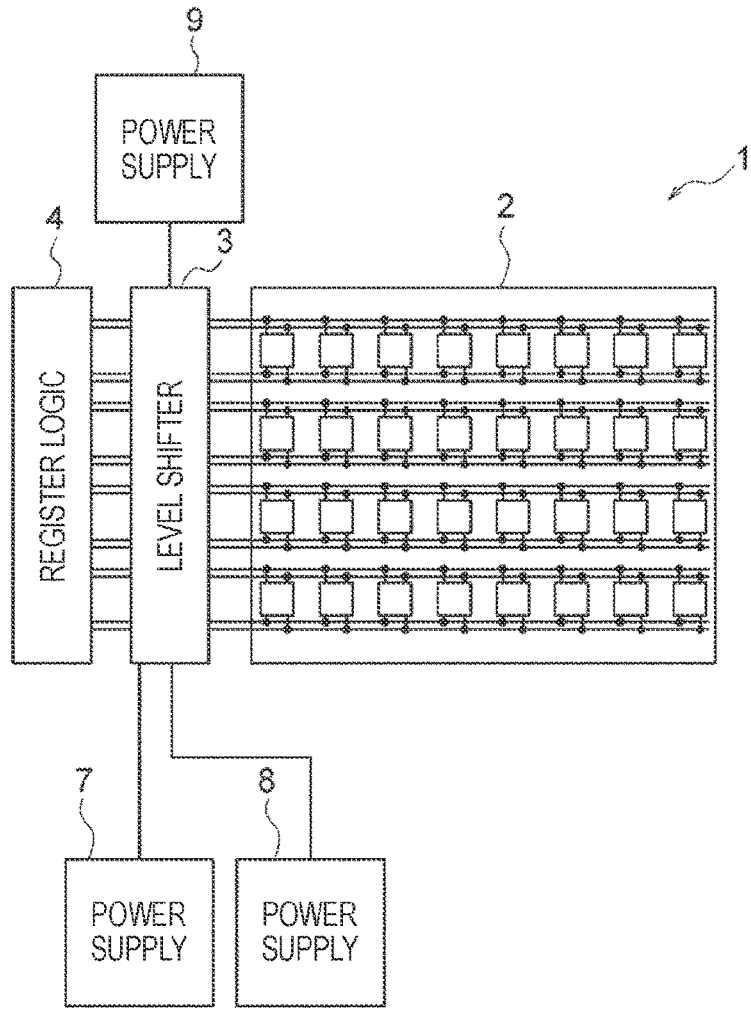
FIGS. 31A and 31B are block diagrams illustrating a configuration example of the solid-state imaging device according to the sixth embodiment to which the present technology is applied.
Figure 31B:
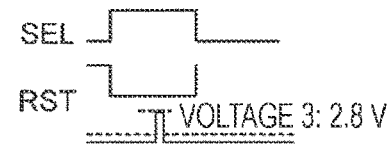

FIGS. 31A and 31B are block diagrams illustrating a configuration in which a plurality of pixels 1a of the solid-state imaging device according to the sixth embodiment of the present technology is arrayed in a two-dimensional array and power is supplied. FIGS. 31A and 31B are block diagrams of the solid-state imaging device according to the sixth embodiment to which three voltages are supplied. Note that in the solid-state imaging device 1 of FIGS. 31A and 31B, it is illustrated that a plurality of pixels 1a is arrayed in a two-dimensional array, and a basic configuration of the solid-state imaging device 1 of FIGS. 31A and 31B are similar to that of the solid-state imaging device 1 of FIG. 30. Therefore, a detailed description will be omitted. Note that in FIGS. 31A and 31B, it is assumed that the power supply 7 supplies −1.2 [V], the power supply 8 supplies −0.5 [V], and the power supply 9 supplies 2.8 [V].

Figure 32:
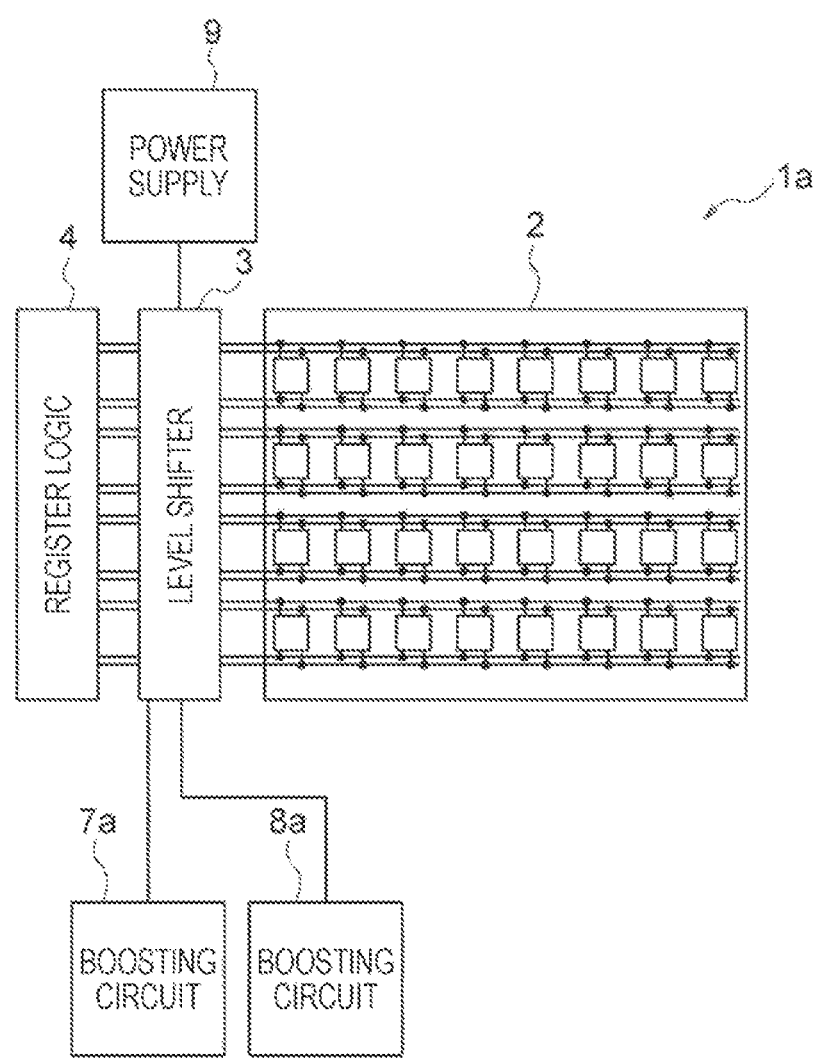
FIG. 32 is a block diagram in which a part of a power supply circuit of the solid-state imaging device according to the sixth embodiment to which the present technology is applied is configured by a boosting circuit.

FIG. 32 illustrates a block diagram in which a part of a power supply circuit of the solid-state imaging device according to the sixth embodiment of the present technology is configured by a boosting circuit. FIG. 32 is a block diagram in which a part of a power supply circuit of the solid-state imaging device according to the sixth embodiment of the present technology is configured by a boosting circuit.

As illustrated in FIG. 32, in the pixel 1a, the power supply 7 is configured by a boosting circuit 7a, and the power supply 8 is configured by a boosting circuit 8a. The other configurations are the same as those of the solid-state imaging device 1 of FIGS. 31A and 31B, and a description thereof will thus be omitted.

The boosting circuit 7a and the boosting circuit 8a are boosting circuits configured by a charge pump circuit or the like provided in the pixel 1a. In this case, the boosting circuit 7a applies −1.2 [v], and the boosting circuit 8a applies −0.5 [V].

Figure 33:
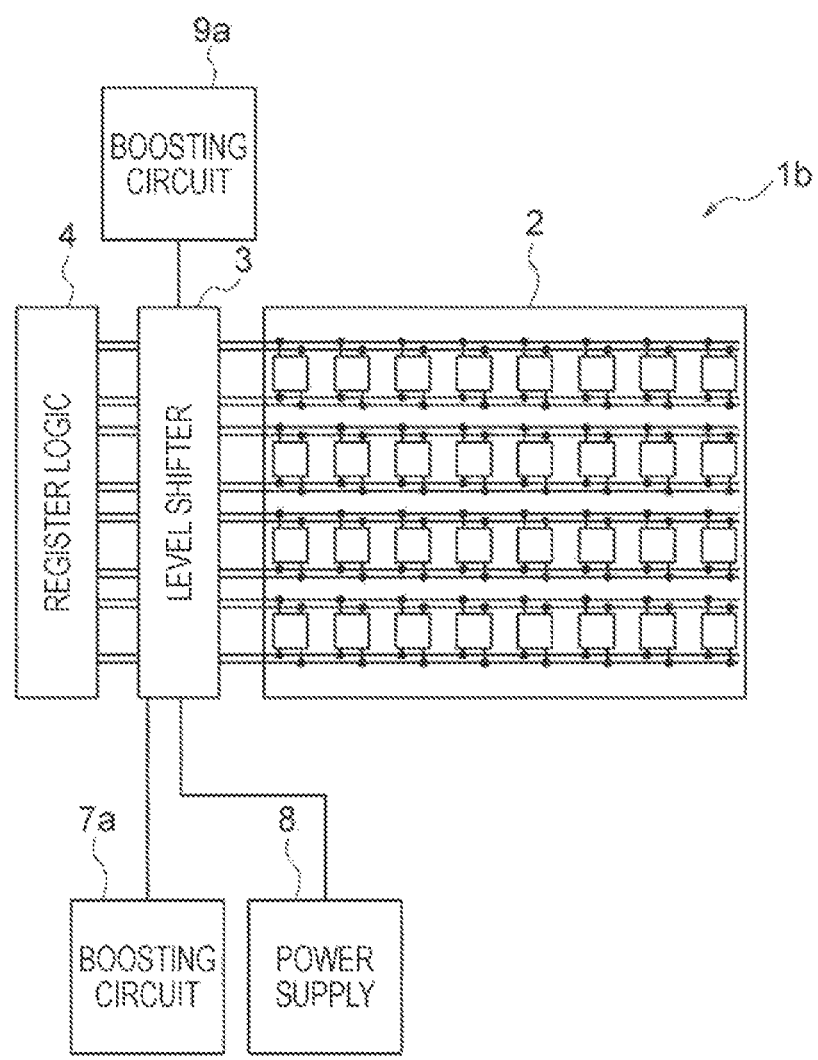
FIG. 33 is a block diagram in which a part of a power supply circuit of the solid-state imaging device according to the sixth embodiment to which the present technology is applied is configured by a boosting circuit.

FIG. 33 illustrates a block diagram in which a part of a power supply circuit of a solid-state imaging device 1b according to the sixth embodiment of the present technology is configured by a boosting circuit. FIG. 33 is a block diagram in which a part of a power supply circuit of the solid-state imaging device 1b according to the sixth embodiment of the present technology is configured by a boosting circuit.

As illustrated in FIG. 33, in the solid-state imaging device 1b, the power supply 7 is configured by a boosting circuit 7a, and the power supply 9 is configured by a boosting circuit 9a. The other configurations are the same as those of the solid-state imaging device 1 of FIGS. 31A and 31B, and a description thereof will thus be omitted.

The boosting circuit 7a and the boosting circuit 9a are boosting circuits configured by a charge pump circuit or the like provided in the pixel 1a. In this case, the boosting circuit 7a applies −1.2 [v], and the boosting circuit 9a applies 2.8 [V].

As described above, the solid-state imaging device according to the sixth embodiment of the present technology supplies three voltages to the transfer gate TG by the power supply circuit or the boosting circuit.

Figure 34:
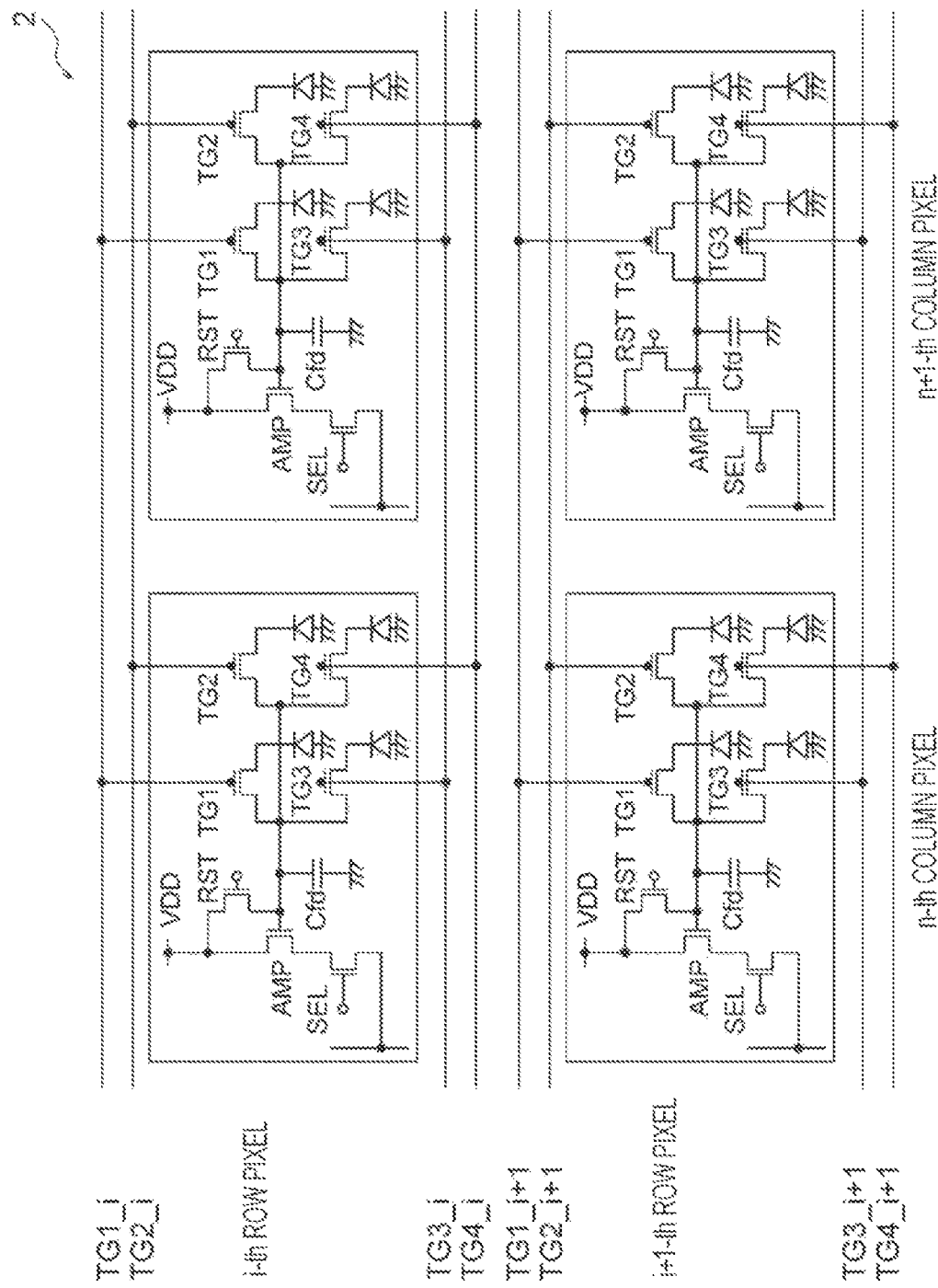
FIG. 34 is a block diagram illustrating a configuration of a pixel array of the solid-state imaging device according to the sixth embodiment to which the present technology is applied.

FIG. 34 illustrates a configuration of a pixel array 2 of the solid-state imaging device according to the sixth embodiment of the present technology. FIG. 34 is a block diagram illustrating the configuration of the pixel array 2 of the solid-state imaging device according to the sixth embodiment of the present technology.

As illustrated in FIG. 34, in the pixel array 2, a plurality of pixels 1a is represented by i rows×n columns. Therefore, three voltages can be applied to the transfer gates TG of the plurality of pixels 1a configured by i rows×n columns.

8. Seventh Embodiment (Example 7 of Solid-State Imaging Device)

First, a case where a dynamic operation and an auto focus operation are performed by one solid-state imaging device will be described.

In a conventional dual pixel-type pixel, in a case where the auto focus (AF) operation is performed in all pixels, a color filter of the same color and one microlens are provided on a photodiode (one pixel) including two divided photodiodes. In such a dual pixel-type pixel, each of the divided photodiodes receives light that has passed through a part of an image forming optical system.

In a case where the auto focus operation is performed, the solid-state imaging device detects an image deviation of each divided photodiode to measure a distance to a subject, and focuses an image by signal processing using distance measurement information. At this time, one of parameters determining detection accuracy of an image deviation amount of each divided photodiode is a signal separation ratio representing a signal difference between divided subpixels at the time of defocusing.

Meanwhile, in a solid-state imaging device having a similar configuration, a high dynamic range (HDR) operation of performing different exposure time controls between subpixels, synthesizing signals with different exposure times with each other by signal processing to configure an image in a wide exposure region, and widening a dynamic range may be performed.

In the dual pixel-type pixel, in a case of achieving both of the auto focus (AF) operation and the HDR operation in all the pixels, there is a problem as follows.

That is, in order to detect an image deviation amount in order to obtain an auto focus (AF) signal, a common light condensing means is required for each subpixel. In a case where such a light condensing means is used, incident light that has passed through the microlens is condensed in a pixel separation region formed at a boundary portion of the subpixel. For this reason, crosstalk between the subpixels becomes remarkable, such that detection accuracy of image deviation information is liable to decrease. In a solid-state imaging device in which a pixel size is miniaturized, subpixel sizes are also reduced at the same time, crosstalk between subpixels is more liable to occur, and the detection accuracy of the image deviation information is more liable to decrease.

Furthermore, in the dual pixel-type pixel described above, if crosstalk occurs between subpixels having different exposure times at the time of acquiring an HDR signal, different signals are incident between the subpixels on which the same image signal should be originally incident. In this case, a sensitivity difference occurs between the subpixels, such that signal non-linearity at the time of HDR signal synthesis due to the crosstalk or fixed pattern noise due to the sensitivity difference occurs, which causes a problem that image quality deteriorates. In order to suppress such deterioration of the image quality, in a case of performing the HDR operation, it is necessary that the pixel separation region formed at the boundary portion of each subpixel is not irradiated with light, such that the crosstalk between the subpixels can be sufficiently reduced.

Therefore, in the dual pixel-type pixel, in order to achieve both of the auto focus operation and the HDR operation, there are optically contradictory requests.

A solid-state imaging device according to a seventh embodiment of the present technology sufficiently reduces the crosstalk between the subpixels and achieves both of the auto focus operation and the HDR operation in the dual pixel-type pixel.

The solid-state imaging device according to the seventh embodiment of the present technology is a solid-state imaging device including a first pixel separation region that separates a plurality of unit pixels including two or more subpixels, a second pixel separation region that separates each of the plurality of unit pixels separated by the first pixel separation region, a first light condensing portion that covers the entirety of the unit pixel, and a plurality of second light condensing portions that covers each of the subpixels.

According to the solid-state imaging device according to the seventh embodiment of the present technology, it is possible to achieve both of a dynamic operation and an auto focus operation with high accuracy in a pixel configuration in which the plurality of unit pixels includes the two or more subpixels.

Hereinafter, a solid-state imaging device 1001, which is an example of the solid-state imaging device according to the seventh embodiment of the present technology, will be described in detail with reference to FIGS. 35 to 37.

Figure 35:
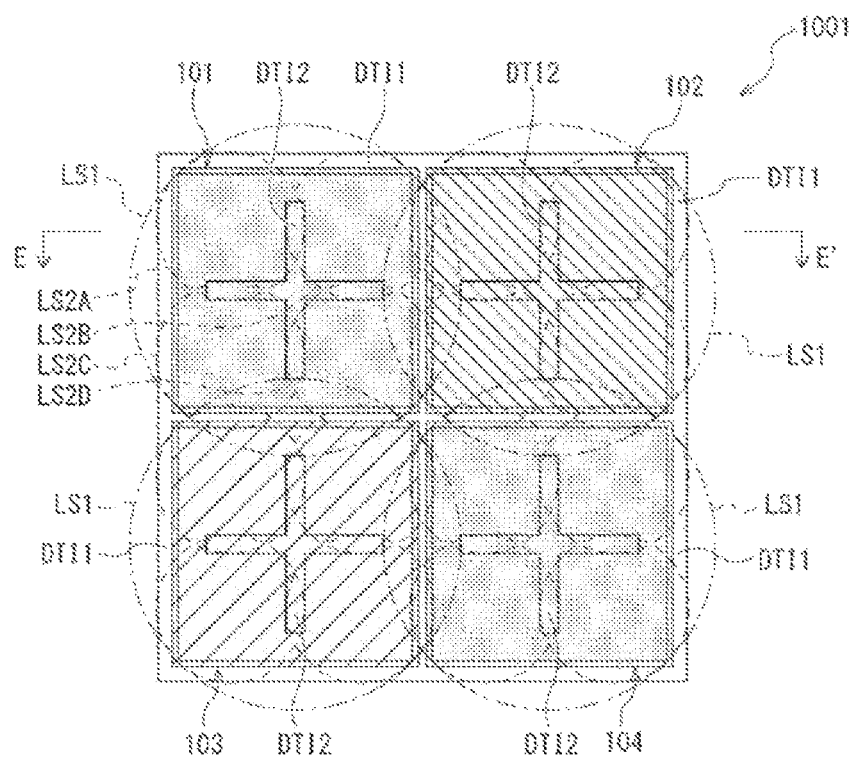
FIG. 35 is a plan view illustrating a layout of a solid-state imaging device according to a seventh embodiment to which the present technology is applied.

FIG. 35 illustrates a layout of a solid-state imaging device 1001, which is an example of the solid-state imaging device according to the seventh embodiment of the present technology. FIG. 35 is a plan view of the solid-state imaging device 1001 including four pixels. FIG. 36 illustrates a layout of a solid-state imaging device 100, which is an example of the solid-state imaging device according to the seventh embodiment of the present technology. FIG. 36 is a plan view of the solid-state imaging device 100 configuring one pixel. Unless otherwise specified, "up" will mean an upward direction in each drawing, and "down" will mean a downward direction in each drawing.

The solid-state imaging device 1001 includes four solid-state imaging devices 100 (solid-state imaging device 101 to solid-state imaging device 104 in FIG. 35) of 2×2.

The solid-state imaging device 100 is provided with a color filter CF. Specifically, the solid-state imaging device 101 is provided with a color filter CF1. The solid-state imaging device 102 is provided with a color filter CF2. The solid-state imaging device 103 is provided with a color filter CF3. The solid-state imaging device 104 is provided with a color filter CF4. FIG. 36 illustrates a plan view of a layout of the solid-state imaging device 100 as a plan view of a layout of the solid-state imaging device 100.

Figure 36:
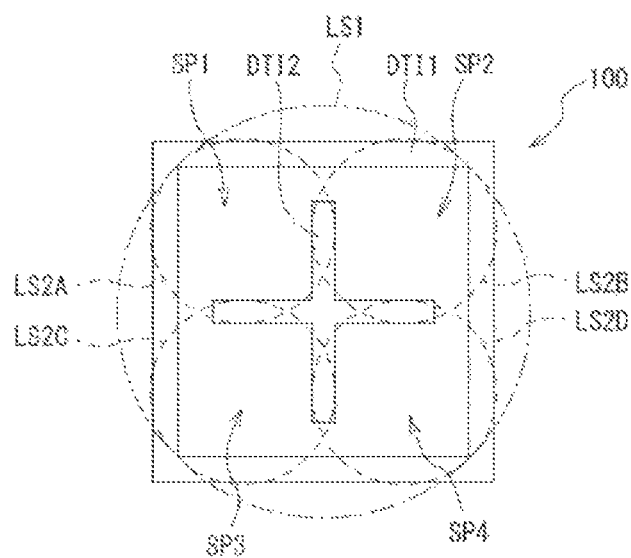
FIG. 36 is a plan view illustrating a layout of a solid-state imaging device according to the seventh embodiment to which the present technology is applied.

As illustrated in FIGS. 35 and 36, the solid-state imaging device 100 includes a first pixel separation region DTI1 that separates a plurality of unit pixels including two or more subpixels SPs (first subpixel SP1 to fourth subpixel SP4) and a second pixel separation region DTI2 that separates each of the plurality of unit pixels separated by the first pixel separation region DTI1. Furthermore, the solid-state imaging device 1001 includes a microlens LS1 (first lens), which is a first light condensing portion that covers the entirety of the unit pixel, and second lenses LS2A to LS2D, which are a plurality of second light condensing portions that covers each of the subpixels of the solid-state imaging device 100.

The solid-state imaging device 1001 is different from the solid-state imaging device 1000 in that it includes the microlens LS1, which is the first light condensing portion, and the second lenses LS2A to LS2D, which are the second light condensing portions. Furthermore, the solid-state imaging device 100 is different from the solid-state imaging device 1000 in that the overflow regions OFs (overflow region OF1 to overflow region OF4) are not essential.

Note that in the solid-state imaging device 1001 of FIG. 35 and the solid-state imaging device 100 of FIG. 36, each portion other than the first and second pixel separation regions DTI1 and DTI2 and the first to fourth subpixels SP1 to SP4 is omitted.

Figure 37:
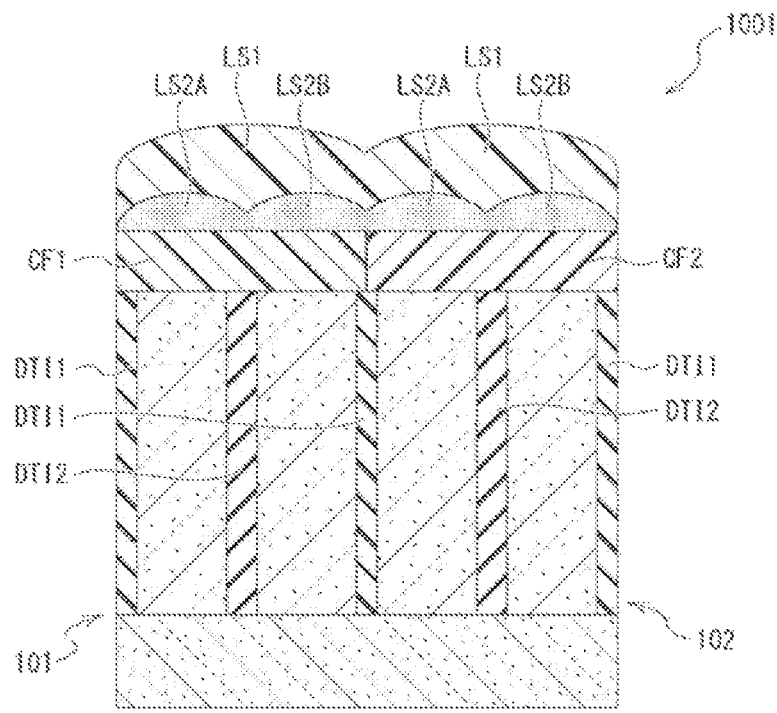
FIG. 37 is a cross-sectional view illustrating a configuration example of an E-E' cross section of the solid-state imaging device according to the seventh embodiment to which the present technology is applied.

FIG. 37 illustrates a configuration of a cross section of the solid-state imaging device 1001 according to the seventh embodiment to which the present technology is applied. FIG. 37 is a cross-sectional view illustrating a configuration example of an E-E' cross section of the solid-state imaging device 1001 (solid-state imaging devices 101 and 102) illustrated in FIG. 35. Note that unless otherwise specified, "up" means an upward direction in FIG. 37, and "down" means a downward direction in FIG. 37.

As illustrated in FIG. 37, the microlenses LS1 are provided above (on light incident sides of) the solid-state imaging devices 101 and 102. The microlenses LS1 are each arranged on each of the color filters CF1 and CF2, and are provided so as to cover the entirety of a first subpixel SP1 to a fourth subpixel SP4 of the solid-state imaging device 101.

Similarly, the microlenses LS1 are also each provided above each of the solid-state imaging devices 103 and 104. That is, the microlenses LS1 are each arranged on each of the color filters CF3 and CF4, and are provided so as to cover the entirety of the first subpixel SP1 to the fourth subpixel SP4 of the solid-state imaging device 101.

The microlenses LS1 provided on each of the solid-state imaging devices 101 to 104 may be formed separately from each other or may be an integrally formed microlens array.

The microlens LS1 includes a material having a lower refractive index than the second lenses LS2A to LS2D. As a material configuring the microlens LS1, for example, a material having a refractive index of 1.5 or more and 1.6 or less is preferable. As such a material, an organic material such as an acrylic resin material or the like is used.

As illustrated in FIG. 37, the second lenses LS2A to LS2D are provided between the microlens LS1 and the solid-state imaging device 101. More specifically, the second lenses LS2A to LS2D are provided between the microlens LS1 and the color filter CF1 provided on the solid-state imaging device 101.

As illustrated in FIGS. 35 and 36, the second lenses LS2A are each provided so as to cover the respective first subpixels SP1 of the solid-state imaging devices 101 to 104. Similarly, the second lenses LS2B to LS2D are provided so as to cover the second subpixels SP2 to the fourth subpixels SP4 of the solid-state imaging devices 101 to 104, respectively.

The second lenses LS2A to LS2D provided on each of the first subpixel SP1 to the fourth subpixel SP4 may be formed separately from each other or may be an integrally formed lens array.

The second lenses LS2A to LS2D include a material having a higher refractive index than the microlens LS1. As the material configuring the second lenses LS2A to LS2D, for example, a material having a refractive index larger than 1.6 is preferable. As such a material, an inorganic material such as silicon nitride and the like or a metal oxide such as aluminum oxide, tantalum oxide, titanium oxide, and the like, is used.

The second light condensing portion may include a low refractive index layer LL provided between the second lenses LS2A to LS2D and the solid-state imaging devices 101 to 104 together with the second lenses LS2A to LS2D.

The low refractive index layer LL includes a material having a lower refractive index than the microlens LS1 and the second lenses LS2A to LS2D. As a material configuring the low refractive index layer LL, for example, a material having a refractive index of 1.2 or more and 1.3 or less is preferable, and a metal oxide or the like is used.

As described above, the solid-state imaging device 1001 according to the seventh embodiment to which the present technology is applied includes the microlens LS1 that covers the entirety of the unit pixel (solid-state imaging devices 101 to 104) and the plurality of second lenses LS2A to LS2D that covers each of the first subpixel SP1 to the fourth subpixel SP4.

In the solid-state imaging device 1001, at the time of the AF operation of obtaining the auto focus (AF) signal, the light condensed by the microlens LS1, which is the common light condensing means, is incident on each subpixel, such that different image information with an image deviation between the subpixels can be obtained. Furthermore, in the solid-state imaging device 1001, it is possible to prevent light from being condensed in the second pixel separation region DTI2 arranged between the first subpixel SP1 and the fourth subpixel SP4, by the second lenses LS2A to LS2D.

In the solid-state imaging device 1001, crosstalk due to light irradiation to the second pixel separation region DTI2 is reduced even though the pixels are miniaturized. In the solid-state imaging device 1001, at the time of the AF operation, a phase difference signal having a high separation ratio is obtained, such that detection sensitivity of the image deviation can be improved, and at the time of the HDR operation, the signal non-linearity after the HDR signal synthesis or resolution reduction due to the fixed pattern noise is suppressed, such that a high-quality reproduced image can be obtained.

According to the solid-state imaging device 1001 according to the seventh embodiment of the present technology, it is possible to achieve both of the dynamic operation and the auto focus operation in the pixel configuration in which the plurality of unit pixels includes the two or more subpixels SPs (first subpixel SP1 to fourth subpixel SP4).

Note that a case where the solid-state imaging device 1001 includes the solid-state imaging devices 100 (101 to 104) similar to those of the first embodiment has been described in the seventh embodiment, but the present technology is not limited thereto. That is, the solid-state imaging device 1001 may include the solid-state imaging device 101 (see FIG. 6) according to the second embodiment, the solid-state imaging device 102 (see FIG. 7) according to the third embodiment, or the solid-state imaging devices 100 according to the fourth to sixth embodiments, instead of the solid-state imaging device 100.

9. Eighth Embodiment (Example 8 of Solid-State Imaging Device)

A solid-state imaging device according to an eighth embodiment of the present technology is a solid-state imaging device including a first pixel separation region that separates a plurality of unit pixels including two or more subpixels, a second pixel separation region that separates each of the plurality of unit pixels separated by the first pixel separation region, a first light condensing portion that covers the entirety of the unit pixel, a plurality of second light condensing portions that covers each of the subpixels, color filters that each cover the unit pixels, and a light shielding layer that is provided so as to surround the color filters in plan view.

According to the solid-state imaging device according to the eighth embodiment of the present technology, it is possible to achieve both of a dynamic operation and an auto focus operation with higher accuracy in a pixel configuration in which the plurality of unit pixels includes the two or more subpixels.

Hereinafter, a solid-state imaging device 1002, which is an example of the solid-state imaging device according to the eighth embodiment of the present technology, will be described in detail with reference to FIGS. 38 to 41.

Figure 38:
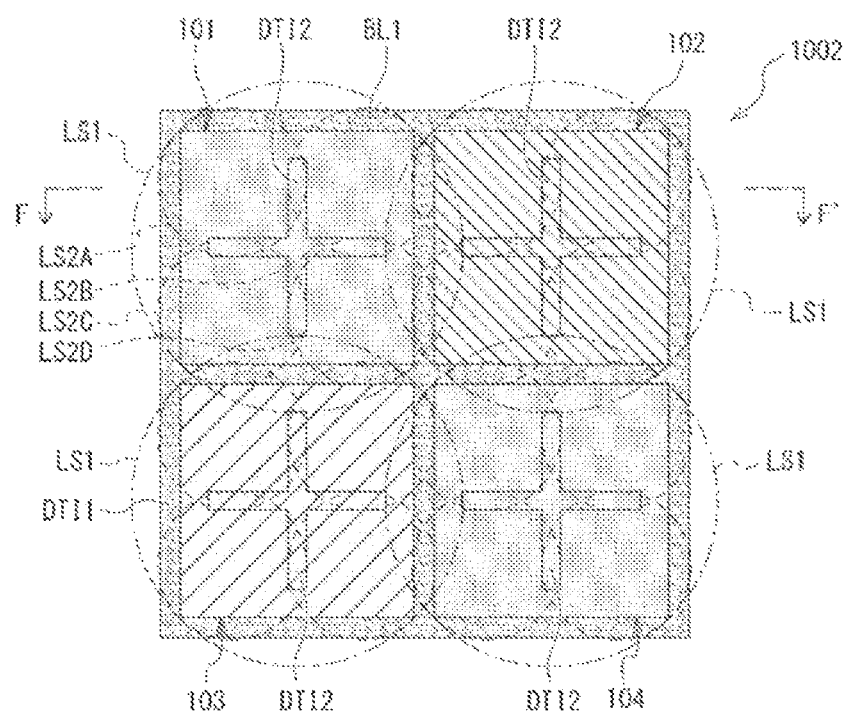
FIG. 38 is a plan view illustrating a layout of a solid-state imaging device according to an eighth embodiment to which the present technology is applied.

FIG. 38 illustrates a layout of a solid-state imaging device 1002, which is an example of the solid-state imaging device according to the eighth embodiment of the present technology. FIG. 38 is a plan view of the solid-state imaging device 1002 including four pixels. Note that in the solid-state imaging device 1002 of FIG. 38, each portion other than the first and second pixel separation regions DTI1 and DTI2 and the first to fourth subpixels SP1 to SP4 is omitted.

The solid-state imaging device 1002 is different from the solid-state imaging device 1001 according to the seventh embodiment in that it includes a light shielding layer BL1 provided above the first pixel separation region DTI1. In the following description, a description of each portion other than the light shielding layer BL1 will be omitted.

Figure 39:
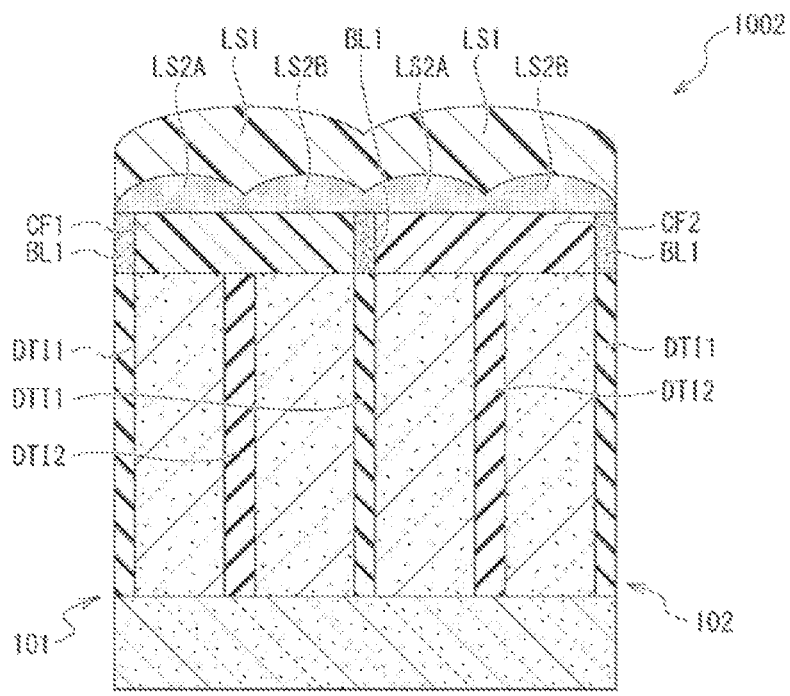
FIG. 39 is a cross-sectional view illustrating a configuration example of an F-F' cross section of the solid-state imaging device according to the eighth embodiment to which the present technology is applied.

FIG. 39 illustrates a configuration of a cross section of the solid-state imaging device 1002 according to the eighth embodiment to which the present technology is applied. FIG. 39 is a cross-sectional view illustrating a configuration example of an F-F' cross section of the solid-state imaging device 1002 (solid-state imaging devices 101 and 102) illustrated in FIG. 38. Note that unless otherwise specified, "up" means an upward direction in FIG. 39, and "down" means a downward direction in FIG. 39.

As illustrated in FIGS. 38 and 39, the light shielding layer BL1 is provided above the first pixel separation region DTI1, and is provided so as to surround each of color filters CF1 to CF4 provided on the solid-state imaging device 100 in plan view.

The light shielding layer BL1 is only required to be provided so as to partition color filters of different colors. That is, the light shielding layer BL1 may not be necessarily provided above the first pixel separation region DTI1 in a case where a color filter of the same color is provided on an adjacent solid-state imaging device 100.

The light shielding layer BL1 is only required to include a material that shields light incident through the microlens LS1, and is a metal layer including a metal such as tungsten (W), titanium (Ti) or the like, for example.

As described above, the solid-state imaging device 1002 according to the eighth embodiment to which the present technology is applied includes the light shielding layer BL1 provided so as to surround each of the color filters CF1 to CF4 provided on the solid-state imaging device 100 in plan view. Furthermore, the solid-state imaging device 1002 includes the microlens LS1 that covers the entirety of each of the solid-state imaging devices 100 (101 to 104), which are the unit pixels, and the plurality of second lenses LS2A to LS2D that covers each of the first subpixel SP1 to the fourth subpixel SP4.

For this reason, according to the solid-state imaging device 1002 according to the eighth embodiment of the present technology, it is possible to achieve both of the dynamic operation and the auto focus operation in the pixel configuration in which the plurality of unit pixels includes the two or more subpixels SPs (first subpixel SP1 to fourth subpixel SP4).

Furthermore, according to the solid-state imaging device 1002 according to the eighth embodiment of the present technology, light incident on the color filters CF1 to CF4 is prevented from being incident on other adjacent color filters by the light shielding layer BL1. Furthermore, in the solid-state imaging device 1002, it is possible to prevent the light condensed by the microlens LS1 provided for every unit pixel from being irradiated to the light shielding layer BL1. Therefore, in the solid-state imaging device 1002 according to the eighth embodiment of the present technology, crosstalk can be reduced to prevent a decrease in sensitivity in each solid-state imaging device 100 and prevent an increase in optical color mixing.

<Modification>

(1) First Modification

Figure 40:
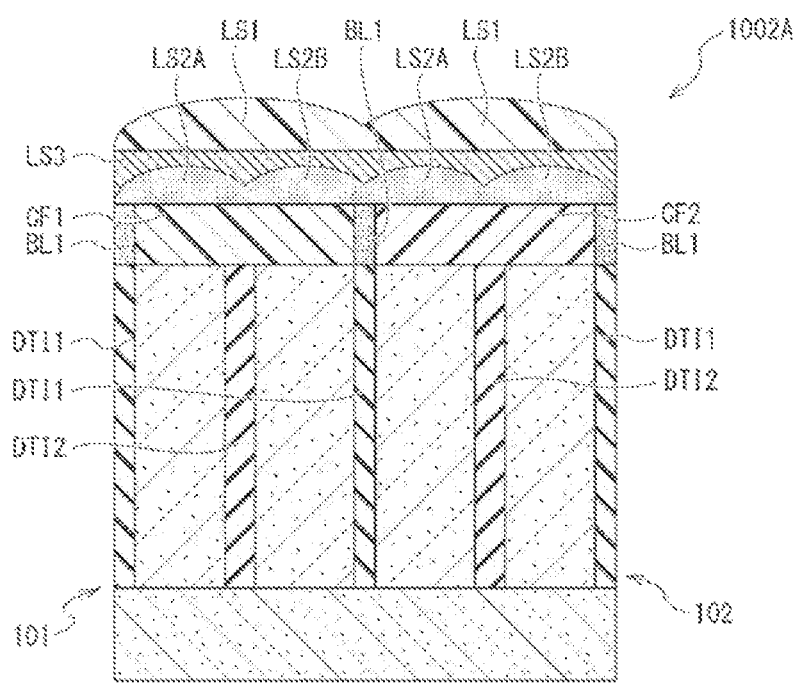
FIG. 40 is a cross-sectional view illustrating a first modification of the solid-state imaging device according to the eighth embodiment to which the present technology is applied.

FIG. 40 illustrates an example of a cross-sectional view of a solid-state imaging device 1002A, which is a first modification of the solid-state imaging device 1002 according to the eighth embodiment to which the present technology is applied.

The solid-state imaging device 1002A includes a first pixel separation region DTI1 that separates a plurality of unit pixels including two or more subpixels SPs (first subpixel SP1 to fourth subpixel SP4) and a second pixel separation region DTI2 that separates each of the plurality of unit pixels separated by the first pixel separation region DTI1. Furthermore, the solid-state imaging device 1001 is a solid-state imaging device including a microlens LS1, which is a first light condensing portion that covers the entirety of a unit pixel, second lenses LS2A to LS2D, which are a plurality of second light condensing portions that covers each of subpixels of a solid-state imaging device 100, an intermediate lens layer LS3 that is provided between the microlens LS1 and the second lenses LS2A to LS2D, and a light shielding layer BL1 that is provided so as to surround a color filter in plan view.

The solid-state imaging device 1002A is different from the solid-state imaging device 1002 in that it includes the intermediate lens layer LS3. Hereinafter, the intermediate lens layer LS3 will be described.

The intermediate lens layer LS3 includes a material having a higher refractive index than the microlens LS1 and a lower refractive index than the second lenses LS2A to LS2D. Examples of the material configuring the intermediate lens layer LS3 include a metal oxide.

In a case where the microlens LS1 includes an organic material (refractive index of 1.5 or more and 1.6 or less) and the second lenses LS2A to LS2D include titanium oxide (refractive index of about 2.5), the intermediate lens layer LS3 includes, for example, aluminum oxide (refractive index of about 1.7) or tantalum oxide (refractive index of about 2.1).

Note that the intermediate lens layer LS3 is not limited to having one-layer structure, and may have a multi-layer structure. In a case where the intermediate lens layer LS3 has the multi-layer structure, materials of each layer are selected so that a refractive index gradually increases from the microlens LS1 toward the second lenses LS2A to LS2D.

As described above, in the solid-state imaging device 1002A according to the first modification, by providing the intermediate lens layers LS3A to LS3D, it is possible to decrease differences in refractive index between the microlens LS1 and the intermediate lens layers LS3A to LS3D and between the intermediate lens layers LS3A to LS3D and the second lenses LS2A to LS2D. For this reason, the light incident from the microlens LS1 is hardly reflected at a boundary of each lens, such that an amount of light incident on the first subpixel SP1 to the fourth subpixel SP4 is hardly reduced, and it is thus possible to prevent a decrease in sensitivity.

(2) Second Modification

Figure 41:
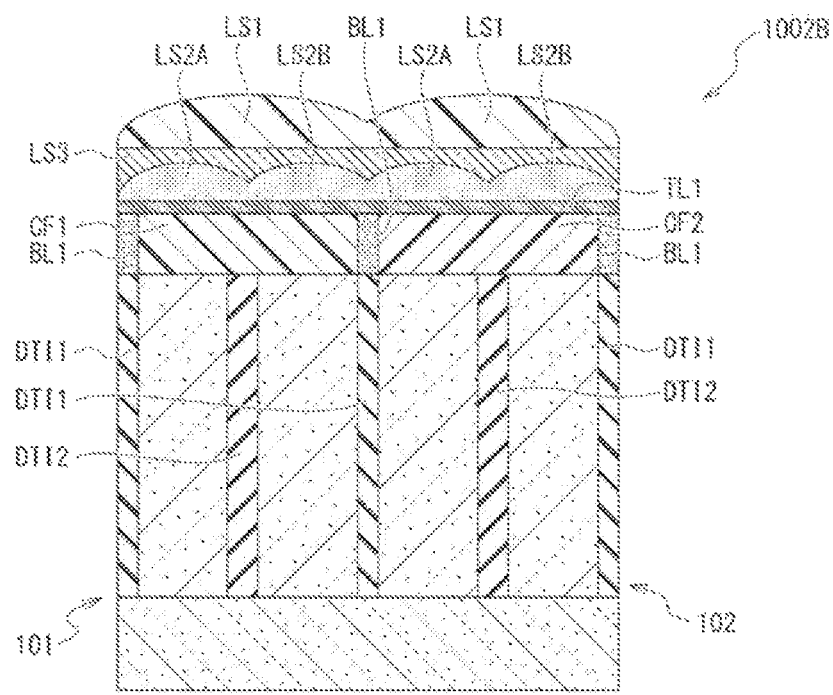
FIG. 41 is a cross-sectional view illustrating a second modification of the solid-state imaging device according to the eighth embodiment to which the present technology is applied.

FIG. 41 illustrates an example of a cross-sectional view of a solid-state imaging device 1002B, which is a second modification of the solid-state imaging device 1002 according to the eighth embodiment to which the present technology is applied.

The solid-state imaging device 1002B includes a first pixel separation region DTI1 that separates a plurality of unit pixels including two or more subpixels SPs (first subpixel SP1 to fourth subpixel SP4) and a second pixel separation region DTI2 that separates each of the plurality of unit pixels separated by the first pixel separation region DTI1. Furthermore, the solid-state imaging device 1001 is a solid-state imaging device including a microlens LS1, which is a first light condensing portion that covers the entirety of a unit pixel, second lenses LS2A to LS2D, which are a plurality of second light condensing portions that covers each of subpixels of a solid-state imaging device 100, intermediate lens layers LS3A to LS3D that are provided between the microlens LS1 and the second lenses LS2A to LS2D, a light transmitting layer TL1 that is provided on surfaces of the second lenses LS2A to LS2D opposite to the intermediate lens layers LS3A to LS3D, and a light shielding layer BL1 that is provided so as to surround a color filter in plan view.

The solid-state imaging device 1002B is different from the solid-state imaging device 1002 according to the first modification in that it includes the intermediate lens layers LS3A to LS3D and the light transmitting layer TL1. The intermediate lens layers LS3A to LS3D have a configuration similar to that of the intermediate lens layers LS3A to LS3D of the solid-state imaging device 1002A according to the first modification, and a description thereof will thus be omitted.

Hereinafter, the light transmitting layer TL1 will be described. The light transmitting layer TL1 includes a material having a higher refractive index than the microlens LS1 and a lower refractive index than the second lenses LS2A to LS2D. The light transmitting layer TL1 may include the same material as the intermediate lens layers LS3A to LS3D or another material having the same refractive index as the intermediate lens layers LS3A to LS3D. Examples of the material configuring the light transmitting layer TL1 include a metal oxide.

Note that the light transmitting layer TL1 is not limited to having one-layer structure, and may have a multi-layer structure. In a case where the light transmitting layer TL1 has the multi-layer structure, materials of each layer are selected so that a refractive index gradually decreases from the second lenses LS2A to LS2D to the low refractive index layer LL (color filters CF1 to CF4 in a case where the low refractive index layer LL is not provided).

Furthermore, the light transmitting layer TL1 may be provided instead of the low refractive index layer LL of the solid-state imaging device 1002 or may be provided together with the low refractive index layers LL. In a case where the light transmitting layer TL1 is provided together with the low refractive index layer LL, the light transmitting layer TL1 is provided between the second lenses LS2A to LS2D and the low refractive index layer LL, and materials are selected so that a refractive index gradually decreases from the second lenses LS2A to LS2D toward the low refractive index layer LL.

As described above, in the solid-state imaging device 1002B of the second modification, by providing the light transmitting layer TL1, it is possible to decrease differences in refractive index between the second lenses LS2A to LS2D and the light transmitting layer TL1 and between the light transmitting layer TL1 and the first subpixel SP1 to the fourth subpixel SP4. For this reason, the light incident from the microlens LS1 is hardly reflected at a boundary of each lens, such that an amount of light incident on the first subpixel SP1 to the fourth subpixel SP4 is hardly reduced, and it is thus possible to prevent a decrease in sensitivity.

10. Ninth Embodiment (Example 9 of Solid-State Imaging Device)

A solid-state imaging device according to a ninth embodiment of the present technology is a solid-state imaging device including a first pixel separation region that separates a plurality of unit pixels including two or more subpixels, a second pixel separation region that separates each of the plurality of unit pixels separated by the first pixel separation region, a first light condensing portion that covers the entirety of the unit pixel, and a plurality of second light condensing portions that covers each of the subpixels. In the solid-state imaging device according to the ninth embodiment, the second light condensing portion includes a light shielding layer that is provided above the first pixel separation region and the second pixel separation region and a light transmitting layer that is above the subpixel, is provided in a region surrounded by the light shielding layer, and includes a material having a higher refractive index than the light shielding layer.

According to the solid-state imaging device according to the ninth embodiment of the present technology, it is possible to achieve both of a dynamic operation and an auto focus operation with higher accuracy in a pixel configuration in which the plurality of unit pixels includes the two or more subpixels.

Hereinafter, a solid-state imaging device 1003, which is an example of the solid-state imaging device according to the ninth embodiment of the present technology, will be described in detail with reference to FIGS. 42 to 46.

Figure 42:
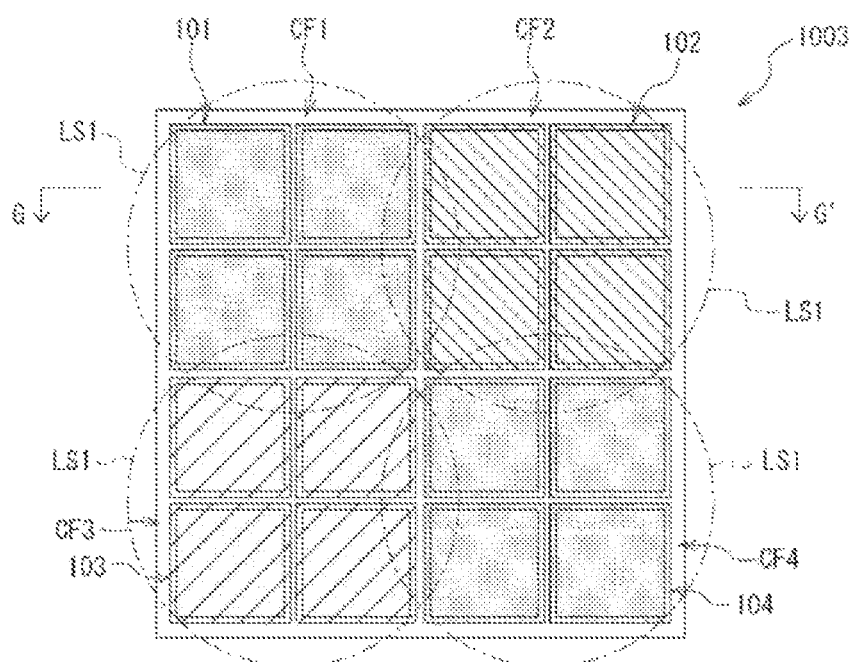
FIG. 42 is a plan view illustrating a layout of a solid-state imaging device according to a ninth embodiment to which the present technology is applied.

FIG. 42 illustrates a layout of a solid-state imaging device 1003, which is an example of the solid-state imaging device according to the ninth embodiment of the present technology. FIG. 42 is a plan view of the solid-state imaging device 1003 including four pixels. Note that in the solid-state imaging device 1003 of FIG. 42, a detailed structure in a first subpixel SP1 to a fourth subpixel SP4 is omitted.

The solid-state imaging device 1003 is different from the solid-state imaging device 1001 according to the seventh embodiment in that a second light condensing portion has a configuration different from that of the second lenses LS2A to LS2D. In the following description, a description of each portion other than the second light condensing portion will be omitted.

Figure 43:
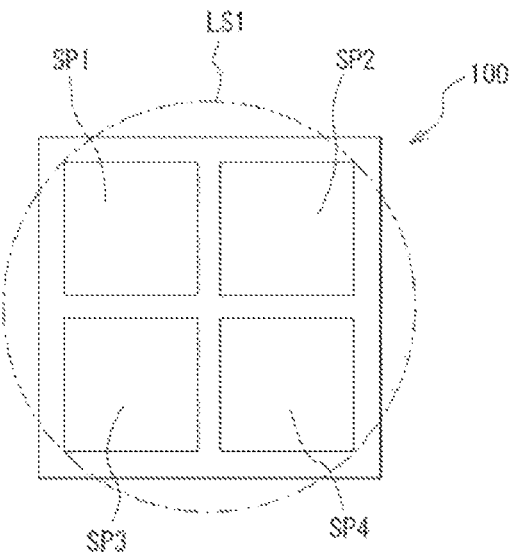
FIG. 43 is a plan view illustrating a layout of the solid-state imaging device according to the ninth embodiment to which the present technology is applied.

FIG. 43 illustrates a planar configuration of the second light condensing portion in a case where a microlens LS1 and a color filter CF1 are not illustrated in a plan view of a solid-state imaging device 100 included in the solid-state imaging device 1003 according to the ninth embodiment to which the present technology is applied.

Figure 44:
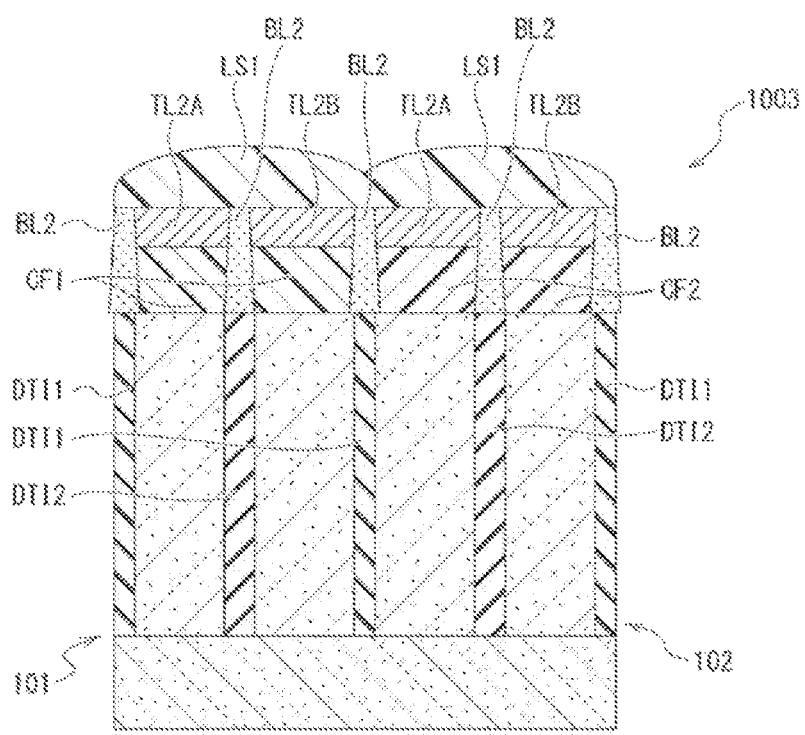
FIG. 44 is a cross-sectional view illustrating a configuration example of a G-G' cross section of the solid-state imaging device according to the ninth embodiment to which the present technology is applied.

FIG. 44 illustrates a configuration of a cross section of the solid-state imaging device 1003 according to the ninth embodiment to which the present technology is applied. FIG. 44 is a cross-sectional view illustrating a configuration example of a G-G' cross section of the solid-state imaging device 1003 (solid-state imaging devices 101 and 102) illustrated in FIG. 42. Note that unless otherwise specified, "up" means an upward direction in FIG. 44, and "down" means a downward direction in FIG. 44.

As illustrated in FIGS. 43 and 44, the second light condensing portion includes at least a light shielding layer BL2 provided above the first pixel separation region DTI1 and the second pixel separation region DTI2. Furthermore, the second light condensing portion includes a light transmitting layer TL2 (TL2A to TL2D) that is above the first subpixel SP1 to the fourth subpixel SP4 and is provided in a region surrounded by the light shielding layer BL2.

As illustrated in FIG. 44, a cross-sectional shape of the light shielding layer BL2 (cross-sectional shape in a direction orthogonal to an extending direction of the light shielding layer BL2 (cross-sectional shape illustrated in FIG. 44)) is preferably a shape in which a width gradually decreases toward the microlens LS1. For example, the cross-sectional shape of the light shielding layer BL2 is preferably a tapered shape or a triangular shape. Therefore, cross sections of the light transmitting layers TL2A to TL2D that become waveguides of light incident from the microlens LS1 are formed in an inverted tapered shape, such that the incident light can be easily taken in the first subpixel SP1 to the fourth subpixel SP4.

Furthermore, it is preferable that the light shielding layer BL2 is formed thicker than the color filters CF1 to CF4 and an upper portion of the light shielding layer BL2 is provided so as to protrude beyond upper surfaces (surfaces facing the light transmitting layers TL2A to TL2D) of the color filters CF1 to CF4 toward the microlens LS1. Therefore, each of the light transmitting layers TL2A to TL2D provided on the upper surfaces of the color filters CF1 to CF4 can be separated by the light shielding layer BL2.

The light shielding layer BL2 includes a material having a lower refractive index than the light transmitting layers TL2A to TL2D. Therefore, the light shielding layer BL2 functions as a light shielding layer to reflect the light condensed by the microlens LS1 to the light transmitting layers TL2A to TL2D and guide the light to each of the first subpixel SP1 to the fourth subpixel SP4. Furthermore, the light shielding layer BL2 prevents the light incident on the color filters CF1 to CF4 from being incident on other adjacent color filters.

The light shielding layer BL2 preferably includes, for example, a material having a refractive index of 1.3 or less, and the lower the refractive index, the more preferable. As such a material, a metal oxide or the like is used.

The light transmitting layers TL2A to TL2D are provided on the color filters CF1 to CF4, respectively, and are provided so as to cover the first subpixel SP1 to the fourth subpixel SP4 of the solid-state imaging device 100, respectively. Cross sections of the light transmitting layers TL2A to TL2D are preferably formed in an inverted tapered shape. Therefore, an area of a light incident surface (upper surfaces of the light transmitting layers TL2A to TL2D) is larger than that of a light emitting surface (bottom surfaces of the light transmitting layers TL2A to TL2D) from which the light is emitted to the color filters CF1 to CF4. For this reason, the incident light can be easily taken in the first subpixel SP1 to the fourth subpixel SP4.

Note that the light transmitting layers TL2A to TL2D may be provided between the color filters CF1 to CF4 and the solid-state imaging element 100 (101 to 104). The light transmitting layers TL2A to TL2D are only required to include a material having the same refractive index as the microlens LS1 or a higher refractive index than the microlens LS1. As such a material, for example, an organic material such as an acrylic resin material and the like, an inorganic material such as silicon nitride and the like, or a metal oxide such as aluminum oxide, tantalum oxide, titanium oxide, and the like, is used.

As described above, the solid-state imaging device 1003 according to the ninth embodiment to which the present technology is applied includes the light shielding layer BL2 provided above the first pixel separation region DTI1 and the second pixel separation region DTI2 as the second light condensing portion. Furthermore, the solid-state imaging device 1003 includes the light transmitting layers TL2A to TL2D that are above the first subpixel SP1 to the fourth subpixel SP4, are provided in the region surrounded by the light shielding layer BL2, and include a material having a higher refractive index than the light shielding layer BL2.

For this reason, according to the solid-state imaging device 1003 according to the ninth embodiment of the present technology, it is possible to achieve both of the dynamic operation and the auto focus operation in the pixel configuration in which the plurality of unit pixels includes the two or more subpixels SPs (first subpixel SP1 to fourth subpixel SP4).

Furthermore, according to the solid-state imaging device 1003 according to the ninth embodiment of the present technology, light incident on the color filters CF1 to CF4 is prevented from being incident on other adjacent color filters by the light shielding layer BL2. Furthermore, in the solid-state imaging device 1003, it is possible to prevent the light condensed by the microlens LS1 provided for every unit pixel from being irradiated to the first pixel separation region DTI1 and the second pixel separation region DTI2. Therefore, in the solid-state imaging device 1003 according to the ninth embodiment of the present technology, crosstalk can be reduced to prevent a decrease in sensitivity in each solid-state imaging device 100 and prevent an increase in optical color mixing.

<Modification>

(1) First Modification

Figure 45:
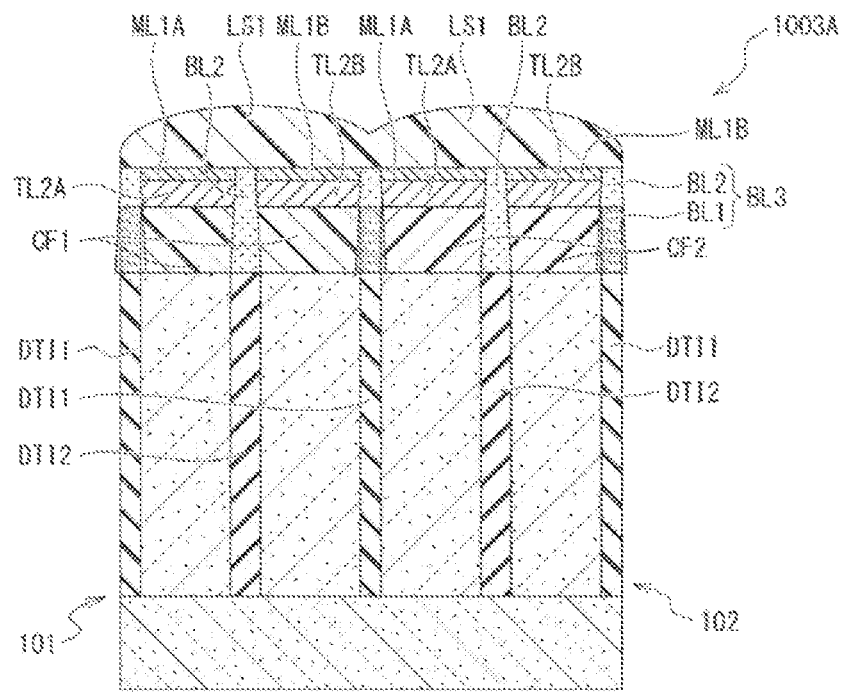
FIG. 45 is a cross-sectional view illustrating a first modification of the solid-state imaging device according to the ninth embodiment to which the present technology is applied.

FIG. 45 illustrates an example of a cross-sectional view of a solid-state imaging device 1003A, which is a first modification of the solid-state imaging device 1003 according to the ninth embodiment to which the present technology is applied.

The solid-state imaging device 1003A is a solid-state imaging device including a first pixel separation region that separates a plurality of unit pixels including two or more subpixels, a second pixel separation region that separates each of the plurality of unit pixels separated by the first pixel separation region, a first light condensing portion that covers the entirety of the unit pixel, and a plurality of second light condensing portions that covers each of the subpixels. In the solid-state imaging device according to the ninth embodiment, the second light condensing portion includes a light shielding layer that is provided above the first pixel separation region and the second pixel separation region, a light transmitting layer that is above the subpixel, is provided in a region surrounded by the light shielding layer, and includes a material having a higher refractive index than the light shielding layer, and a first intermediate layer that is provided between the first light condensing portion and the light transmitting layer.

The solid-state imaging device 1003A is different from the solid-state imaging device 1003 in that it includes a light shielding layer BL3 provided above the first pixel separation region DTI1, a light shielding layer BL2 provided above the second pixel separation region DTI2, and first intermediate layers ML1A to ML1D (ML1C and ML1D are not illustrated).

In the solid-state imaging device 1003A, the light shielding layer BL2 is provided above the second pixel separation region DTI2.

In the solid-state imaging device 1003A, the light shielding layer BL3 in which a light shielding layer BL1 and a light shielding layer BL2 are integrally formed is provided above the first pixel separation region DTI1. The light shielding layer BL3 is integrally formed, for example, in a state where the light shielding layer BL2 covers at least one of a side surface or an upper surface of the light shielding layer BL1.

The light shielding layer BL1 has a configuration similar to that of the light shielding layer BL1 in the solid-state imaging device 1002 according to the eighth embodiment. The light shielding layer BL1 is only required to include a material that shields light incident through the microlens LS1, and is a metal layer including a metal such as tungsten (W), titanium (Ti) or the like, for example.

The light shielding layer BL2 has a configuration similar to that of the light shielding layer BL2 in the solid-state imaging device 1003 according to the ninth embodiment. The light shielding layer BL2 is formed thicker than the color filters CF1 to CF4 and an upper portion of the light shielding layer BL2 is provided so as to protrude beyond upper surfaces (surfaces facing the light transmitting layers TL2A to TL2D) of the color filters CF1 to CF4 toward the microlens LS1.

Hereinafter, the first intermediate layers ML1A to ML1D will be described. The first intermediate layers ML1A to ML1D are provided on the light transmitting layers TL2A to TL2D. That is, the first intermediate layers ML1A to ML1D are provided above the first subpixel SP1 to the fourth subpixel SP4.

The first intermediate layers ML1A to ML1D include a material having a higher refractive index than the microlens LS1 and a lower refractive index than the second lenses LS2A to LS2D. Examples of the material configuring the first intermediate layers ML1A to ML1D include a metal oxide.

In a case where the microlens LS1 includes an organic material (refractive index of 1.5 or more and 1.6 or less) and the second lenses LS2A to LS2D include titanium oxide (refractive index of about 2.5) or tantalum oxide (refractive index of about 2.1), the first intermediate layers ML1A to ML1D include, for example, aluminum oxide (refractive index of about 1.7).

Note that the first intermediate layers ML1A to ML1D are not limited to having one-layer structure, and may have a multi-layer structure. In a case where the first intermediate layers ML1A to ML1D have the multi-layer structure, materials of each layer are selected so that a refractive index gradually increases from the microlens LS1 toward the light transmitting layers TL2A to TL2D.

As described above, in the solid-state imaging device 1003A according to the first modification, by providing the first intermediate layers ML1A to ML1D, it is possible to decrease differences in refractive index between the microlens LS1 and the first intermediate layers ML1A to ML1D and between the first intermediate layers ML1A to ML1D and the light transmitting layers TL2A to TL2D. For this reason, the light incident from the microlens LS1 is hardly reflected at a boundary of each layer, such that an amount of light incident on the first subpixel SP1 to the fourth subpixel SP4 is hardly reduced, and it is thus possible to prevent a decrease in sensitivity.

(2) Second Modification

Figure 46:
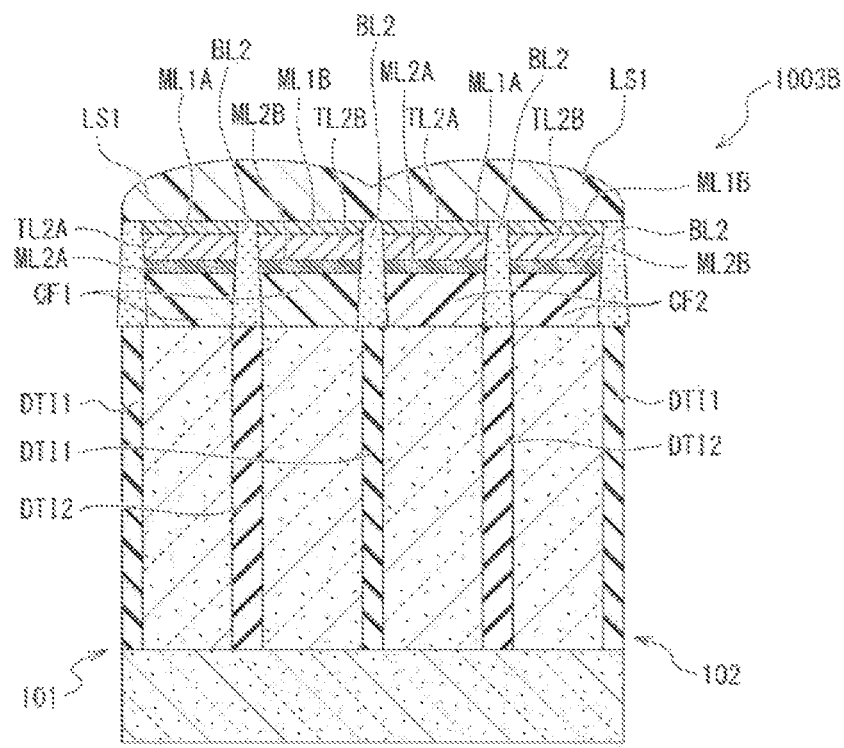
FIG. 46 is a cross-sectional view illustrating a second modification of the solid-state imaging device according to the ninth embodiment to which the present technology is applied.

FIG. 46 illustrates an example of a cross-sectional view of a solid-state imaging device 10038, which is a second modification of the solid-state imaging device 1003 according to the ninth embodiment to which the present technology is applied.

The solid-state imaging device 1003B is a solid-state imaging device including a first pixel separation region that separates a plurality of unit pixels including two or more subpixels, a second pixel separation region that separates each of the plurality of unit pixels separated by the first pixel separation region, a first light condensing portion that covers the entirety of the unit pixel, and a plurality of second light condensing portions that covers each of the subpixels. In the solid-state imaging device according to the ninth embodiment, the second light condensing portion includes a light shielding layer that is provided above the first pixel separation region and the second pixel separation region, a light transmitting layer that is above the subpixel, is provided in a region surrounded by the light shielding layer, and includes a material having a higher refractive index than the light shielding layer, a first intermediate layer that is provided between the first light condensing portion and the light transmitting layer, and a second intermediate layer provided between the light transmitting layer and the color filter.

The solid-state imaging device 1003B is different from the solid-state imaging device 1003A according to the first modification in that second intermediate layers ML2A to ML2D are provided on lower surfaces of the light transmitting layers TL2A to TL2D.

Hereinafter, the second intermediate layers ML2A to ML2D will be described.

The second intermediate layers ML2A to ML2D are provided on the lower surfaces of the light transmitting layers TL2A to TL2D. That is, the second intermediate layers ML2A to ML2D are provided above the first subpixel SP1 to the fourth subpixel SP4.

The second intermediate layers ML2A to ML2D include a material similar to that of the first intermediate layers ML1A to ML1D.

Note that the second intermediate layers ML2A to ML2D are not limited to having one-layer structure, and may have a multi-layer structure. In a case where the second intermediate layers ML2A to ML2D have the multi-layer structure, materials of each layer are selected so that a refractive index gradually decreases from the light transmitting layers TL2A to TL2D toward the color filters CF1 to CF4.

As described above, in the solid-state imaging device 10038 according to the second modification, by providing the second intermediate layers ML2A to ML2D, it is possible to decrease differences in refractive index between the light transmitting layers TL2A to TL2D and the second intermediate layers ML2A to ML2D and between the second intermediate layers ML2A to ML2D and the color filters CF1 to CF4. For this reason, the light incident from the microlens LS1 is hardly reflected at a boundary of each layer, such that an amount of light incident on the first subpixel SP1 to the fourth subpixel SP4 is hardly reduced, and it is thus possible to prevent a decrease in sensitivity.

11. Tenth Embodiment (Example 10 of Solid-State Imaging Device)

A solid-state imaging device according to a tenth embodiment of the present technology is a solid-state imaging device having a configuration in which the second pixel separation region or both of the first pixel separation region and the second pixel separation region do not penetrate from a light receiving surface receiving light to a silicon substrate S in the solid-state imaging device according to the first to ninth embodiments of the present technology.

Figure 47:
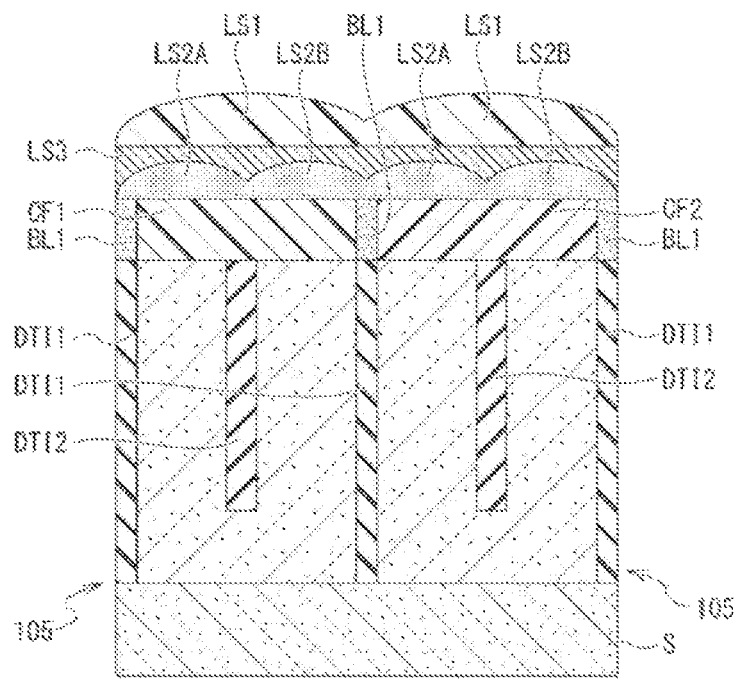
FIG. 47 is a cross-sectional view illustrating a configuration example of a cross section of a solid-state imaging device according to a tenth embodiment to which the present technology is applied.
Figure 48:
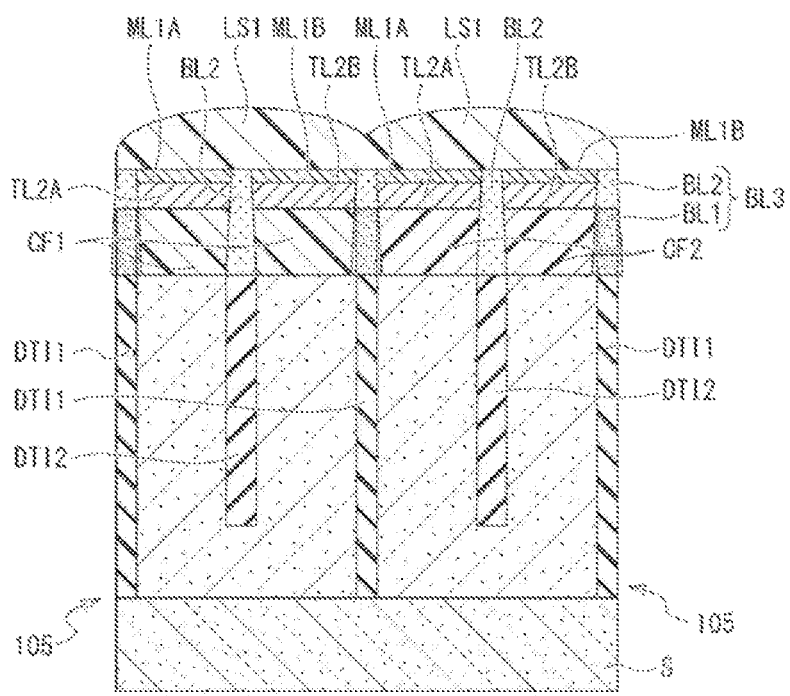
FIG. 48 is a cross-sectional view illustrating a configuration example of a cross section of a solid-state imaging device according to the tenth embodiment to which the present technology is applied.

FIGS. 47 and 48 illustrate a cross-sectional view of a solid-state imaging device 105 having a configuration in which a second pixel separation region DTI2 does not penetrate from a light receiving surface that receives light to a silicon substrate S on which a photoelectric conversion element (photodiode) in which signal charges are accumulated is formed.

As illustrated in FIG. 47, the solid-state imaging device 105 may be used instead of the solid-state imaging device 100 according to the seventh or eighth embodiment. Furthermore, as illustrated in FIG. 48, the solid-state imaging device 105 may be used instead of the solid-state imaging device 100 according to the ninth embodiment.

A first pixel separation region DTI1 penetrates from the light receiving surface that receives light to the silicon substrate S on which the photoelectric conversion element in which the signal charges are accumulated is formed, and is provided at a boundary portion between pixels (solid-state imaging devices 101 to 104) covered with color filters of different colors. For this reason, in the solid-state imaging element including the first pixel separation region DTI1, it is possible to prevent color mixing between different color signals.

Furthermore, the second pixel separation region DTI2 is provided at a boundary portion between the subpixels SPs (first subpixel SP1 to fourth subpixel SP4) in one pixel covered with a color filter of the same color. For this reason, it is possible to realize an overflow of signal electrons between the subpixels SPs in the same color pixel.

That is, in the configuration illustrated in FIGS. 47 and 48, both of the prevention of the color mixing of the different color signals between the pixels covered with the color filters of the different colors and the realization of the overflow of the signal electrons between the subpixels SPs in the pixel covered with the color filter of the same color can be achieved.

Figure 49:
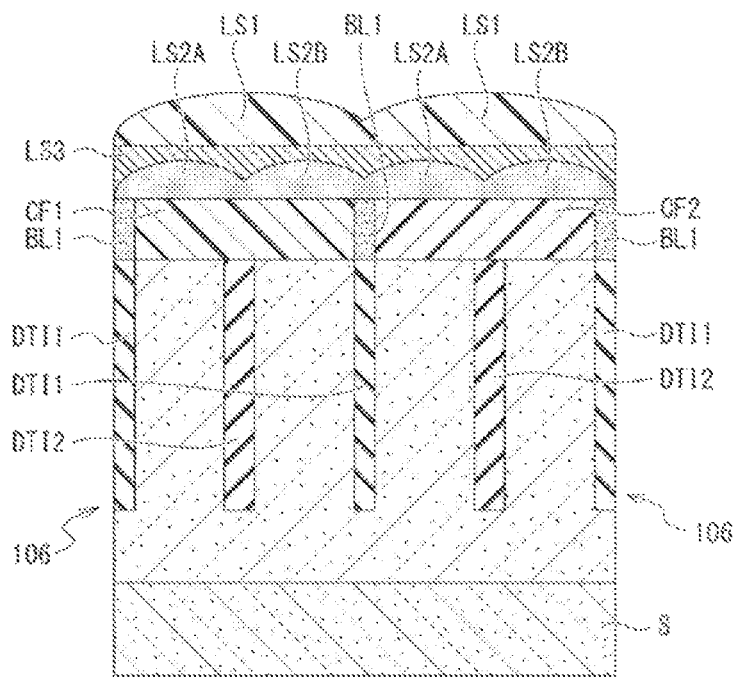
FIG. 49 is a cross-sectional view illustrating a configuration example of a cross section of a solid-state imaging device according to the tenth embodiment to which the present technology is applied.
Figure 50:
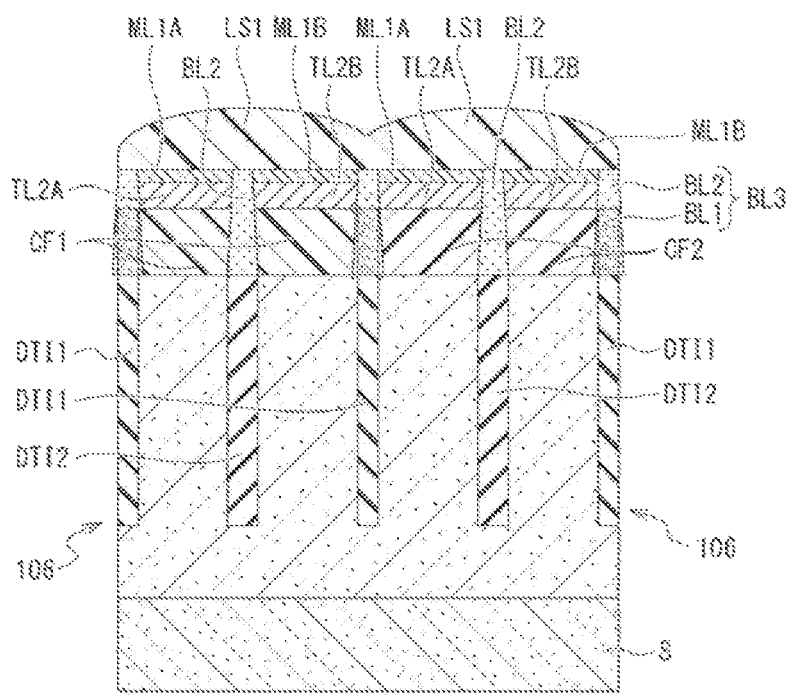
FIG. 50 is a cross-sectional view illustrating a configuration example of a cross section of a solid-state imaging device according to the tenth embodiment to which the present technology is applied.

FIGS. 49 and 50 illustrate a cross-sectional view of a solid-state imaging device 106 having a configuration in which both of a first pixel separation region DTI1 and a second pixel separation region DTI2 do not penetrate from a light receiving surface that receives light to a silicon substrate S on which a photoelectric conversion element (photodiode) in which signal charges are accumulated is formed.

As illustrated in FIG. 49, the solid-state imaging device 106 may be used instead of the solid-state imaging device 100 according to the seventh or eighth embodiment. Furthermore, as illustrated in FIG. 50, the solid-state imaging device 106 may be used instead of the solid-state imaging device 100 according to the ninth embodiment.

In this case, the first pixel separation region DTI1 and the second pixel separation region DTI2 can be formed at the same height, such that a manufacturing cost can be reduced.

12. Eleventh Embodiment (Example 11 of Solid-State Imaging Device)

A solid-state imaging device 1004 according to an eleventh embodiment of the present technology is a solid-state imaging device 107 having a configuration in which a first pixel separation region DTI1 separates a plurality of unit pixels including two or more subpixels SPs (first subpixel SP1 to sixteenth subpixel SP16). The solid-state imaging device 1004 may be used instead of the solid-state imaging device according to the first to ninth embodiments.

Figure 51:
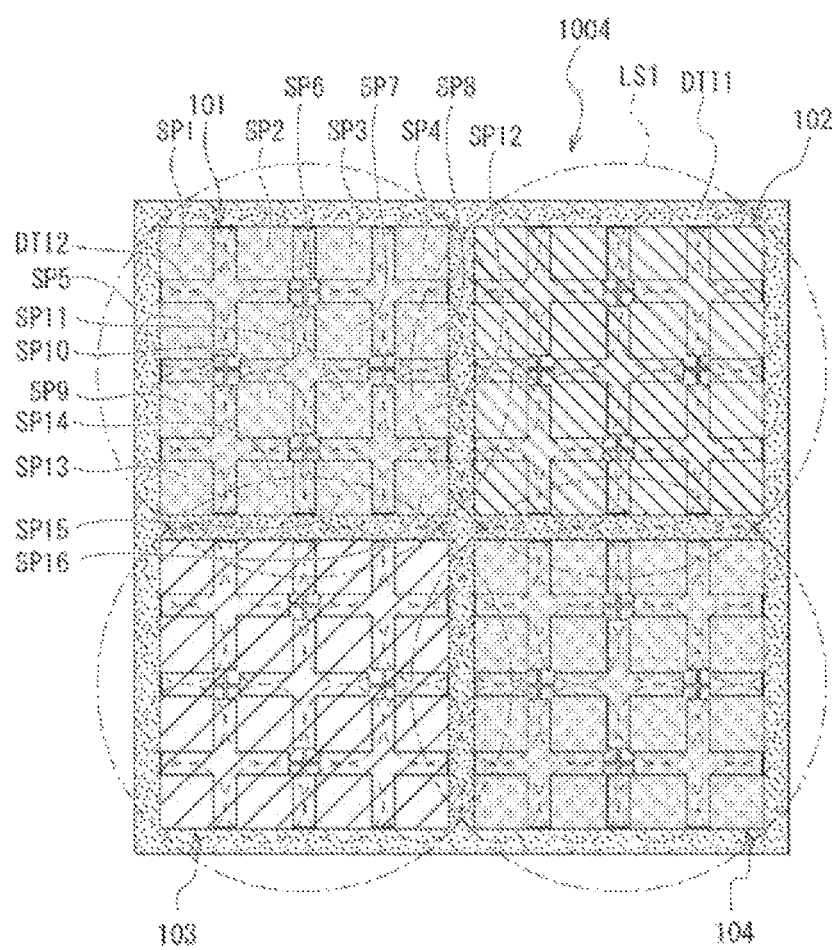
FIG. 51 is a plan view illustrating a layout of a solid-state imaging device according to an eleventh embodiment to which the present technology is applied.

As illustrated in FIG. 51, the solid-state imaging device 107 is provided with a plurality of second pixel separation regions DTI2 having a cross shape, such that one unit pixel is sixteen subpixels (first subpixel SP1 to sixteenth subpixel SP16).

13. Twelfth Embodiment (Example of Electronic Apparatus)

An electronic apparatus according to a twelfth embodiment of the present technology is an electronic apparatus mounted with a solid-state imaging element, in which the solid-state imaging element includes a first pixel separation region that separates a plurality of unit pixels including two or more subpixels, a second pixel separation region that separates each of the plurality of unit pixels separated by the first pixel separation region, and an overflow region that causes signal charges accumulated in the subpixels to overflow to at least one of adjacent subpixels, and the overflow region is formed between a first subpixel and a second subpixel. Furthermore, the electronic apparatus according to the twelfth embodiment of the present technology may be an electronic apparatus mounted with the solid-state imaging device according to the first to eleventh embodiments of the present technology.

Figure 52:
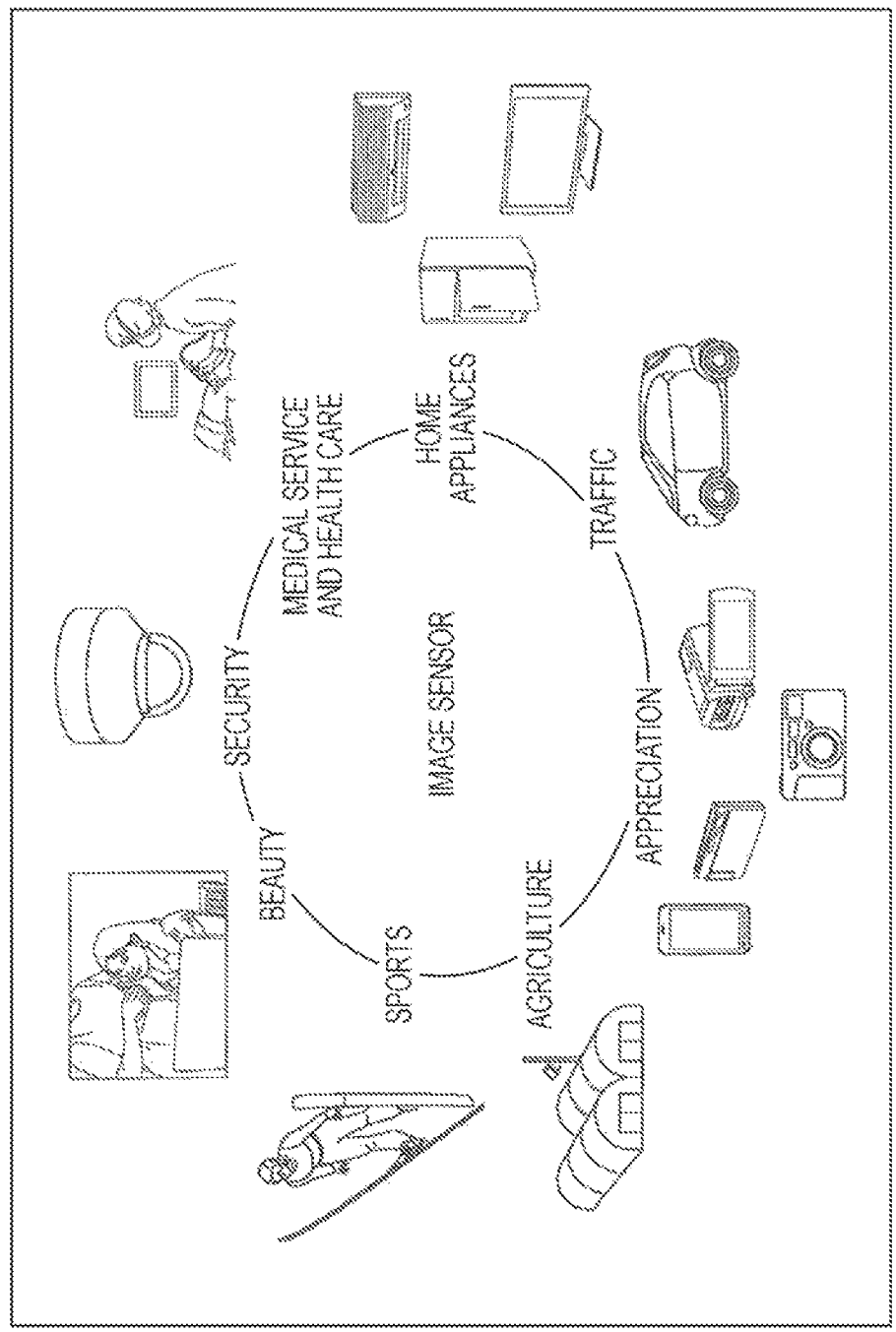
FIG. 52 is a view illustrating a use example of the solid-state imaging device according to the first to eleventh embodiments to which the present technology is applied.

14. Use Example of Solid-State Imaging Device to which Present Technology is Applied FIG. 52 is a view illustrating a use example of the solid-state imaging device according to the first to eleventh embodiments of the present technology as an image sensor.

The solid-state imaging device according to the first to eleventh embodiments described above can be used in, for example, various cases of sensing light such as visible light, infrared light, ultraviolet light, X-rays, and the like as follows. In other words, as illustrated in FIG. 52, the solid-state imaging device according to any one of the first to eleventh embodiments can be used in an apparatus (for example, an electronic apparatus according to the seventh embodiment described above) used in, for example, an appreciation field that captures an image provided for appreciation, a traffic field, a home appliances field, a medical service and health care field, a security field, a beauty field, a sports field, an agriculture field, and the like.

Specifically, in the appreciation field, the solid-state imaging device according to any one of the first to eleventh embodiments can be used in, for example, an apparatus for capturing an image provided for appreciation, such as a digital camera, a smartphone, a mobile phone with a camera function, or the like.

In the traffic field, the solid-state imaging device according to any one of the first to eleventh embodiments can be used in, for example, an apparatus provided for traffic, such as an in-vehicle sensor imaging the front or the rear, the surroundings, the inside, and the like, of a vehicle, a monitoring camera monitoring a traveling vehicle and a road, a distance measurement sensor measuring a distance between vehicles, or the like, for safe driving such as automatic stop or the like, recognition of a driver state, or the like.

In the home appliances field, the solid-state imaging device according to any one of the first to eleventh embodiments can be used in, for example, an apparatus provided for home appliances such as a television receiver, a refrigerator, an air conditioner, or the like, in order to image a user's gesture and perform an apparatus operation depending on the gesture.

In the medical service and health care field, the solid-state imaging device according to any one of the first to eleventh embodiments can be used in, for example, an apparatus provided for medical service and health care, such as an endoscope, an apparatus performing blood vessel imaging by receiving infrared light, or the like.

In the security field, the solid-state imaging device according to any one of the first to eleventh embodiments can be used in, for example, an apparatus provided for security, such as a monitoring camera for crime prevention, a camera for person authentication, or the like.

In the beauty field, the solid-state imaging device according to any one of the first to eleventh embodiments can be used in, for example, an apparatus provided for beauty, such as a skin measuring instrument that images the skin, a microscope that images the scalp, or the like.

In the sports field, the solid-state imaging device according to any one of the first to eleventh embodiments can be used in, for example, an apparatus provided for sports, such as an action camera, a wearable camera for sports, or the like.

In the agriculture field, the solid-state imaging device according to any one of the first to eleventh embodiments can be used in, for example, an apparatus provided for agriculture, such as a camera for monitoring a state of fields or crops, or the like.

Figure 53:
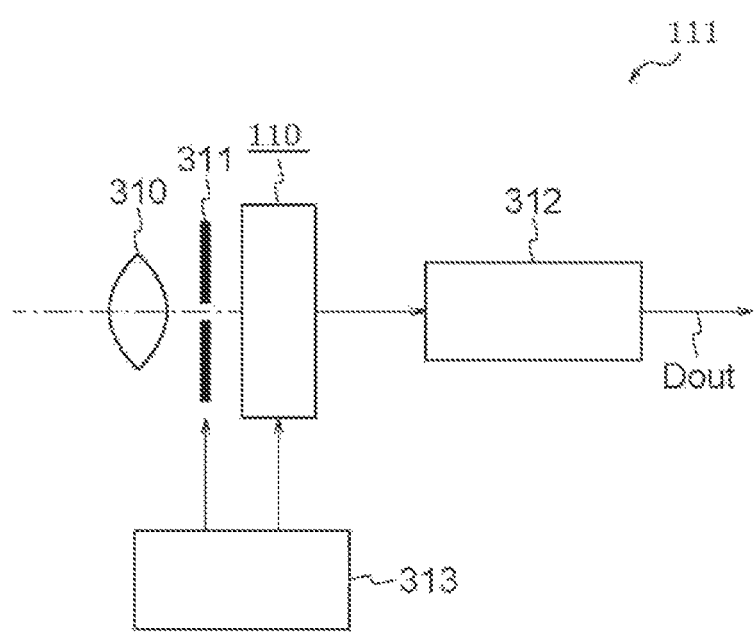
FIG. 53 is a functional block diagram of an example of an electronic apparatus to which the present technology is applied.

Next, a use example of the solid-state imaging device according to the first to eleventh embodiments of the present technology will be specifically described. For example, the solid-state imaging device 110 described above can be applied to all types of electronic apparatuses having an imaging function, such as a camera system such as a digital still camera, a video camera or the like, a mobile phone with an imaging function, or the like. FIG. 53 illustrates a schematic configuration of an electronic apparatus 111 (camera) as an example. The electronic apparatus 111 is, for example, a video camera capable of imaging a still image or a moving image, and includes a solid-state imaging element 110, an optical system (optical lens) 310, a shutter device 311, a drive unit 313 that drives the solid-state imaging element 110 and the shutter device 311, and a signal processing unit 312.

The optical system 310 guides image light (incident light) from a subject to a pixel portion 110a of the solid-state imaging device 110. The optical system 310 may include a plurality of optical lenses. The shutter device 311 controls a light irradiation period and a light blocking period for the solid-state imaging device 110. The drive unit 313 controls a transfer operation of the solid-state imaging device 110 and a shutter operation of the shutter device 311. The signal processing unit 312 performs various signal processing on a signal output from the solid-state imaging element 110. A video signal Dout after the signal processing is stored in a storage medium such as a memory or the like or is output to a monitor or the like.

Note that embodiments of the present technology are not limited to the embodiments described above, and various modifications can be made without departing from the gist of the present technology.

Furthermore, effects described in the present specification are merely examples and are not limited, and other effects may be provided.

Furthermore, the present technology can also have the following configuration.

[1] A solid-state imaging device including:
a first pixel separation region that separates a plurality of unit pixels including two or more subpixels;
a second pixel separation region that separates each of the plurality of unit pixels separated by the first pixel separation region; and
an overflow region that causes signal charges accumulated in the subpixels to overflow to at least one of adjacent subpixels,
in which the overflow region
is formed between a first subpixel and a second subpixel.

[2] The solid-state imaging device according to the above [1], in which a first P-type region is formed in a depth direction inside the first pixel separation region, a second P-type region is formed in the depth direction around the second pixel separation region, and the first pixel separation region, the overflow region, and the second pixel separation region are formed to be included in a cross section in which a region of the unit pixel that is not separated by the second pixel separation region is cut along an incident direction of light, and
the overflow region has at least one of a third P-type region whose impurity concentration is lower than an average impurity concentration of the first P-type region or a fourth P-type region whose impurity concentration is lower than an average impurity concentration of the second P-type region.

[3] The solid-state imaging device according to the above [1] or [2], in which a first P-type region is formed in a depth direction inside the first pixel separation region, a second P-type region is formed in the depth direction around the second pixel separation region, an N-type region is formed between the first P-type region and the second P-type region, and the first pixel separation region, the overflow region, and the second pixel separation region are formed to be included in a cross section in which a region of the unit pixel that is not separated by the second pixel separation region is cut along an incident direction of light, and
the overflow region has at least one of a third P-type region whose impurity concentration is lower than an average impurity concentration of the first P-type region, a fourth P-type region whose impurity concentration is lower than an average impurity concentration of the second P-type region, or a fifth N-type region formed between the third P-type region and the fourth P-type region.

[4] The solid-state imaging device according to any one of the above [1] to [3], in which a first P-type region is formed in a depth direction inside the first pixel separation region, and the overflow region is formed to be included between one inner side of the first pixel separation region and another inner side of the first pixel separation region facing the one inner side in a cross section in which a region of the unit pixel that is not separated by the second pixel separation region is cut along an incident direction of light, and
a depth of the overflow region
is formed between a region in which a transistor controlling the overflow is arranged and a region in which an impurity concentration is the highest in an N-type region in which the signal charges are accumulated.

[5] The solid-state imaging device according to any one of the above [1] to [4], in which the second pixel separation region separates each of the plurality of unit pixels into the subpixels of 2×2.

[6] The solid-state imaging device according to any one of the above [1] to [5], in which the second pixel separation region
has a cross shape.

[7] The solid-state imaging device according to the above [6], in which the overflow region is formed in a region in which the first pixel separation region and the second pixel separation region having the cross shape are close to each other.

[8] The solid-state imaging device according to the above [6] or [7], in which a close distance between the first pixel separation region and the second pixel separation region having the cross shape is the same as or is different.

[9] The solid-state imaging device according to any one of the above [6] to [8], in which at least a part of the second pixel separation region having the cross shape is connected to the first pixel separation region.

[10] The solid-state imaging device according to any one of the above [1] to [9], further including a transfer gate that performs a voltage control for causing the signal charges to overflow.

[11] The solid-state imaging device according to the above [10], further including a power supply that supplies voltages of three or more values to the transfer gate.

[12] The solid-state imaging device according to the above [10] or [11], further including a boosting circuit that boosts and steps down a voltage supplied to the transfer gate.

[13] The solid-state imaging device according to any one of the above [1] to [12], in which the second pixel separation region
penetrates from a light receiving surface that receives light to a silicon substrate on which a photoelectric conversion element in which the signal charges are accumulated is formed.

[14] A solid-state imaging device including:
a first pixel separation region that separates a plurality of unit pixels including two or more subpixels;
a second pixel separation region that separates each of the plurality of unit pixels separated by the first pixel separation region;
a first light condensing portion that covers entirety of the unit pixel; and
a plurality of second light condensing portions that covers each of the subpixels.

[15] The solid-state imaging device according to the above [14], in which the first light condensing portion and the second light condensing portion are lenses.

[16] The solid-state imaging device according to the above [14], in which the first light condensing portion is a lens, and
the second light condensing portion includes a light shielding portion that is provided above the first pixel separation region and the second pixel separation region and a light transmitting layer that is above the subpixel, is provided in a region surrounded by the light shielding portion, and includes a material having a higher refractive index than the light shielding portion.

[17] The solid-state imaging device according to the above [16], in which the second light condensing portion includes an intermediate layer that is provided between the first light condensing portion and the light transmitting layer and includes a material having a higher refractive index than the first light condensing portion and a lower refractive index than the light transmitting layer.

[18] The solid-state imaging device according to any one of the above [14] to [17], in which the light shielding portion provided above the first pixel separation region includes a material including at least one of a material having a lower refractive index than the light transmitting layer or a metal, and
the light shielding portion provided above the second pixel separation region includes a material having a lower refractive index than the light transmitting layer.

[19] The solid-state imaging device according to any one of the above [14] to [18], further including a color filter that is provided between the subpixel and the second light condensing portion.

[20] An electronic apparatus mounted with a solid-state imaging device, in which the solid-state imaging device includes:
a first pixel separation region that separates a plurality of unit pixels including two or more subpixels;
a second pixel separation region that separates each of the plurality of unit pixels separated by the first pixel separation region; and
an overflow region that causes signal charges accumulated in the subpixels to overflow to at least one of adjacent subpixels, and
the overflow region
is formed between a first subpixel and a second subpixel.

[21] An electronic apparatus including the solid-state imaging device according to any one of the above [1] to [19].

REFERENCE SIGNS LIST 100, 101, 102, 103, 104, 105, 106, 107 Solid-state imaging device
1000, 1001, 1002, 1002A, 1002B, 1003, 1003A, 1003B Solid-state imaging device
DTI1 First pixel separation region
DTI2 Second pixel separation region
SP1 to SP16 First to sixteenth subpixel
OF, OF1 to OF4 Overflow region
TG, TG1 to TG4 Transfer gate
FD, FD1 to FD4 Floating diffusion
TR1 to TR4 Transistor
PD1 to PD4 Photodiode
PR1 First P-type region
PR2 Second P-type region
PR3 Third P-type region
PR4 Fourth P-type region
NR N-type region
NC Fifth N-type region
CF, CF1 to CF4 Color filter
LS1 Microlens
LS2A to LS2D Second lens
BL Light shielding layer
TL2A to TL2D Light transmitting layer
ML1A to ML1D First intermediate layer
ML2A to ML2D Second intermediate layer

The invention claimed is:

1. A solid-state imaging device, comprising:
a first pixel separation region that separates a plurality of unit pixels, wherein each unit pixel of the plurality of unit pixels includes at least two subpixels;
a second pixel separation region that separates each unit pixel of the plurality of unit pixels into the at least two subpixels;
an overflow region configured to control a plurality of signal charges in each subpixel of the at least two subpixels to overflow to at least one adjacent subpixel of the at least two subpixels, wherein the overflow region is between a first subpixel of the at least two subpixels and a second subpixel of the at least two subpixels;
a first P-type region in a depth direction inside the first pixel separation region;
a second P-type region in the depth direction around the second pixel separation region; and
an N-type region between the first P-type region and the second P-type region, wherein
the first pixel separation region, the overflow region, and the second pixel separation region are included in a cross section in which a region of a unit pixel that is not separated by the second pixel separation region is cut along an incident direction of light, and
the overflow region has at least one of:
a third P-type region whose impurity concentration is lower than an average impurity concentration of the first P-type region,
a fourth P-type region whose impurity concentration is lower than an average impurity concentration of the second P-type region, or
a fifth N-type region between the third P-type region and the fourth P-type region.

2. The solid-state imaging device according to claim 1, wherein
the second pixel separation region separates each unit pixel of the plurality of unit pixels into a plurality of subpixels of 2×2, and
the plurality of subpixels includes the at least two subpixels.

3. The solid-state imaging device according to claim 1, wherein the second pixel separation region has a cross shape.

4. The solid-state imaging device according to claim 3, wherein
the first pixel separation region is in a threshold distance from the second pixel separation region in a specific region of the solid-state imaging device, and
the specific region includes the overflow region.

5. The solid-state imaging device according to claim 3, wherein the first pixel separation region has a width one of same or different from the second pixel separation region having the cross shape.

6. The solid-state imaging device according to claim 3, wherein at least a part of the second pixel separation region having the cross shape is connected to the first pixel separation region.

7. The solid-state imaging device according to claim 1, further comprising a transfer gate configured to execute a voltage control to cause the plurality of signal charges to overflow.

8. The solid-state imaging device according to claim 7, further comprising a power supply configured to supply voltages of at least three values to the transfer gate.

9. The solid-state imaging device according to claim 8, further comprising a boosting circuit configured to boost and step down a voltage of the voltages supplied to the transfer gate.

10. The solid-state imaging device according to claim 1, further comprising:
a silicon substrate;
a light receiving surface configured to receive light; and
a photoelectric conversion element on the silicon substrate, wherein the photoelectric conversion element is configured to accumulate the plurality of signal charges, wherein
the second pixel separation region penetrates from the light receiving surface to the silicon substrate.

11. A solid-state imaging device, comprising:
a first pixel separation region that separates a plurality of unit pixels, wherein each unit pixel of the plurality of unit pixels includes at least two subpixels;
a second pixel separation region that separates each unit pixel of the plurality of unit pixels into the at least two subpixels;
a first light condensing portion that covers entirety of a unit pixel of the plurality of unit pixels, wherein the first light condensing portion is a lens; and
a plurality of second light condensing portions, wherein each second light condensing portion covers a respective subpixel of the at least two subpixels, wherein
a second light condensing portion of the plurality of second light condensing portions includes:
a light shielding portion above the first pixel separation region and the second pixel separation region; and
a light transmitting layer above a subpixel of the at least two subpixels,
the light shielding portion above the first pixel separation region includes a material having a lower refractive index than a metal, and
the light shielding portion provided above the second pixel separation region includes a material having a lower refractive index than the light transmitting layer.

12. The solid-state imaging device according to claim 11, wherein the first light condensing portion and the second light condensing portion are lenses.

13. The solid-state imaging device according to claim 11, wherein
the second light condensing portion includes an intermediate layer that is between the first light condensing portion and the light transmitting layer, and
the second light condensing portion includes a material having a higher refractive index than the first light condensing portion and a lower refractive index than the light transmitting layer.

14. The solid-state imaging device according to claim 11, further comprising a color filter between a subpixel of the at least two subpixels and the second light condensing portion.

15. An electronic apparatus, comprising:
a solid-state imaging device that includes:
a first pixel separation region that separates a plurality of unit pixels, wherein each unit pixel of the plurality of unit pixels includes at least two subpixels;
a second pixel separation region that separates each unit pixel of the plurality of unit pixels into the at least two subpixels;
an overflow region configured to control a plurality of signal charges in each subpixel of the at least two subpixels to overflow to at least one adjacent subpixel of the at least two subpixels, wherein the overflow region is between a first subpixel of the at least two subpixels and a second subpixel of the at least two subpixels;
a first P-type region in a depth direction inside the first pixel separation region;
a second P-type region in the depth direction around the second pixel separation region; and
an N-type region between the first P-type region and the second P-type region, wherein
the first pixel separation region, the overflow region, and the second pixel separation region are included in a cross section in which a region of a unit pixel that is not separated by the second pixel separation region is cut along an incident direction of light, and
the overflow region has at least one of:
a third P-type region whose impurity concentration is lower than an average impurity concentration of the first P-type region,
a fourth P-type region whose impurity concentration is lower than an average impurity concentration of the second P-type region, or
a fifth N-type region between the third P-type region and the fourth P-type region.

16. A solid-state imaging device, comprising:
a first pixel separation region that separates a plurality of unit pixels, wherein each unit pixel of the plurality of unit pixels includes at least two subpixels;
a second pixel separation region that separates each unit pixel of the plurality of unit pixels into the at least two subpixels;
an overflow region configured to control a plurality of signal charges in each subpixel of the at least two subpixels to overflow to at least one adjacent subpixel of the at least two subpixels, wherein the overflow region is between a first subpixel of the at least two subpixels and a second subpixel of the at least two subpixels;
a transistor in a first region of the solid-state imaging device, wherein the transistor is configured to control the overflow;
a P-type region in a depth direction inside the first pixel separation region; and
an N-type region that includes a second region, wherein
the plurality of signal charges is accumulated in the N-type region,
an impurity concentration in the N-type region is highest in the second region of the N-type region,
the overflow region is between a first inner side of the first pixel separation region and a second inner side of the first pixel separation region,
the first inner side is opposite to the second inner side in a cross section,
in the cross section, a region of a unit pixel of the plurality of unit pixels not separated by the second pixel separation region is cut along an incident direction of light, and
the overflow region has a depth between the first region that includes the transistor and the second region in which an impurity concentration is highest.

* * * * *